(12) United States Patent
Yamazaki

(10) Patent No.: US 10,204,535 B2
(45) Date of Patent: Feb. 12, 2019

(54) DISPLAY DEVICE AND ELECTRONIC DEVICE

(71) Applicant: Semiconductor Energy Laboratory Co., LTD., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/088,193

(22) Filed: Apr. 1, 2016

(65) Prior Publication Data

US 2016/0300853 A1 Oct. 13, 2016

(30) Foreign Application Priority Data

Apr. 6, 2015 (JP) ................. 2015-078016

(51) Int. Cl.
*G09G 3/20* (2006.01)
*H01L 27/12* (2006.01)

(52) U.S. Cl.
CPC ............ *G09G 3/20* (2013.01); *H01L 27/1225* (2013.01)

(58) Field of Classification Search
None
See application file for complete search history.

(56) References Cited

U.S. PATENT DOCUMENTS

| | | | |
|---|---|---|---|
| 7,253,865 B2 | 8/2007 | Battersby | |
| 7,342,354 B2 * | 3/2008 | Utsunomiya | ....... H01L 27/1214 313/503 |
| 7,459,726 B2 * | 12/2008 | Kato | ................... H01L 21/8221 257/290 |
| 7,859,525 B2 | 12/2010 | Takatori et al. | |
| 8,134,545 B2 | 3/2012 | Takatori et al. | |
| 8,436,842 B2 | 5/2013 | Takatori et al. | |
| 8,956,891 B2 * | 2/2015 | Chida | ..................... H01L 33/62 257/E21.567 |
| 9,356,049 B2 * | 5/2016 | Ikeda | |
| 9,454,025 B2 * | 9/2016 | Zhong | ................. G02F 1/13306 |
| 2001/0017409 A1 * | 8/2001 | Hiroki | ................ H01L 51/0005 257/723 |
| 2004/0245924 A1 * | 12/2004 | Utsunomiya | ....... H01L 27/1214 313/506 |
| 2005/0051870 A1 * | 3/2005 | Yamazaki | .......... H01L 21/6835 257/531 |

(Continued)

FOREIGN PATENT DOCUMENTS

| | | |
|---|---|---|
| JP | 2006-276359 A | 10/2006 |
| JP | 2007-272203 A | 10/2007 |
| JP | 2009-069768 A | 4/2009 |

OTHER PUBLICATIONS

Nonaka.Y et al., "A Non-Rectangular Heart-Shaped SOG-LCD", SID Digest '08 : SID International Digest of Technical Papers, May 20, 2008, vol. 39, No. 1, pp. 951-954.

*Primary Examiner* — David E Graybill
(74) *Attorney, Agent, or Firm* — Nixon Peabody LLP; Jeffrey L. Costellia

(57) ABSTRACT

Provided is a display device whose display region can be maximized. The display device includes the display region and a terminal electrode. The terminal electrode overlaps with the display region and is electrically connected to an external electrode on a non-display surface of the display region.

21 Claims, 40 Drawing Sheets

(56) References Cited

U.S. PATENT DOCUMENTS

| | | | |
|---|---|---|---|
| 2005/0151830 A1* | 7/2005 | Yamazaki | G09G 3/20 347/238 |
| 2007/0046210 A1* | 3/2007 | An | H01J 11/12 313/583 |
| 2008/0018557 A1 | 1/2008 | Maeda | |
| 2009/0102758 A1 | 4/2009 | Anzai et al. | |
| 2009/0108728 A1 | 4/2009 | Ushimaru et al. | |
| 2010/0134743 A1 | 6/2010 | Shin et al. | |
| 2010/0163868 A1* | 7/2010 | Yamazaki | H01L 27/1225 257/43 |
| 2013/0107476 A1 | 5/2013 | Wright et al. | |
| 2014/0264425 A1* | 9/2014 | Chida | H01L 33/20 257/99 |
| 2014/0273317 A1* | 9/2014 | Chida | H01L 33/20 438/26 |
| 2015/0014681 A1* | 1/2015 | Yamazaki | H01L 27/1218 257/43 |
| 2015/0028328 A1* | 1/2015 | Ikeda | H01L 27/1218 257/43 |
| 2015/0048349 A1* | 2/2015 | Kawata | H01L 51/0097 257/40 |
| 2015/0076472 A1* | 3/2015 | Yamazaki | H01L 27/326 257/40 |
| 2015/0076473 A1* | 3/2015 | Miyake | H01L 51/0097 257/40 |
| 2015/0179717 A1* | 6/2015 | Kawata | H01L 29/7869 257/43 |
| 2015/0207100 A1 | 7/2015 | Saito et al. | |
| 2015/0309637 A1 | 10/2015 | Sakuishi et al. | |
| 2015/0325631 A1* | 11/2015 | Yamazaki | H01L 27/3248 257/40 |
| 2015/0372065 A1 | 12/2015 | Yamazaki | |
| 2016/0132281 A1* | 5/2016 | Yamazaki | G06F 3/1446 345/1.3 |
| 2016/0154268 A1* | 6/2016 | Yamazaki | H01L 51/5246 349/138 |
| 2016/0300853 A1* | 10/2016 | Yamazaki | H01L 27/124 |

* cited by examiner

FIG. 1A1
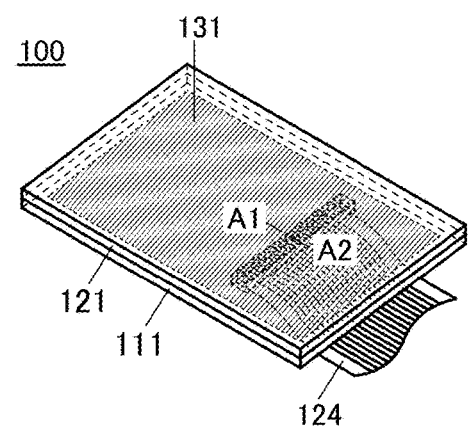
FIG. 1A2
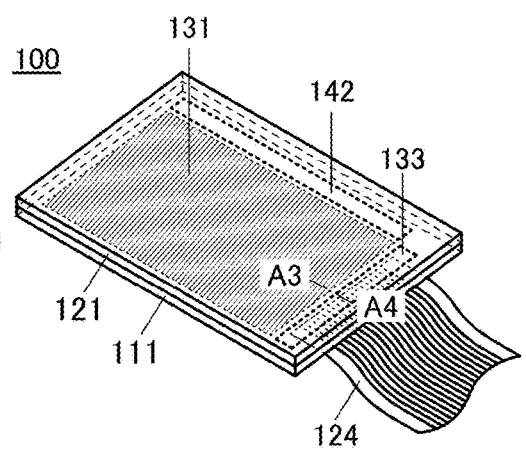
FIG. 1B
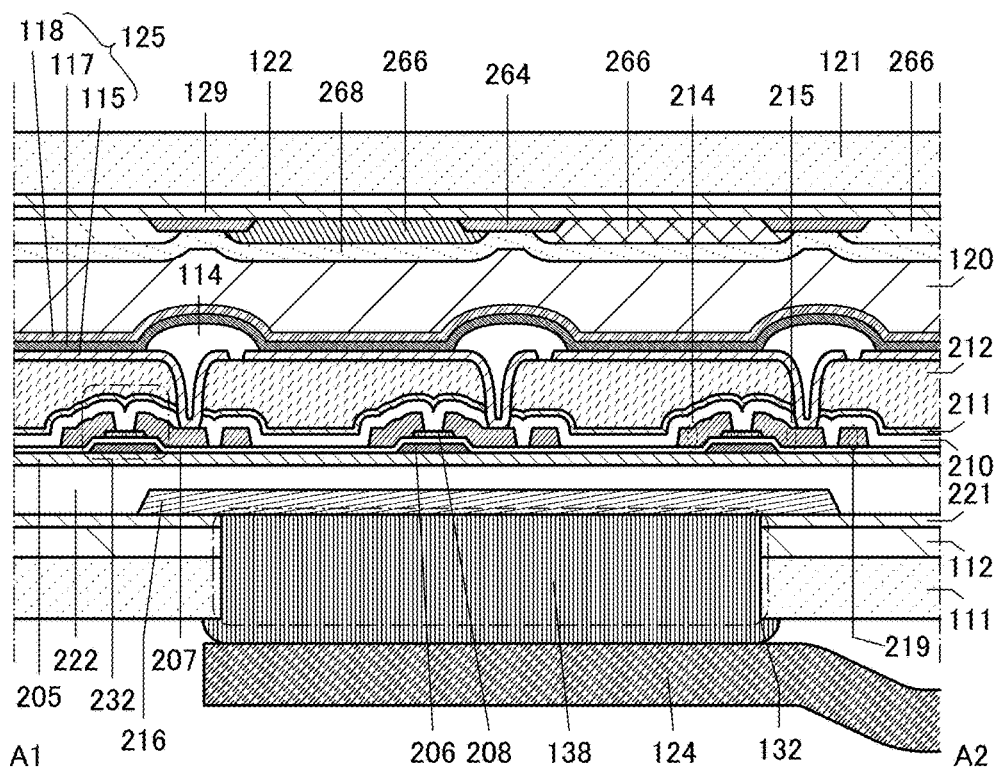

FIG. 16A1
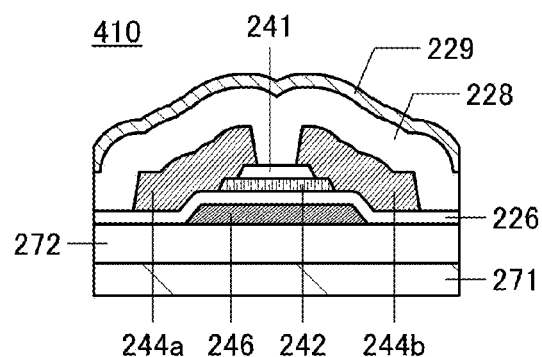
FIG. 16A2
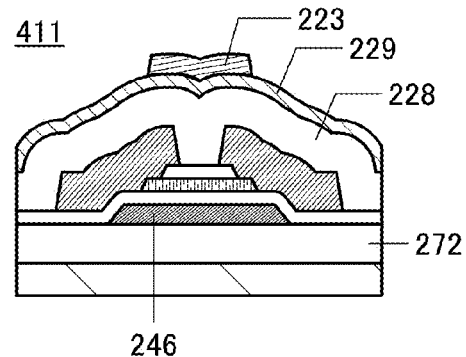
FIG. 16B1
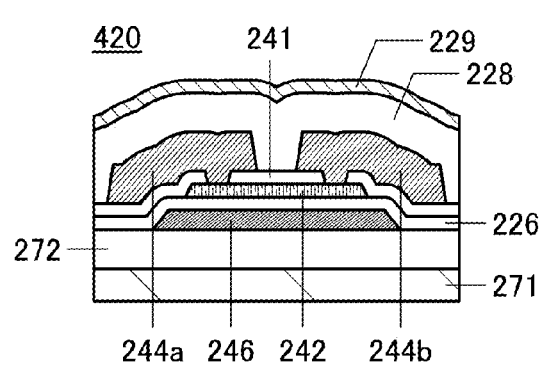
FIG. 16B2
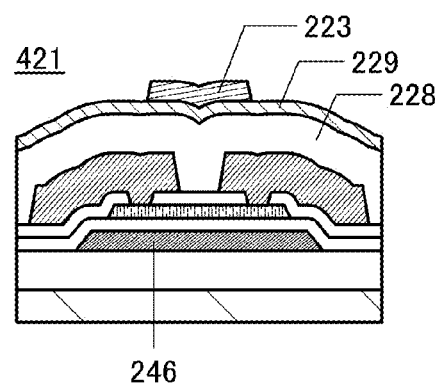
FIG. 16C1
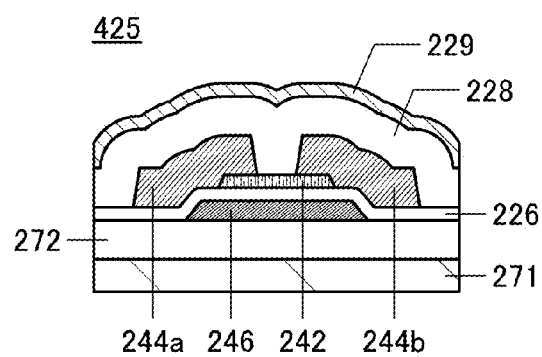
FIG. 16C2
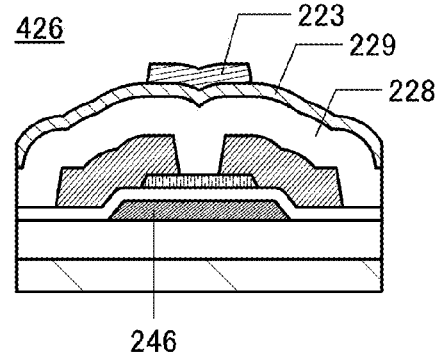

FIG. 17A1
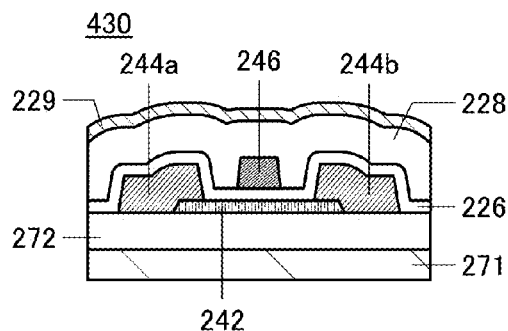
FIG. 17A2
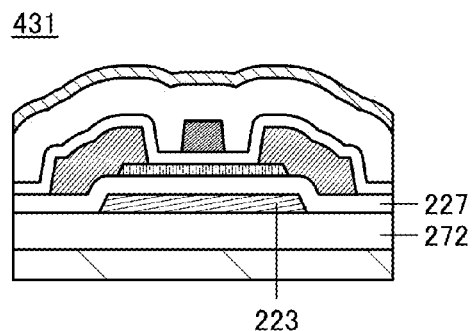
FIG. 17A3
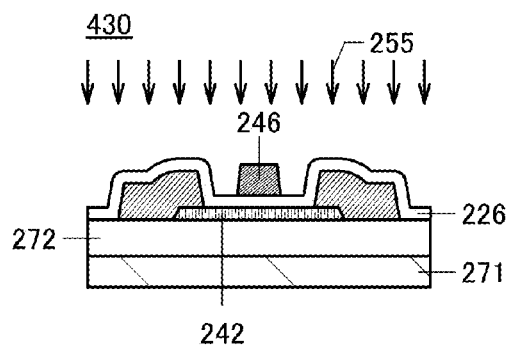
FIG. 17B1
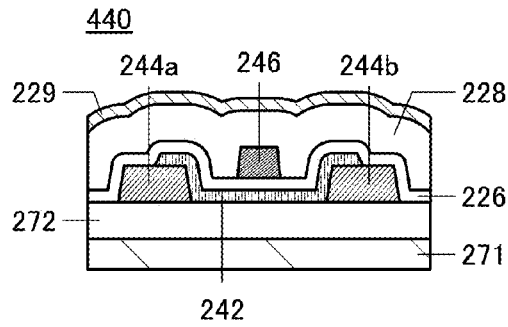
FIG. 17B2
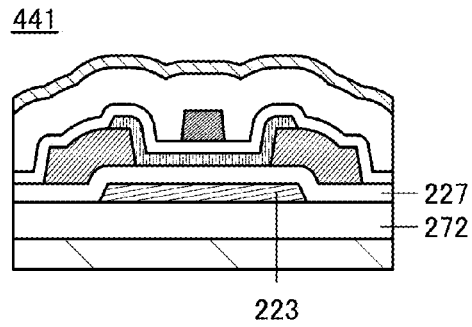

FIG. 18A1
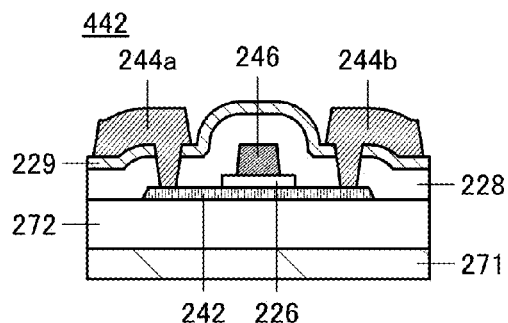
FIG. 18A2
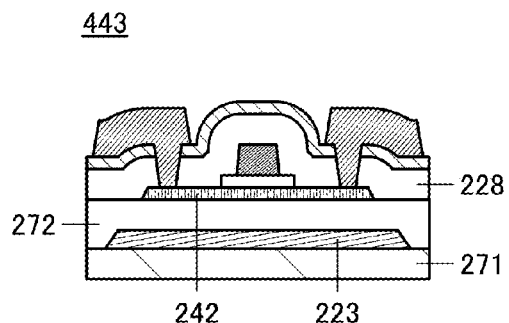
FIG. 18A3
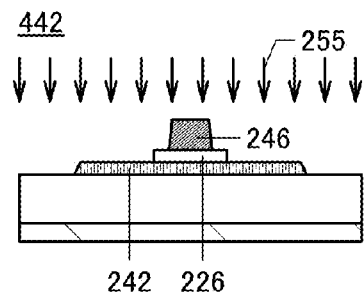
FIG. 18B1
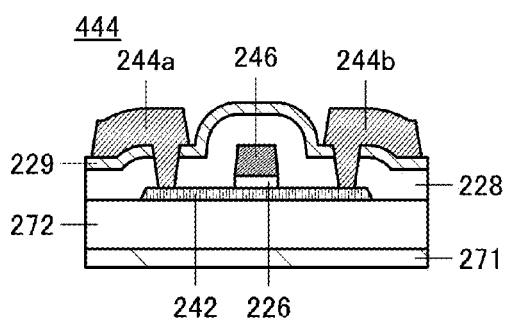
FIG. 18B2
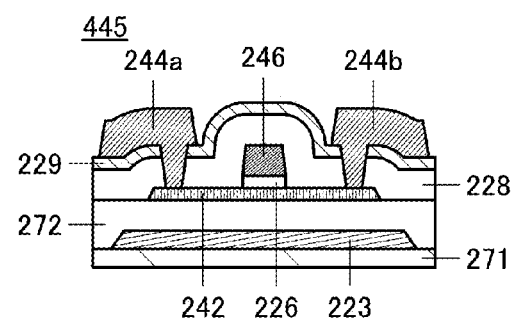
FIG. 18C1
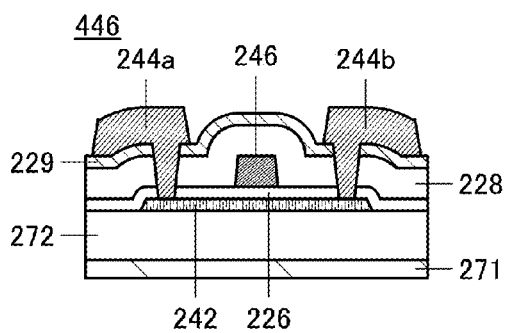
FIG. 18C2
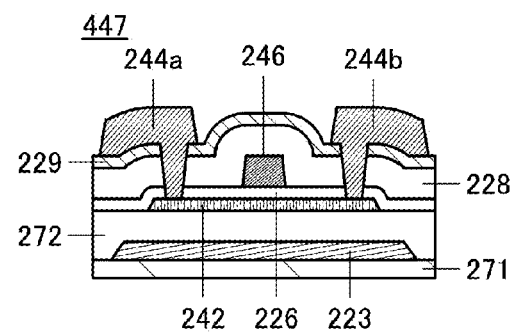

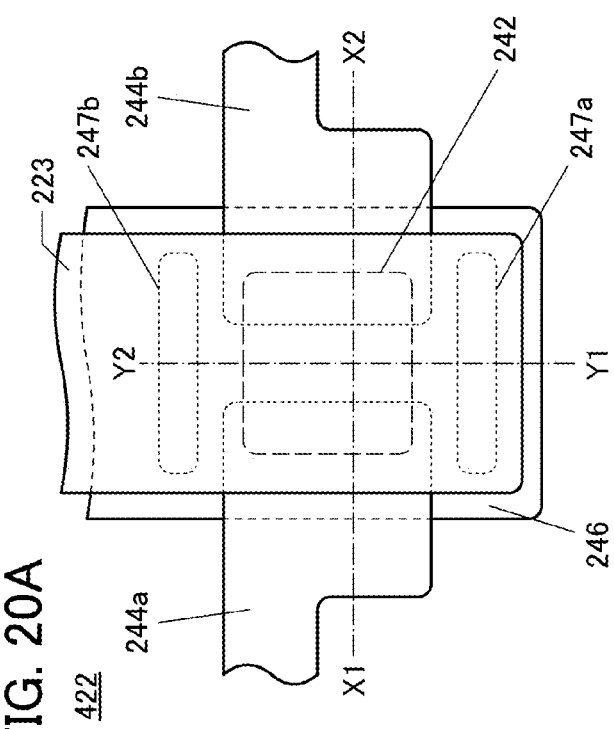
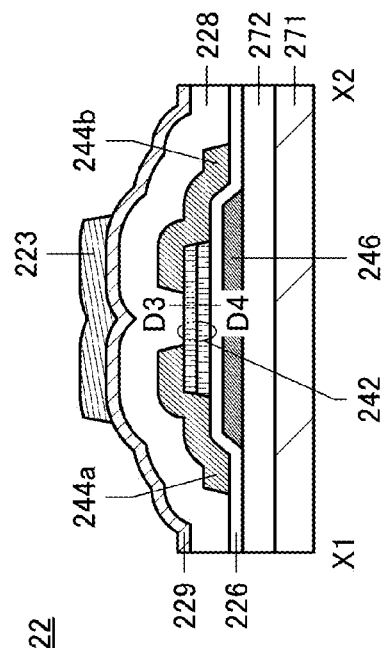
FIG. 20A
FIG. 20B
FIG. 20C

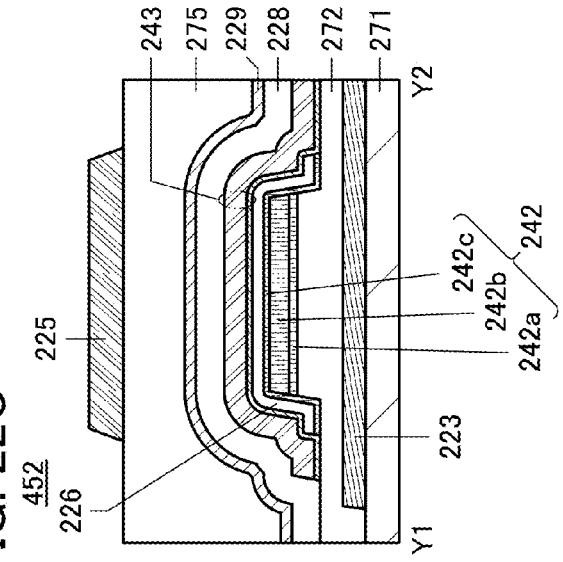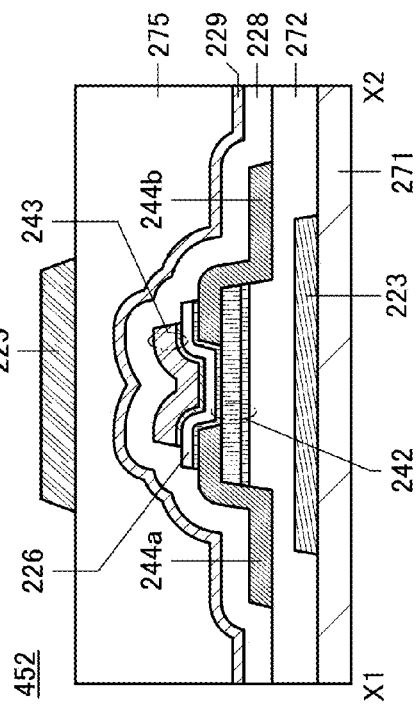

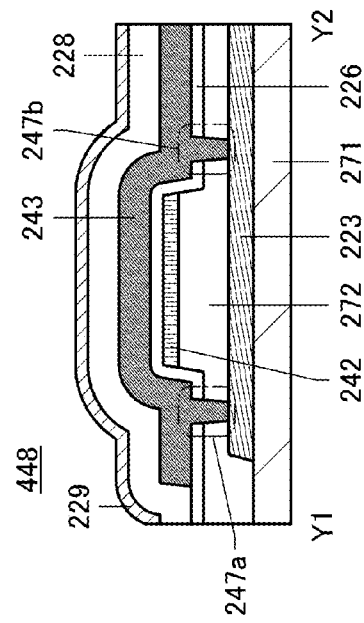
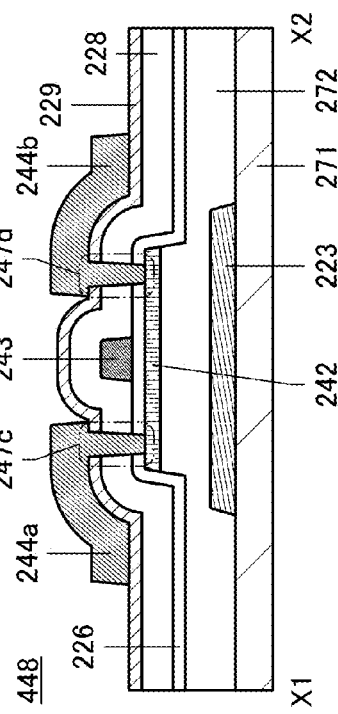
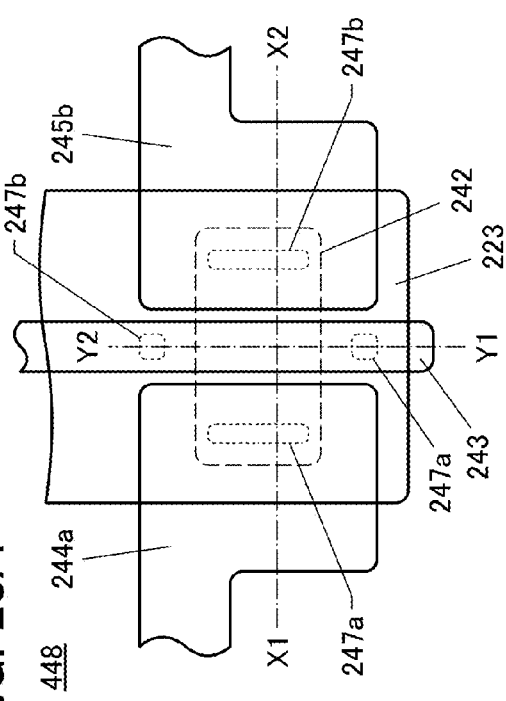

FIG. 27A
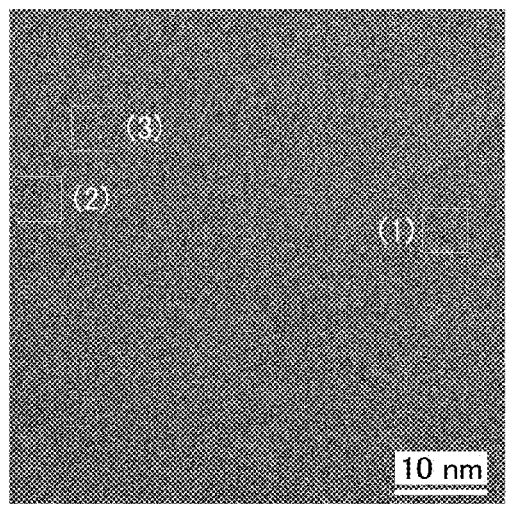
FIG. 27B  FIG. 27C  FIG. 27D
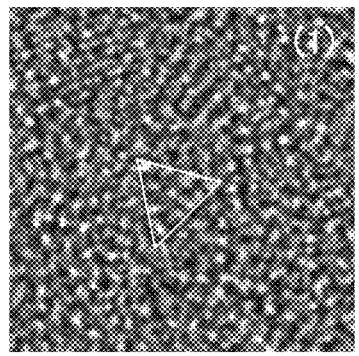 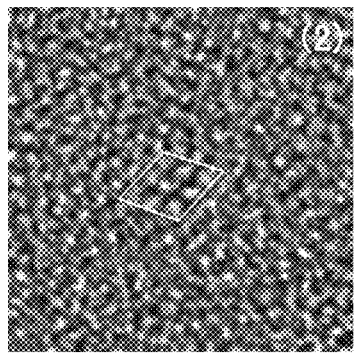 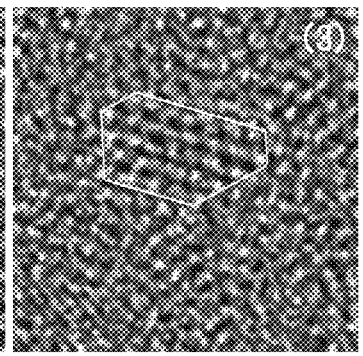

FIG. 29A
FIG. 29B
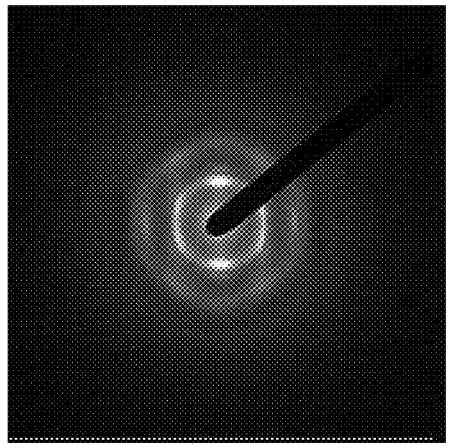 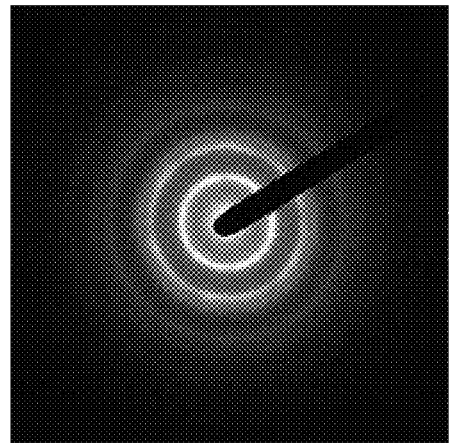

DISPLAY DEVICE AND ELECTRONIC DEVICE

BACKGROUND OF THE INVENTION

1. Field of the Invention

One embodiment of the present invention relates to a transistor, a semiconductor device, and a manufacturing method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device (e.g., a liquid crystal display device and a light-emitting display device), a lighting device, an electro-optical device, a power storage device, a memory device, a semiconductor circuit, an imaging device, an electronic device, and the like may include a semiconductor device.

2. Description of the Related Art

Flat panel displays that are widely used for TVs, portable terminals, and the like are expected to be applied to watches, car electronics, in particular, instrument panels, and the like as new needs.

Since conventional flat panel displays include rectangular display regions, the conventional flat panel displays are compatible with matrix driving in which display regions are controlled row by row or column by column; thus, most of flat panel displays employ matrix driving. On the other hand, in application of displays to watches or car electronics, display regions are required to have a non-rectangular shape in terms of design.

Display devices including non-rectangular display regions are disclosed in Patent Documents 1 to 3 and Non-Patent Document 1, for example.

REFERENCES

Patent Documents

[Patent Document 1] Japanese Published Patent Application No. 2006-276359
[Patent Document 2] Japanese Published Patent Application No. 2009-69768
[Patent Document 3] Japanese Published Patent Application No. 2007-272203
[Non-Patent Document 1] SID 08 DIGEST pp. 951-954

SUMMARY OF THE INVENTION

In the modes disclosed in Patent Documents 1 and 2, signal lines are led toward a non-rectangular display region from a driver circuit provided in any one of the top, bottom, left, and right of the display region. Therefore, even in the case of a non-rectangular display region, conventional matrix driving can be employed; on the other hand, a region with a certain frame width is required outside the display region. For example, in the case of a circular or elliptical display region, the outside shape of a panel is a quadrangle, an octagon, or the like owing to a region where a driver circuit is arranged and a region where signal lines are lead.

In the case of such a method, limitation of housing design becomes serious even if the display region can have a non-rectangular shape.

On the other hand, in embodiments disclosed in Patent Document 3 and Non-Patent Document 1, devising arrangement of driver circuits achieves a reduced frame width along a non-rectangular display region and conventional matrix driving. However, these modes require at least one vertex along the shape of the display region between a data driver (source driver) and a gate driver, which imposes limitations on the shape of the display region. For example, the embodiments cannot be applied to a display region having a shape without vertexes such as a circle or an ellipse or a polygonal shape including a vertex with an obtuse angle much larger than a right angle.

Regardless of whether a display region of a display device is non-rectangular or rectangular, the display region is expected to be maximized so that the visibility of the display device can be increased by reducing the bezel width, for example. The display device needs to include an input terminal region for inputting an external signal, such as an image signal, into the display device. The input terminal region is usually provided in a frame region outside the display region and thus requires a frame region with a certain width outside the display region, which have prevented the maximization of the display region.

In view of the problems, an object of one embodiment of the present invention is to provide a display device having a reduced frame width without a significant alteration in the shape of a display region regardless of whether the shape is rectangular or non-rectangular. Another object is to provide a display device in which a display region can be maximized. Another object is to provide a novel display device.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

Means for Solving the Problems

One embodiment of the present invention is a display device includes a first surface, a second surface, and a terminal electrode. The first surface and the second surface overlap with each other. The first surface includes a display region. The display region is configured to display an image in response to an image signal supplied through the terminal electrode. The terminal electrode and the display region overlap with each other. The terminal electrode is electrically connected to an external electrode on the second surface side. The display region includes a light-emitting element, for example.

Another embodiment of the present invention is a display device including a first substrate, a second substrate, a light-emitting element, and a first electrode. The first electrode lies over the first substrate. The light-emitting element lies over the first electrode. The light-emitting element and the first electrode overlap with each other at least partly. The second substrate lies over the light-emitting element. The light-emitting element emits light from the second substrate side. The first electrode is electrically connected to the second electrode in an opening provided in the first substrate.

The first substrate and the second substrate may be flexible. The display device may be flexible.

Another embodiment of the present invention is an electronic device including the display device and any of a touch sensor, an antenna, a battery, a housing, a speaker, a microphone, an operation switch, and an operation button. The electronic device may be foldable.

According to one embodiment of the present invention, a high degree of flexibility of the shape of a display region and minimization of the outside shape of a display device with a reduced frame width can be achieved; thus, a display device with less limitation of design flexibility can be provided.

According to one embodiment of the present invention, a display device having a reduced frame width without a significant alteration in the shape of a display region regardless of whether the shape is rectangular or non-rectangular can be provided. According to one embodiment of the present invention, a display device in which a display region can be maximized can be provided. According to one embodiment of the present invention, a novel display device can be provided.

Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

In the accompanying drawings:

FIGS. 1A1, 1A2, and 1B are a perspective view and a cross-sectional view illustrating one mode of a display device;

FIG. 2 is a perspective view and a cross-sectional view illustrating one mode of a display device;

FIGS. 16A1, 16A2, 16B1, 16B2, 16C1, and 16C2 are each a cross-sectional view of one mode of a transistor;

FIGS. 17A1, 17A2, 17A3, 17B1, and 17B2 are each a cross-sectional view of one mode of transistors;

FIGS. 18A1, 18A2, 18A3, 18B1, 18B2, 18C1, and 18C2 are each a cross-sectional view of one mode of a transistor;

FIGS. 20A to 20C are a plan view and cross-sectional views illustrating one mode of a transistor;

FIGS. 22A to 22C are a plan view and cross-sectional views illustrating one mode of a transistor;

FIGS. 23A to 23C are a plan view and cross-sectional views illustrating one mode of a transistor;

FIGS. 27A to 27D are Cs-corrected high-resolution TEM images of a plane of a CAAC-OS;

FIGS. 29A and 29B show electron diffraction patterns of a CAAC-OS;

DETAILED DESCRIPTION OF THE INVENTION

Figure 2:
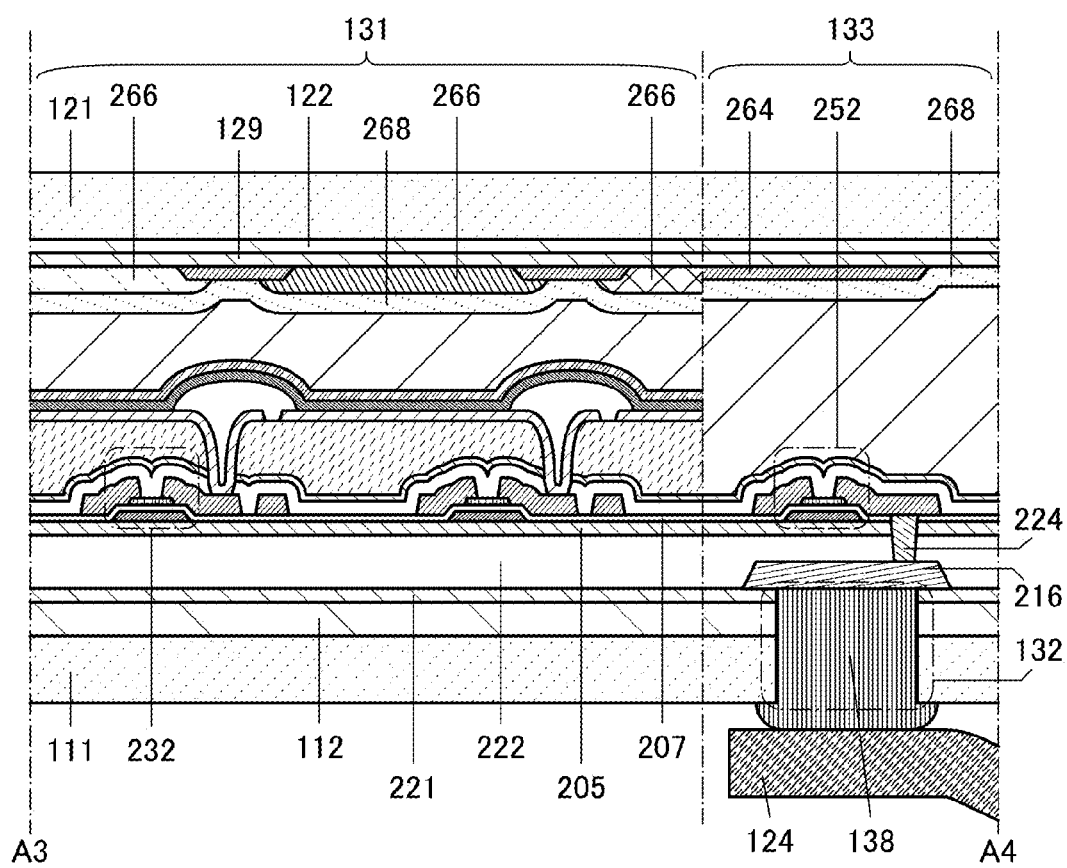

Best Mode for Carrying Out the Invention

Embodiments of the present invention will be described below in detail with reference to the drawings. However, the present invention is not limited to the description below, and it is easily understood by those skilled in the art that modes and details disclosed herein can be modified in various ways. Further, the present invention is not construed as being limited to description of the embodiments and the examples. Note that in all drawings used to illustrate the embodiments, portions that are identical or portion having similar functions are denoted by the same reference numerals, and their repetitive description may be omitted.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

For example, in this specification and the like, an explicit description "X and Y are connected" means that X and Y are electrically connected, X and Y are functionally connected, and X and Y are directly connected. Accordingly, another element may be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up dc-dc converter, or a step-down dc-dc converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, when a signal output from X is transmitted to Y, it can be said that X and Y are functionally connected even if another circuit is provided between X and Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. For a flexible substrate, a flexible synthetic resin such as plastics typified by polyethylene terephthalate (PET), polyethylene naphthalate (PEN), and polyether sulfone (PES), or acrylic can be used, for example. Examples of the material for an attachment film include vinyl such as polyvinyl fluoride or vinyl chloride, polypropylene and polyester. For a base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like and with high current supply capability and a small size. By forming a circuit with use of such a transistor, power consumption of the circuit can be reduced or the circuit can be highly integrated.

Note that a transistor may be formed using one substrate, and then the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent properties or a transistor with low power consumption can be formed, a device with high durability can be formed, heat resistance can be provided, or reduction in weight or thickness can be achieved.

The position, size, range, and the like of each component illustrated in the drawings and the like are not accurately represented in some cases to facilitate understanding of the invention. Therefore, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding.

Especially in a top view (also referred to as a plan view), some components might not be illustrated for easy understanding. There is a case where an illustration of a hidden line or the like is partly omitted.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, for example, when a transistor having opposite polarity is employed or the direction of current flow is changed in circuit operation. Thus, it is difficult to define which is a source or a drain. Accordingly, the terms "source" and "drain" can be switched in this specification.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" or "orthogonal" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In the specification and the like, the terms "identical", "the same", "equal", "uniform", and the like (including synonyms thereof) used in describing calculation values and actual measurement values allow for a margin of error of ±20% unless otherwise specified.

A voltage usually refers to a potential difference between a given potential and a reference potential (e.g., a source potential or a ground potential (a GND potential)). A voltage can be referred to as a potential and vice versa.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the semiconductor; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. Moreover, a term with an ordinal number in this specification and the like might not be provided with any ordinal number in a claim.

Note that in this specification, the channel length refers to, for example, a distance, observed in a top view of a transistor, between a source (a source region or a source electrode) and a drain (a drain region or a drain electrode) in a region where a semiconductor (or a portion where a current flows in a semiconductor when the transistor is on) and a gate electrode overlap with each other or a region where a channel is formed. In one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths are not necessarily the same in all regions. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where electric field mobility, a current value per channel width, and the like of a transistor are calculated, a surrounded channel width might be used for the calculation. In that case, a value might be different from one calculated by using an effective channel width.

In this specification, trigonal and rhombohedral crystal systems are included in a hexagonal crystal system.

Embodiment 1

Examples of a structure of a display device 100 and a manufacturing method thereof according to one embodiment of the present invention are described with reference to drawings.

[Structure Example of Display Device]

FIG. 1A1 is a perspective view of the display device 100 to which an external electrode 124 is connected. FIG. 1B is a cross-sectional view taken along the dash-dot line A1-A2 in FIG. 1A1. The display device 100 disclosed in this specification is a display device in which a light-emitting element is used as a display element. As the display device 100 of one embodiment of the present invention, a display device having a top-emission structure is described as an example.

The display device 100 described in this embodiment includes the display region 131. The display device 100 also includes a terminal electrode 216 and a light-emitting element 125 including an electrode 115, an EL layer 117, and an electrode 118. A plurality of light-emitting elements 125 are formed in the display region 131. A transistor 232 which controls the amount of light emitted from each of the light-emitting elements 125 is connected to the light-emitting element 125.

The transistor 232 is formed over a substrate 111 with a bonding layer 112, insulating layers 221, 222, and 205 positioned therebetween. In FIG. 1B, the terminal electrode 216 is formed between the insulating layers 221 and 222.

The terminal electrode 216 overlaps with an opening 132 passing through the substrate 111, the bonding layer 112, and the insulating layer 221. The terminal electrode 216 is electrically connected to the external electrode 124 through an anisotropic conductive connection layer 138 in the opening 132. The terminal electrode 216 is electrically or functionally connected to the transistor 232. For example, the terminal electrode 216 may be connected to a driver circuit such that a signal supplied to the terminal electrode 216 can be supplied to the transistor 232 through the driver circuit. The driver circuit is an electrical circuit having a function of determining which light-emitting element 125 in the display region 131 is supplied with the signal, and may be provided in the display device 100 at the same time as when the transistor 232 is formed in the display device 100.

Note that in the case where driver circuits 133 and 142 are provided outside the display region 131 as in the display device 100 illustrated in FIG. 1A2, the electrode 216 and the opening 132 may be provided to overlap with the driver circuit 133 such that the terminal electrode 216 can be electrically connected to the external electrode 124 through the anisotropic conductive connection layer 138. Alternatively, the electrode 216 and the opening 132 are provided to overlap with the driver circuit 142 such that the terminal electrode 216 can be electrically connected to the external electrode 124 through the anisotropic conductive connection layer 138.

FIG. 2 is a cross-sectional view taken along the dash-dot line A3-A4 in FIG. 1A2. The driver circuits 133 and 142 each include a plurality of transistors 252. The driver circuits 133 and 142 each have a function of determining which light-emitting element 125 in the display region 131 is supplied with a signal through the external electrode 124.

The transistors 252 and 232 can be formed through the same process. Note that the structures of the transistors 232 and 252 may be the same or different. In FIG. 2, the electrode 224 is provided in an opening formed by removing part of the insulating layer 205 and part of the insulating layer 223. The terminal electrode 216 overlapping with the driver circuit 133 is electrically connected to one of the source electrode and drain electrode of the transistor 252 through the electrode 224.

The light-blocking layer 264, the coloring layers 266, or the overcoat layer 268 may be provided in the region(s) of the substrate 121 which overlap(s) with the driver circuit 133 and/or the driver circuit 142. For example, the light-blocking layer 264 and the overcoat layer 268 are provided so as to overlap with the driver circuit 133 in FIG. 2. The light-blocking layer 264 provided to overlap with the transistor 252 can reduce the effect of the entrance of external light which changes characteristics of the transistor 252.

Note that a driver circuit can be provided in a display device even when the external shape of the display device or the shape of a display region is not rectangular.

The transistor 232 includes an electrode 206, an insulating layer 207, a semiconductor layer 208, an electrode 214, and an electrode 215. The electrode 206 can function as a gate electrode. The insulating layer 207 can function as a gate insulating layer. The electrode 214 and the electrode 215 can function as a source electrode and a drain electrode. A wiring 219 is formed in the same layer as the electrodes 214 and 215. In addition, an insulating layer 210 is formed over the transistor 232, an insulating layer 211 is formed over the insulating layer 210, and an insulating layer 212 is formed over the insulating layer 211. The electrode 115 is formed over the insulating layer 211. The electrode 115 is electrically connected to the electrode 215 through an opening formed in the insulating layers 210 to 212. The partition 114 is formed over the electrode 115, and the EL layer 117 and the electrode 118 are formed over the electrode 115 and the partition 114.

One side of a substrate 121 is provided with an insulating layer 129, a light-blocking layer 264, coloring layers 266, and an overcoat layer 268 with a bonding layer 122 positioned therebetween. The substrate 111 and the substrate 121 are attached with a bonding layer 120 such that the one side of the substrate 121 faces the side of the substrate 111 which is provided with the light-emitting element 125.

Note that the insulating layer 205 functions as a base layer and can prevent or reduce diffusion of moisture or impurity elements from the substrate 111, the bonding layer 112, or the like to the transistor or the light-emitting element. The insulating layer 129 functions as a base layer and can prevent or reduce diffusion of moisture and impurity elements from the substrate 121, the bonding layer 122, or the like to the transistor or the light-emitting element. The insulating layer 129 can be formed using a material and a method similar to those of the insulating layer 205.

A flexible material such as an organic resin material, or the like can be used for the substrate 111 and the substrate 121. In the case where the display device 100 is a so-called bottom-emission display device or a dual-emission display device, a material that transmits light emitted from the EL layer 117 is used for the substrate 111. In the case where the display device 100 is a top-emission display device or a dual-emission display device, a material that transmits light emitted from the EL layer 117 is used for the substrate 121.

In a similar manner, in the case where the display device 100 is a so-called bottom-emission display device or a dual-emission display device, a material that transmits light emitted from the EL layer 117 is used for the substrate 137. In the case where the display device 100 is a top-emission display device or a dual-emission display device, a material that transmits light emitted from the EL layer 117 is used for the substrate 147.

It is preferable that the substrate 111 and the substrate 121 be formed using the same material and have the same thickness. However, depending on the purpose, the substrates 111 and 121 may be formed using different materials or have different thicknesses.

Examples of materials that have flexibility and transmit visible light, which can be used for the substrate 111 and the substrate 121, include a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, and the like. In the case where light does not have to be transmitted, a non-light-transmitting substrate may be used. For example, aluminum or the like may be used for the substrate 121 or the substrate 111.

The thermal expansion coefficients of the substrate 111 and the substrate 121 are preferably less than or equal to 30 ppm/K, more preferably less than or equal to 10 ppm/K. In addition, on surfaces of the substrate 111 and the substrate 121, a protective film having low water permeability may be formed in advance; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 111 and the substrate 121.

With such substrates, a non-breakable display device can be provided. A lightweight display device can be provided. An easily bendable display device can be provided.

<Example of Method of Manufacturing Display Device>

An example of a method of manufacturing the display device 100 is described below with reference to drawings. Note that FIGS. 3A to 3D, FIGS. 4A to 4C, FIGS. 5A and 5B, FIGS. 6A to 6E, FIGS. 7A and 7B, FIGS. 8A and 8B, and FIGS. 9A and 9B correspond to cross-sectional views taken along the dash-dot line A1-A2 in FIG. 1A1.

[Formation of Peeling Layer]

Figure 3A:
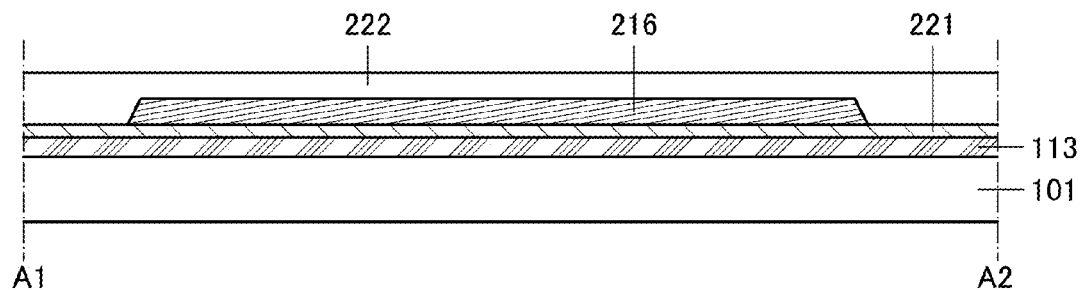
FIGS. 3A to 3D illustrate a manufacturing process of one mode of a display device.

First, a peeling layer 113 is formed over a substrate 101 (see FIG. 3A). As the substrate 101, a glass substrate, a quartz substrate, a sapphire substrate, a ceramic substrate, a metal substrate, or the like can be used. Alternatively, a plastic substrate having heat resistance to the processing temperature in this embodiment may be used.

As the glass substrate, for example, a glass material such as aluminosilicate glass, aluminoborosilicate glass, or barium borosilicate glass is used. Note that when the glass substrate contains a large amount of barium oxide (BaO), the glass substrate can be heat-resistant and more practical. Alternatively, crystallized glass or the like can be used.

The peeling layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The peeling layer 113 can also be formed to have a single-layer structure or a stacked-layer structure using any of the materials. Note that the crystalline structure of the peeling layer 113 may be amorphous, microcrystalline, or polycrystalline. The peeling layer 113 can also be formed using a metal oxide such as aluminum oxide, gallium oxide, zinc oxide, titanium dioxide, indium oxide, indium tin oxide, indium zinc oxide, or InGaZnO (IGZO).

The peeling layer 113 can be formed by a sputtering method, a CVD method, a coating method, a printing method, or the like. Note that the coating method includes a spin coating method, a droplet discharge method, and a dispensing method.

In the case where the peeling layer 113 has a single-layer structure, a material containing tungsten, a material containing molybdenum, or a material containing tungsten and molybdenum is preferably used. Alternatively, in the case where the peeling layer 113 has a single-layer structure, an oxide or oxynitride of tungsten, an oxide or oxynitride of molybdenum, or an oxide or oxynitride of a material containing tungsten and molybdenum is preferably used.

In the case where the peeling layer 113 has a stacked-layer structure including, for example, a layer containing tungsten and a layer containing an oxide of tungsten, the layer containing an oxide of tungsten may be formed as follows: the layer containing tungsten is formed first and then an oxide insulating layer is formed in contact therewith, so that the layer containing an oxide of tungsten is formed at the interface between the layer containing tungsten and the oxide insulating layer. Alternatively, the layer containing an oxide of tungsten may be formed by performing thermal oxidation treatment, oxygen plasma treatment, treatment with a highly oxidizing solution such as ozone water, or the like on the surface of the layer containing tungsten.

In this embodiment, a glass substrate is used as the substrate 101. As the peeling layer 113, a tungsten layer is formed over the substrate 101 by a sputtering method.

[Formation of Insulating Layer]

Next, the insulating layer 221 is formed over the peeling layer 113 (see FIG. 3A). The insulating layer 221 is preferably formed using silicon oxide, silicon oxynitride, silicon nitride oxide, aluminum oxide, aluminum oxynitride, or an insulating material containing oxygen such as aluminum nitride oxide. When treatment of oxidizing a surface of the peeling layer 113 is performed, the insulating layer 221 can be formed using a material not containing oxygen, such as silicon nitride or aluminum nitride. The insulating layer 221 is preferably a single layer or a multilayer. The insulating layer 221 may have, for example, a two-layer structure of silicon oxide and silicon nitride or a five-layer structure in which materials selected from the above materials are combined. The insulating layer 221 can be formed by a sputtering method, a CVD method, a thermal oxidation method, a coating method, a printing method, or the like.

The thickness of the insulating layer 221 is greater than or equal to 30 nm and less than or equal to 500 nm, preferably greater than or equal to 50 nm and less than or equal to 400 nm. In this embodiment, as the insulating layer 221, a stack of a 200-nm-thick silicon oxynitride film and a 50-nm-thick silicon nitride oxide film formed by a plasma CVD method is used.

[Formation of Terminal Electrode]

Next, the terminal electrode 216 is formed over the insulating layer 221 (see FIG. 3A). The terminal electrode 216 can be formed using a metal element selected from aluminum, chromium, copper, tantalum, titanium, molybdenum, and tungsten; an alloy containing any of these metal elements as a component; an alloy containing any of these metal elements in combination; or the like. One or more metal elements selected from manganese and zirconium may be used. The terminal electrode 216 may have a single-layer structure or a stacked structure of two or more layers. Examples include a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like. Alternatively, an alloy film or a nitride film which contains aluminum and one or more elements selected from titanium, tantalum, tungsten, molybdenum, chromium, neodymium, and scandium may be used.

The terminal electrode 216 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The terminal electrode 216 can have a stacked structure formed using the above-described light-transmitting conductive material and the above-described metal element.

First, a conductive film to be the terminal electrode 216 is stacked over the insulating layer 221 by a sputtering method, a CVD method, an evaporation method, or the like, and a resist mask is formed over the conductive film by a photolithography process. Then, part of the conductive film is etched using the resist mask to form the terminal electrode 216. At the same time, a wiring and another electrode can be formed.

The conductive film may be etched by a dry etching method, a wet etching method, or both a dry etching method and a wet etching method. Note that in the case where the conductive film is etched by a dry etching method, ashing treatment may be performed before the resist mask is removed, whereby the resist mask can be easily removed using a stripper.

Note that the terminal electrode 216 may be formed by an electrolytic plating method, a printing method, an inkjet method, or the like instead of the above formation method.

The thickness of the terminal electrode 216 is greater than or equal to 5 nm and less than or equal to 500 nm, preferably greater than or equal to 10 nm and less than or equal to 300 nm, more preferably greater than or equal to 10 nm and less than or equal to 200 nm.

[Formation of Insulating Layer]

Next, the insulating layer 222 is formed over the terminal electrode 216 (see FIG. 3A). The insulating layer 222 is preferably formed using a single layer or a multilayer of silicon oxide, silicon nitride, silicon oxynitride, silicon nitride oxide, aluminum oxide, aluminum oxynitride, aluminum nitride oxide, or the like. For example, the insulating layer 222 may be a stacked layer of silicon oxide and silicon nitride. The insulating layer 222 can be formed by a sputtering method, a CVD method, a thermal oxidation method, a coating method, a printing method, or the like.

Planarization treatment may be performed on the insulating layer 222 to reduce unevenness of a surface. The planarization treatment may be, but not particularly limited to, polishing treatment (e.g., chemical mechanical polishing (CMP)) or dry etching treatment.

[Formation of Insulating Layer]

Figure 3B:
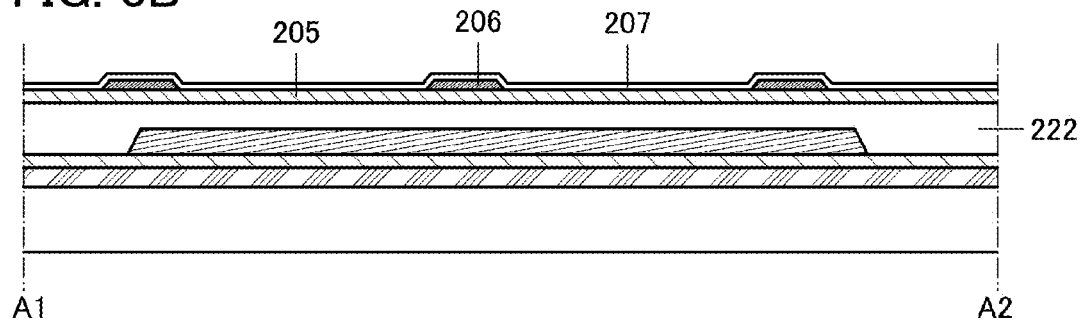
Figure 3C:
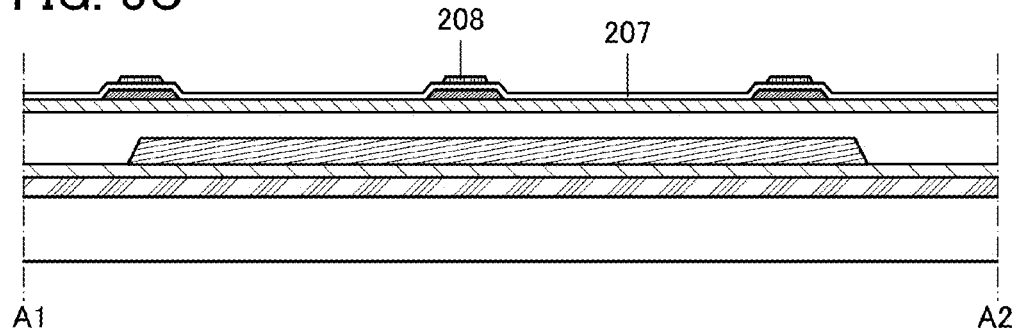

Next, the insulating layer 205 is formed as a base layer over the insulating layer 222 (see FIG. 3B). The insulating layer 205 is preferably formed as a single layer or a multilayer using silicon oxide, silicon nitride, silicon oxynitride, silicon nitride oxide, aluminum oxide, aluminum oxynitride, aluminum nitride oxide, or the like. The insulating layer 205 may have, for example, a two-layer structure of silicon oxide and silicon nitride or a five-layer structure in which materials selected from the above are combined. The insulating layer 205 can be formed by a sputtering method, a CVD method, a thermal oxidation method, a coating method, a printing method, or the like.

The thickness of the insulating layer 205 is greater than or equal to 30 nm and less than or equal to 500 nm, preferably greater than or equal to 50 nm and less than or equal to 400 nm.

The insulating layer 205 has a function of preventing or reducing diffusion of impurity elements from the substrate 101, the peeling layer 113, or the like. Even after the substrate 101 is replaced by the substrate 111, the insulating layer 205 can prevent or reduce diffusion of impurity elements into the transistor 232 or the light-emitting element 125 from the substrate 111, the bonding layer 112, or the like. In this embodiment, as the insulating layer 205, a stacked film of a 200-nm-thick silicon oxynitride film and a 50-nm-thick silicon nitride oxide film is formed by a plasma CVD method.

[Formation of Gate Electrode]

Next, the electrode 206 is formed over the insulating layer 205 (see FIG. 3B). The electrode 206 can be formed using a metal element selected from aluminum, chromium, copper, tantalum, titanium, molybdenum, and tungsten; an alloy containing any of these metal elements as a component; an alloy containing any of these metal elements in combination; or the like. One or more metal elements selected from manganese and zirconium may be used. The electrode 206 may have a single-layer structure or a stacked structure of two or more layers. Examples include a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like. Alternatively, an alloy film or a nitride film which contains aluminum and one or more elements selected from titanium, tantalum, tungsten, molybdenum, chromium, neodymium, and scandium may be used.

The electrode 206 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

First, a conductive film to be the electrode 206 is stacked over the insulating layer 205 by a sputtering method, a CVD method, an evaporation method, or the like, and a resist mask is formed over the conductive film by a photolithography process. Next, part of the conductive film to be the electrode 206 is etched with the use of the resist mask to form the electrode 206. At the same time, a wiring and another electrode can be formed.

The conductive film may be etched by a dry etching method, a wet etching method, or both a dry etching method and a wet etching method. Note that in the case where the conductive film is etched by a dry etching method, ashing treatment may be performed before the resist mask is removed, whereby the resist mask can be easily removed using a stripper.

Note that the electrode 206 may be formed by an electrolytic plating method, a printing method, an inkjet method, or the like instead of the above formation method.

The thickness of the electrode 206 is greater than or equal to 5 nm and less than or equal to 500 nm, preferably greater than or equal to 10 nm and less than or equal to 300 nm, further preferably greater than or equal to 10 nm and less than or equal to 200 nm.

When the electrode 206 is formed using a light-blocking conductive material, external light can be prevented from reaching the semiconductor layer 208 from the electrode 206 side. As a result, a variation in electrical characteristics of the transistor due to light irradiation can be suppressed.

[Formation of Gate Insulating Layer]

Next, the insulating layer 207 is formed (see FIG. 3B). For example, the insulating layer 207 is formed to have a single-layer structure or a stacked-layer structure using any of silicon oxide, silicon oxynitride, silicon nitride oxide, silicon nitride, aluminum oxide, a mixture of aluminum oxide and silicon oxide, hafnium oxide, gallium oxide, Ga—Zn-based metal oxide, and the like.

The insulating layer 207 can be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced. For example, a stacked layer of silicon oxynitride and hafnium oxide may be used.

The thickness of the insulating layer 207 is preferably greater than or equal to 5 nm and less than or equal to 400 nm, further preferably greater than or equal to 10 nm and less than or equal to 300 nm, still further preferably greater than or equal to 50 nm and less than or equal to 250 nm. The insulating layer 207 can be formed by a sputtering method, a CVD method, an evaporation method, or the like.

In the case where a silicon oxide film, a silicon oxynitride film, or a silicon nitride oxide film is formed as the insulating layer 207, a deposition gas containing silicon and an oxidizing gas are preferably used as a source gas. Typical examples of the deposition gas containing silicon include silane, disilane, trisilane, silane fluoride, and the like. As examples of the oxidizing gas, oxygen, ozone, dinitrogen monoxide, nitrogen dioxide, and the like can be given.

The insulating layer 207 may have a stacked-layer structure in which a nitride insulating layer and an oxide insulating layer are stacked in this order from the electrode 206 side. When the nitride insulating layer is provided on the electrode 206 side, hydrogen, nitrogen, an alkali metal, an alkaline earth metal, or the like from the electrode 206 side can be prevented from moving to the semiconductor layer 208. Note that nitrogen, an alkali metal, an alkaline earth metal, or the like generally serves as an impurity element of a semiconductor. In addition, hydrogen serves as an impurity element of an oxide semiconductor. Thus, an "impurity" in this specification and the like includes hydrogen, nitrogen, an alkali metal, an alkaline earth metal, or the like.

In the case where an oxide semiconductor is used for the semiconductor layer 208 which is formed later, the density of defect states at the interface between the insulating layer 207 and the semiconductor layer 208 can be reduced by providing the oxide insulating layer on the semiconductor layer 208 side. Consequently, a transistor whose electrical characteristics are hardly degraded can be obtained. Note that in the case where an oxide semiconductor is used for the semiconductor layer 208, an oxide insulating layer containing oxygen in a proportion higher than that in the stoichiometric composition is preferably formed as the oxide insulating layer. This is because the density of defect states at the interface between the insulating layer 207 and the semiconductor layer 208 can be further reduced.

In the case where the insulating layer 207 is a stacked layer of a nitride insulating layer and an oxide insulating layer as described above, it is preferable that the nitride insulating layer be thicker than the oxide insulating layer.

The nitride insulating layer has a dielectric constant higher than that of the oxide insulating layer; therefore, an electric field generated from the electrode 206 can be efficiently transmitted to the semiconductor layer 208 even when the insulating layer 207 has a large thickness. When the insulating layer 207 has a large total thickness, the withstand voltage of the insulating layer 207 can be increased. Accordingly, the reliability of the display device can be improved.

The insulating layer 207 can have a stacked-layer structure in which a first nitride insulating layer with few defects, a second nitride insulating layer with a high blocking property against hydrogen, and an oxide insulating layer are stacked in that order from the electrode 206 side. When the first nitride insulating layer with few defects is used in the insulating layer 207, the withstand voltage of the insulating layer 207 can be improved. Particularly when an oxide semiconductor is used for the semiconductor layer 208, the use of the second nitride insulating layer with a high blocking property against hydrogen in the insulating layer 207 makes it possible to prevent hydrogen contained in the electrode 206 and the first nitride insulating layer from moving to the semiconductor layer 208.

An example of a method of forming the first and second nitride insulating layers is described below. First, as the first nitride insulating layer, a silicon nitride film with few defects is formed using a mixed gas of silane, nitrogen, and ammonia as a source gas by a plasma CVD method. Next, a mixed gas of silane and nitrogen is used as a source gas, so that a silicon nitride film in which the hydrogen concentration is low and which can block hydrogen is formed as the second nitride insulating layer. By such a formation method, the insulating layer 207 in which nitride insulating layers with few defects and a blocking property against hydrogen are stacked can be formed.

The insulating layer 207 can have a structure in which a third nitride insulating layer with a high blocking property against an impurity, the first nitride insulating layer with few defects, the second nitride insulating layer with a high blocking property against hydrogen, and the oxide insulating layer are stacked in that order from the electrode 206 side. When the third nitride insulating layer with a high blocking property against an impurity is provided in the insulating layer 207, hydrogen, nitrogen, an alkali metal, an alkaline earth metal, or the like, can be from the electrode 206 prevented from moving to the semiconductor layer 208.

An example of a method of forming the first to third nitride insulating layers is described below. First, as the third nitride insulating layer, a silicon nitride film with a high blocking property against an impurity is formed using a mixed gas of silane, nitrogen, and ammonia as a source gas by a plasma CVD method. Next, the flow rate of ammonia is increased, so that a silicon nitride film with few defects is formed as the first nitride insulating layer. Then, a mixed gas of silane and nitrogen is used as a source gas, so that a silicon nitride film in which the hydrogen concentration is low and which can block hydrogen is formed as the second nitride insulating layer. By such a formation method, the insulating layer 207 in which nitride insulating layers with few defects and a blocking property against an impurity are stacked can be formed.

Moreover, in the case of forming a gallium oxide film as the insulating layer 207, a metal organic chemical vapor deposition (MOCVD) method can be employed.

Note that the threshold voltage of the transistor can be changed by stacking the semiconductor layer 208 in which a channel of the transistor is formed and an insulating layer containing hafnium oxide with an oxide insulating layer positioned therebetween and injecting electrons into the insulating layer containing hafnium oxide.

[Formation of Semiconductor Layer]

The semiconductor layer 208 can be formed using an amorphous semiconductor, a microcrystalline semiconductor, a polycrystalline semiconductor, or the like. For example, amorphous silicon, microcrystalline germanium, or the like can be used. Alternatively, a compound semiconductor such as silicon carbide, gallium arsenide, an oxide semiconductor, or a nitride semiconductor, an organic semiconductor, or the like can be used.

First, a semiconductor film for forming the semiconductor layer 208 is formed by a CVD method such as a plasma CVD method, an LPCVD method, a metal CVD method, or an MOCVD method, an ALD method, a sputtering method, an evaporation method, or the like. When the semiconductor film is formed by an MOCVD method, damage to a surface where the semiconductor layer is formed can be reduced.

The thickness of the semiconductor film is greater than or equal to 3 nm and less than or equal to 200 nm, preferably greater than or equal to 3 nm and less than or equal to 100 nm, further preferably greater than or equal to 3 nm and less than or equal to 50 nm. In this embodiment, as the semiconductor film for forming the semiconductor layer 208, an oxide semiconductor film with a thickness of 30 nm is formed by a sputtering method.

Next, a resist mask is formed over the semiconductor film, and part of the semiconductor film is selectively etched using the resist mask to form the semiconductor layer 208. The resist mask can be formed by a photolithography method, a printing method, an inkjet method, or the like as appropriate. Formation of the resist mask by an inkjet method needs no photomask; thus, fabrication cost can be reduced.

Note that the etching of the semiconductor film may be performed by either one or both of a dry etching method and a wet etching method. After the etching of the semiconductor film, the resist mask is removed (see FIG. 3C).

[Formation of Source Electrode, Drain Electrode, and the Like]

Figure 3D:
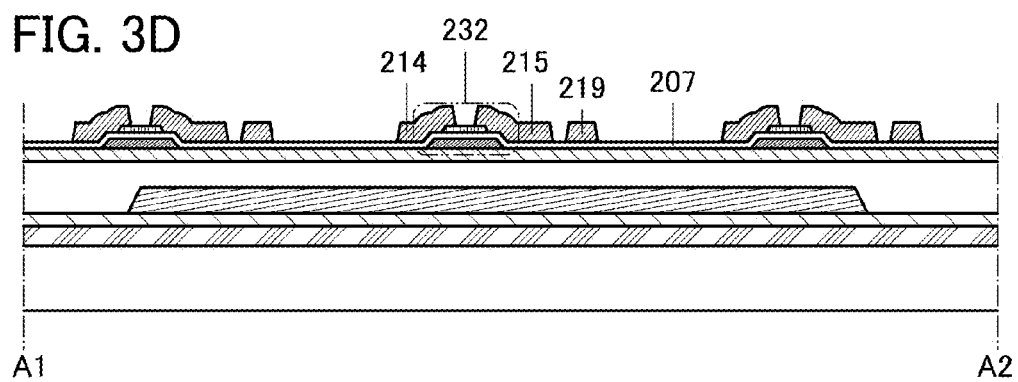

Next, the electrodes 214 and 215 and the wiring 219 are formed (see FIG. 3D). First, a conductive film for forming the electrodes 214 and 215 and the wiring 219 is formed over the insulating layer 207 and the semiconductor layer 208.

The conductive film can have a single-layer structure or a stacked-layer structure containing any of metals such as aluminum, titanium, chromium, nickel, copper, yttrium, zirconium, molybdenum, silver, tantalum, and tungsten or an alloy containing any of these metals as its main component. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and a three-layer structure in which a tungsten film, a copper film, and a tungsten film are stacked in this order.

Note that a conductive material containing oxygen such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen such as titanium nitride or tantalum nitride may be used. It is also possible to use a stacked-layer structure formed using a material containing the above metal element and conductive material containing oxygen. It is also possible to use a stacked-layer structure formed using a material containing the above metal element and a conductive material containing nitrogen. It is also possible to use a stacked-layer structure formed using a material containing the above metal element, a conductive material containing oxygen, and a conductive material containing nitrogen.

The thickness of the conductive film is greater than or equal to 5 nm and less than or equal to 500 nm, preferably greater than or equal to 10 nm and less than or equal to 300 nm, further preferably greater than or equal to 10 nm and less than or equal to 200 nm. In this embodiment, a 300-nm-thick tungsten film is formed as the conductive film.

Then, part of the conductive film is selectively etched using a resist mask to form the electrodes 214 and 215 and the wiring 219 (including other electrodes and wirings formed using the same layer). The resist mask can be formed by a photolithography method, a printing method, an inkjet method, or the like as appropriate. Formation of the resist mask by an inkjet method needs no photomask; thus, fabrication cost can be reduced.

The conductive film may be etched by a dry etching method, a wet etching method, or both a dry etching method and a wet etching method. Note that an exposed portion of the semiconductor layer 208 is removed by the etching step in some cases. After the etching of the conductive film, the resist mask is removed.

The electrodes 214 and 215 are provided, thereby forming the transistor 232 (see FIG. 3D).

[Formation of Insulating Layer]

Figure 4A:
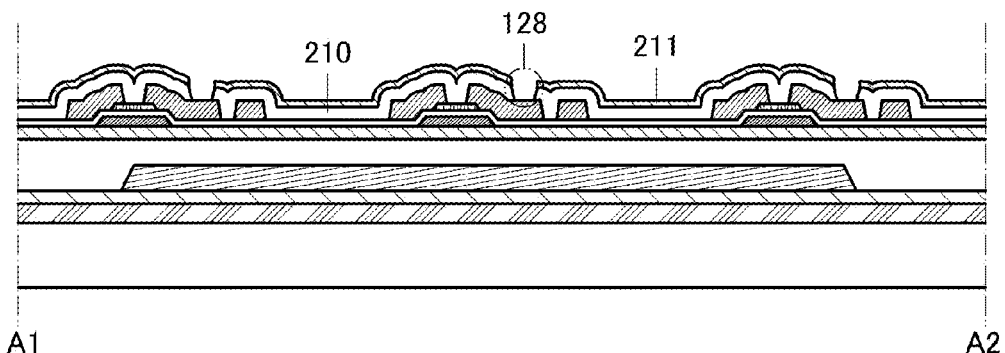
FIGS. 4A to 4C illustrate a manufacturing process of one mode of a display device.

Next, the insulating layer 210 and the insulating layer 211 are formed over the electrodes 214 and 215 and the wiring 219 (see FIG. 4A). The insulating layers 210 and 211 can be formed using a material and a method similar to those of the insulating layer 205.

In the case where an oxide semiconductor is used for the semiconductor layer 208, an insulating layer containing oxygen is preferably used for at least part of the insulating layer 210 which is in contact with the semiconductor layer 208. For example, in the case where the insulating layer 210 which is a stack including a plurality of layers, at least a layer that is in contact with the semiconductor layer 208 is preferably formed using silicon oxide.

[Formation of Opening]

Next, part of the insulating layers 210 and 211 are selectively etched using a resist mask to form an opening 128 (see FIG. 4A). At the same time, another opening that is not illustrated can also be formed. The resist mask can be formed by a photolithography method, a printing method, an inkjet method, or the like as appropriate. Formation of the resist mask by an inkjet method needs no photomask; thus, fabrication cost can be reduced.

The insulating layers 210 and 211 may be etched by a dry etching method, a wet etching method, or both a dry etching method and a wet etching method.

The electrode 215 is partly exposed by the formation of the opening 128. The resist mask is removed after the formation of the opening 128.

[Formation of Planarization Film]

Figure 4B:
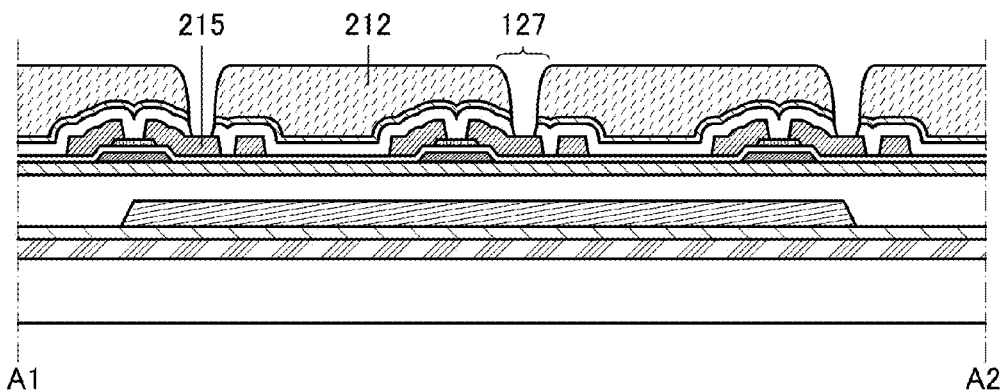

Next, the insulating layer 212 is formed over the insulating layer 210 (see FIG. 4B). The insulating layer 212 can be formed using a material and a method similar to those of the insulating layer 205.

Planarization treatment may be performed on the insulating layer 212 to reduce unevenness of a surface on which the light-emitting element 125 is formed. The planarization treatment may be, but not particularly limited to, polishing treatment (e.g., CMP) or dry etching treatment.

Forming the insulating layer 212 using an insulating material with a planarization function can make polishing treatment unnecessary. As the insulating material with a planarization function, for example, an organic material such as a polyimide resin or an acrylic resin can be used. Besides such organic materials, a low-dielectric constant material (a low-k material) or the like can be used. Note that the insulating layer 212 may be formed by stacking a plurality of insulating layers formed of any of these materials.

Part of the insulating layer 212 which overlaps with the opening 128 is removed to form an opening 127. At the same time, another opening that is not illustrated is also formed. Note that the opening 127 or the like can be formed in such a manner that a resist mask is formed by a photolithography process over the insulating layer 212 and a region of the insulating layer 212 which is not covered with the resist mask is etched. A surface of the electrode 215 is exposed by the formation of the opening 127 (see FIG. 4B).

When the insulating layer 212 is formed using a photosensitive material, the opening 127 can be formed without the resist mask. In this embodiment, a photosensitive polyimide resin is used to form the insulating layer 212 and the opening 127.

[Formation of Anode]

Figure 4C:
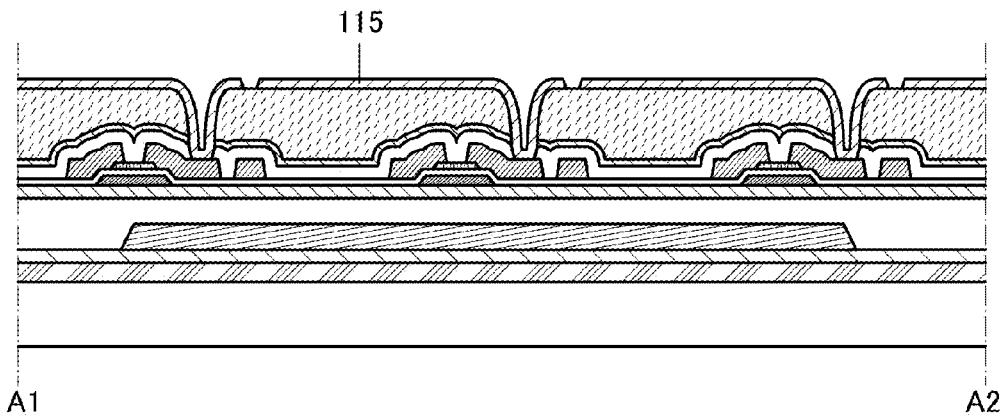

Next, the electrode 115 is formed over the insulating layer 211 (see FIG. 4C). The electrode 115 is preferably formed using a conductive material that efficiently reflects light emitted from the EL layer 117 formed later. Note that the electrode 115 may have a stacked-layer structure of a plurality of layers without limitation to a single-layer structure. In the case where the electrode 115 is used as an anode, it may have a structure in which, for example, in contact with the EL layer 117, a layer having a light-transmitting property and a work function higher than the EL layer 117, such as an indium tin oxide layer, is provided and in contact therewith, a layer having high reflectance (e.g., a layer of aluminum, an alloy containing aluminum, or silver) is provided.

Note that although the display device having a top-emission structure is described as an example in this embodiment, a display device having a bottom-emission structure or a dual-emission structure can be used.

In the case where the display device 100 has a bottom-emission structure or a dual-emission structure, the electrode 115 is preferably formed using a light-transmitting conductive material.

The electrode 115 can be formed in such a manner that a conductive film to be the electrode 115 is formed over the insulating layer 212, a resist mask is formed over the conductive film, and a region of the conductive film which is not covered with the resist mask is etched. The conductive film can be etched by a dry etching method, a wet etching method, or both a dry etching method and a wet etching method. The resist mask can be formed by a photolithography method, a printing method, an inkjet method, or the like as appropriate. Formation of the resist mask by an inkjet method needs no photomask; thus, fabrication cost can be reduced. The resist mask is removed after the formation of the electrode 115.

[Formation of Partition]

Figure 5A:
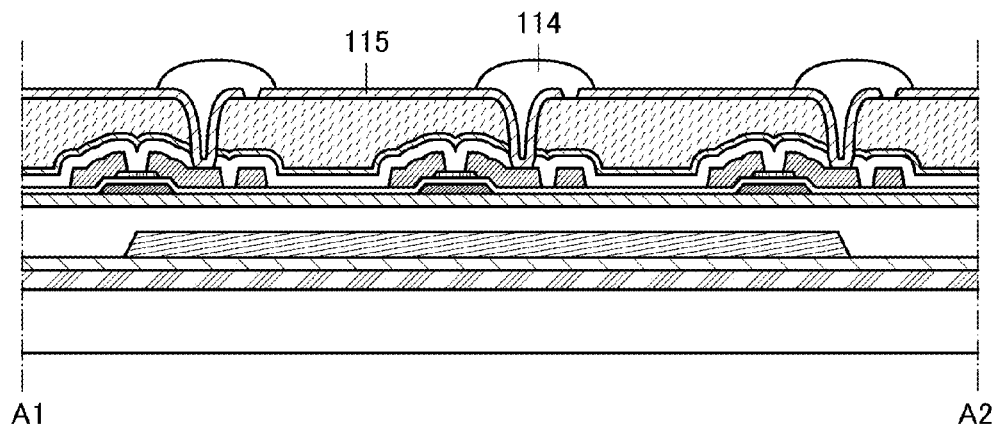
FIGS. 5A and 5B illustrate a manufacturing process of one mode of a display device.
Figure 5B:
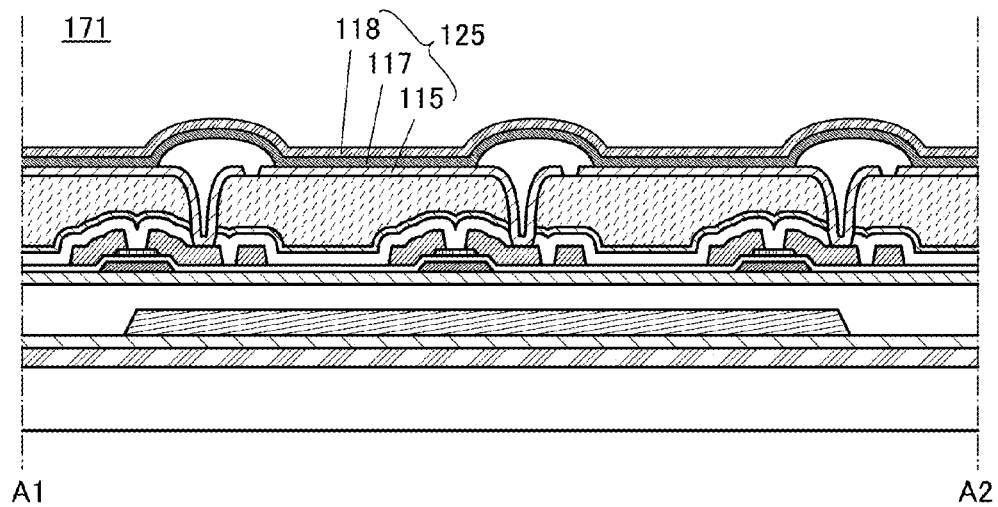

Next, the partition 114 is formed (see FIG. 5A). The partition 114 is provided in order to prevent an unintended electrical short-circuit between the light-emitting elements 125 in adjacent pixels and unintended light emission from the light-emitting elements 125. The partition 114 also has a function of preventing the contact of a metal mask with the electrode 115 in the case where the metal mask is used to form the EL layer 117 described later. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[Formation of EL Layer]

A structure of the EL layer 117 is described in Embodiment 4.

[Formation of Cathode]

The electrode 118 is used as a cathode in this embodiment, and thus is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used. As the buffer layer, an oxide of an alkaline earth metal, a halide, a magnesium-silver alloy, or the like can also be used.

In the case where light emitted from the EL layer 117 is extracted through the electrode 118, the electrode 118 preferably has a property of transmitting visible light. The light-emitting element 125 includes the electrode 115, the EL layer 117, and the electrode 118 (see FIG. 5B).

In this embodiment, a structure including the substrate 101 and the transistor 232 and the light-emitting element 125 formed over the substrate 101 is referred to as an element substrate 171.

[Formation of Counter Substrate]

Figure 6A:
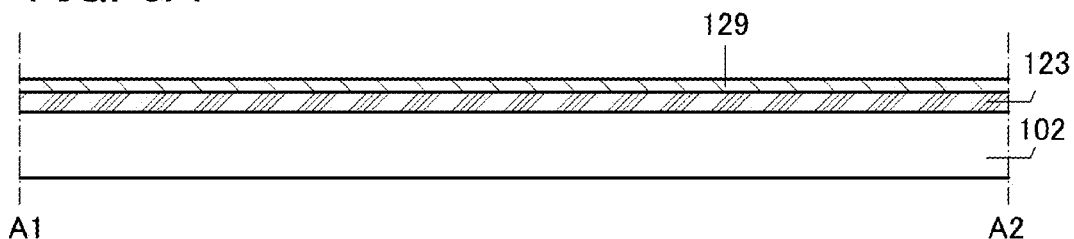
FIGS. 6A to 6E illustrate a manufacturing process of one mode of a display device.

First, a peeling layer 123 is formed over the substrate 102 (see FIG. 6A). The substrate 102 can be formed using a material similar to that of the substrate 101. Note that the same material or different materials may be used for the substrate 101 and the substrate 102. The peeling layer 123 can be formed in a manner similar to that of the peeling layer 113. Moreover, an insulating layer may be provided between the substrate 102 and the peeling layer 123. In this embodiment, aluminoborosilicate glass is used for the substrate 102. As the peeling layer 123 over the substrate 102, a tungsten layer is formed by a sputtering method.

Note that it is preferable to expose a surface of the peeling layer 123 to an atmosphere containing oxygen or a plasma atmosphere containing oxygen after the formation of the peeling layer 123. Oxidizing the surface of the peeling layer 123 can facilitate peeling of the substrate 102 performed later.

[Formation of Insulating Layer 129]

Next, the insulating layer 129 is formed over the peeling layer 123 (see FIG. 6A). The insulating layer 129 can be formed using a material and a method that are similar to those of the insulating layer 205. In this embodiment, the insulating layer 129 is formed by stacking a 200-nm-thick silicon oxynitride film, a 140-nm-thick silicon nitride oxide film, and a 100-nm-thick silicon oxynitride film by a plasma CVD method from the substrate 102 side.

[Formation of Light-Blocking Layer 264]

Figure 6B:
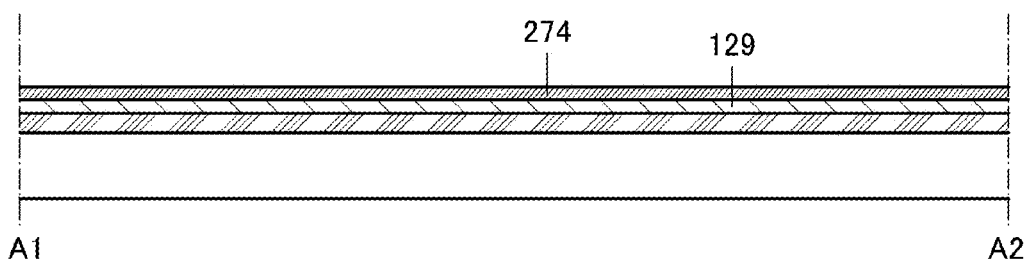

Next, a layer 274 for forming the light-blocking layer 264 is formed over the insulating layer 129 (see FIG. 6B). The light-blocking layer 264 has functions of blocking light emitted from an adjacent display element and suppressing color mixture between adjacent display elements. Moreover, the coloring layer 266 which is formed later is provided such that its end portion overlaps with the end portion of the light-blocking layer 264, whereby light leakage can be reduced. The layer 274 may have a single-layer structure or a stacked-layer structure of two or more layers. Examples of a material that can be used for the layer 274 are a metal material including chromium, titanium, nickel, or the like; an oxide material including chromium, titanium, nickel, or the like; and a resin material including a metal material, a pigment, or dye.

Figure 6C:
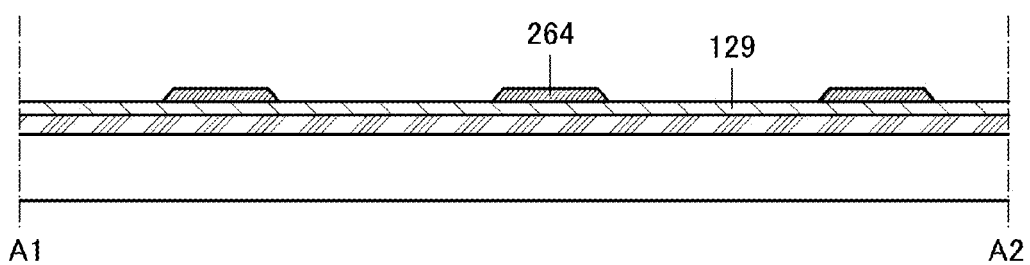

In the case where the layer 274 is formed using the metal material, the oxide material, or the resin material, a resist mask is formed over the layer 274, and the layer 274 is etched into a desired shape using the resist mask, so that the light-blocking layer 264 can be formed (see FIG. 6C). With a macromolecular material in which carbon black is dispersed, direct writing of the light-blocking layer 264 can be performed over the insulating layer 129 by an inkjet method.

[Formation of Coloring Layer 266]

Figure 6D:
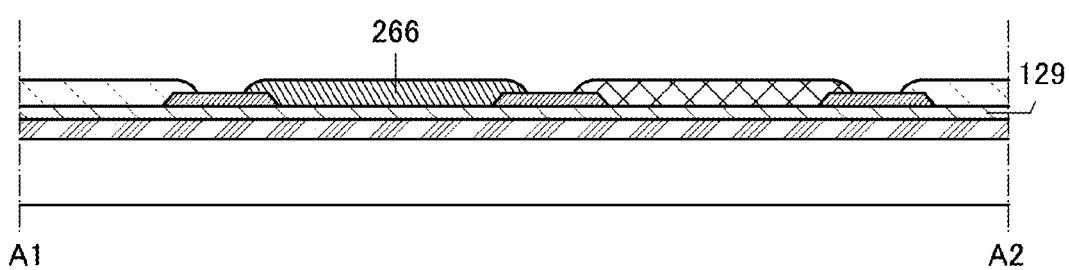

Next, the coloring layer 266 is formed over the insulating layer 129 (see FIG. 6D). The coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer 266 is formed in a desired position with any of various materials by a printing method, an inkjet method, or a photolithography method. At this time, the coloring layer 266 is preferably provided so as to partly overlap with the light-blocking layer 264. Color display can be performed by providing the coloring layers 266 of different colors in different pixels.

[Formation of Overcoat Layer 268]

Figure 6E:
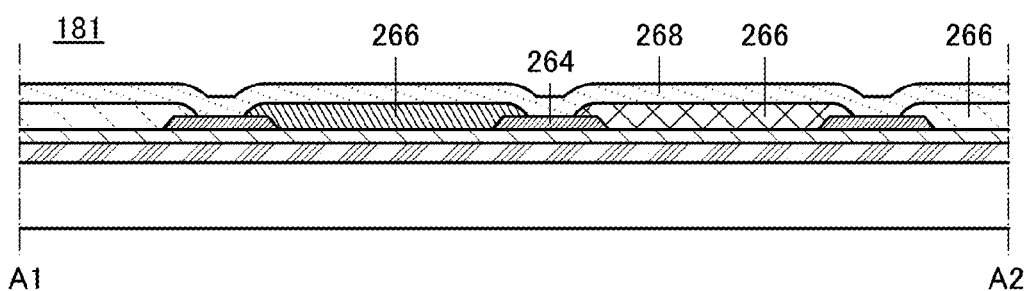

Next, the overcoat layer 268 is formed over the light-blocking layer 264 and the coloring layer 266 (see FIG. 6E).

As the overcoat layer 268, an organic insulating layer of an acrylic resin, an epoxy resin, polyimide, or the like can be used. With the overcoat layer 268, an impurity or the like contained in the coloring layer 266 can be prevented from diffusing into the light-emitting element 125 side, for example. Note that the overcoat layer 268 is not necessarily formed.

As the overcoat layer 268, a light-transmitting conductive film may be formed. When the light-transmitting conductive film is formed as the overcoat layer 268, light emitted from the light-emitting element 125 can be transmitted through the overcoat layer 268 and transmission of ionized impurities can be prevented.

The light-transmitting conductive film can be formed with, for example, the above-described light-transmitting conductive material. A metal film that is thin enough to have a light-transmitting property can also be used.

Through the above steps, the counter substrate 181 can be formed. Note that the counter substrate 181 is not provided with the coloring layer 266 or the like in some cases when the coloring layer 266 is not needed.

[Attachment of Element Substrate 171 and Counter Substrate 181]

Next, the element substrate 171 and the counter substrate 181 are attached to each other with the bonding layer 120 provided therebetween. At this time, the light-emitting element 125 included in the element substrate 171 and the coloring layer 266 included in the counter substrate 181 are arranged so as to face each other (see FIG. 7A).

[Peeling of Substrate 101]

Figure 7A:
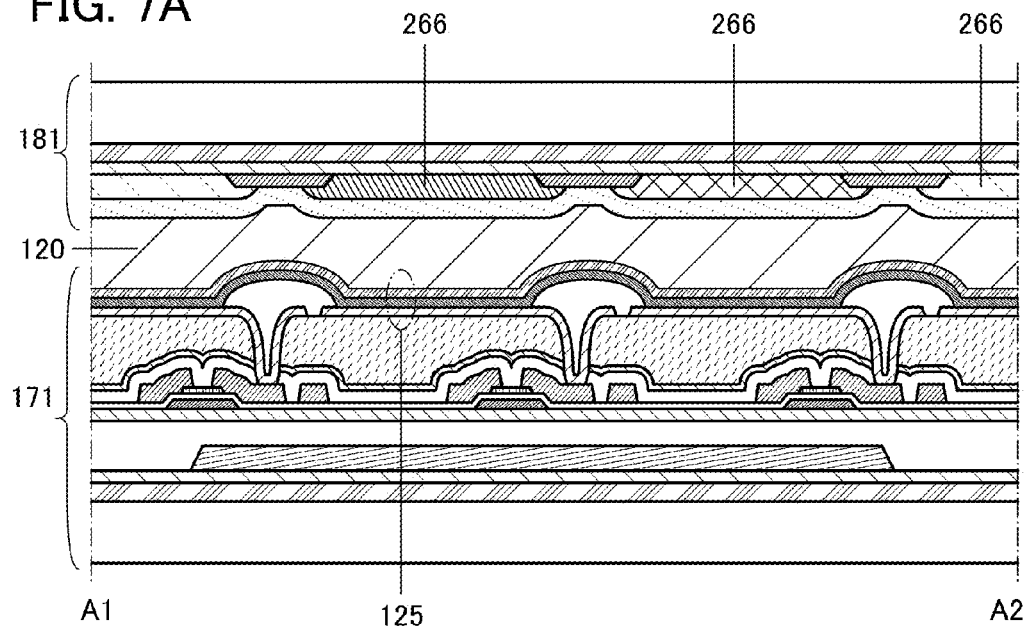
FIGS. 7A and 7B illustrate a manufacturing process of one mode of a display device.
Figure 7B:
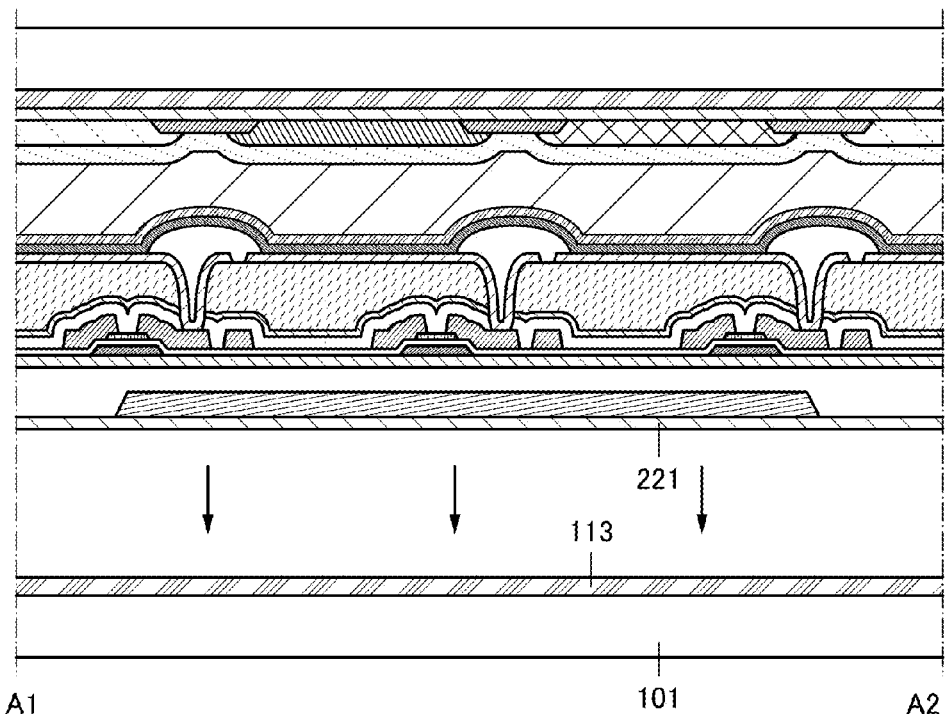

Next, the substrate 101 included in the element substrate 171 is peeled from the insulating layer 221 (see FIG. 7B). As a peeling method, mechanical force (e.g., a process with a human hand or a gripper, a process by rotation of a roller, or ultrasonic waves) may be used. For example, a cut is made in the peeling layer 113 with a sharp edged tool, by laser light irradiation, or the like and water is injected into the cut. A portion between the peeling layer 113 and the insulating layer 221 absorbs water through capillarity action, so that the substrate 101 can be peeled together with the peeling layer 113 easily.

Next, part of the insulating layer 221 which overlaps with the terminal electrode 216 is removed to form an opening 132b. In the opening 132b, a surface of the terminal electrode 216 is partly exposed.

[Attachment of Substrate 111]

Figure 8A:
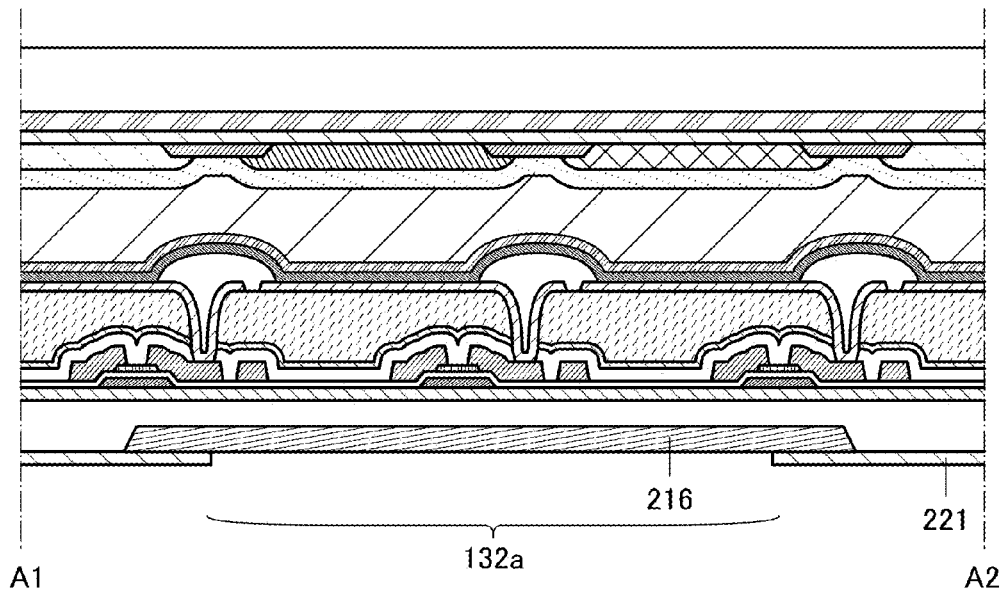
FIGS. 8A and 8B illustrate a manufacturing process of one mode of a display device.
Figure 8B:
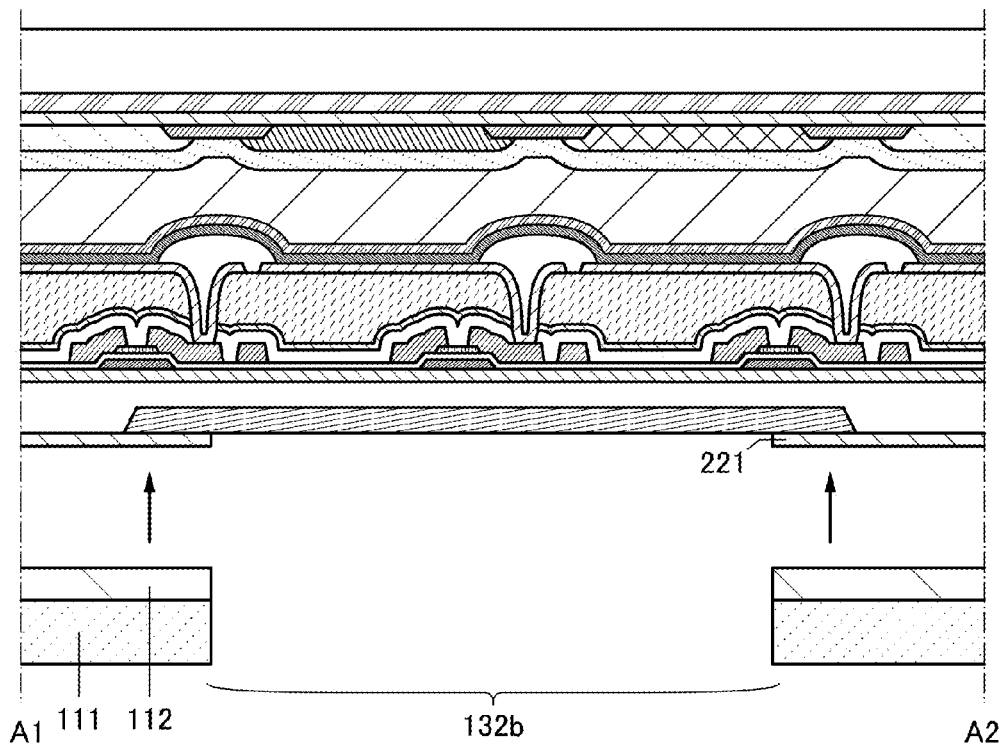

Then, the substrate 111 including the opening 132b is attached to the insulating layer 221 with the bonding layer 112 (see FIG. 8B). The attachment is performed such that the openings 132a and 132b overlap with each other. The overlap of the openings 132a and 132b forms the opening 132 (see FIG. 9A). Inside the opening 132, the surface of the terminal electrode 216 is exposed.

[Peeling of Substrate 102]

Figure 9A:
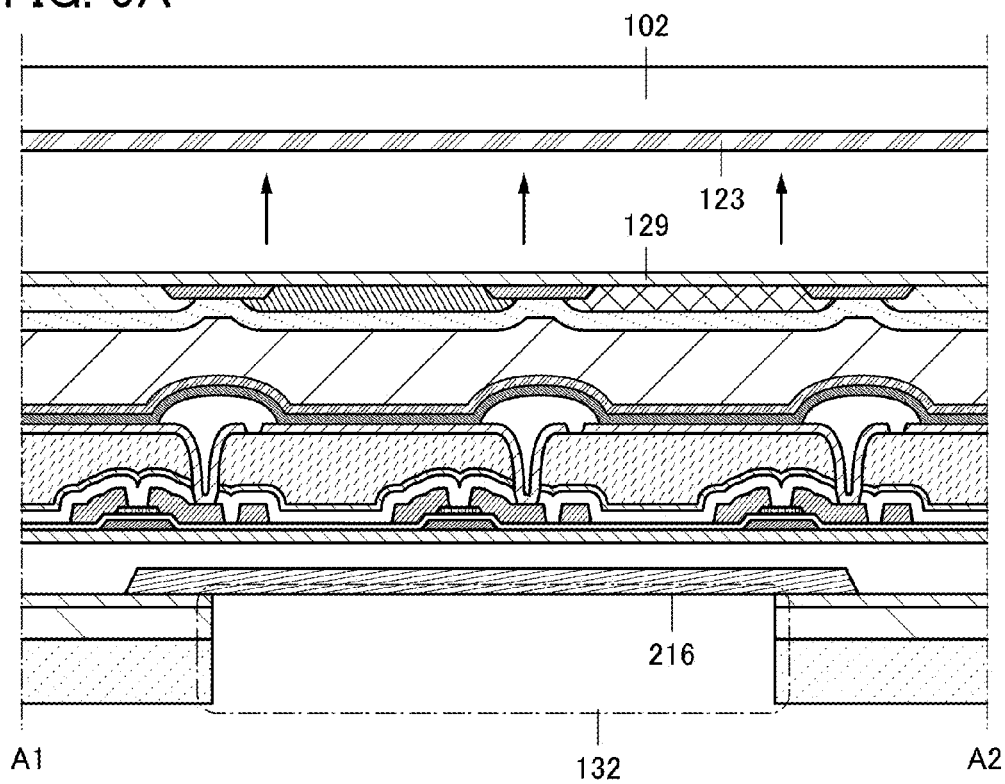
FIGS. 9A and 9B illustrate a manufacturing process of one mode of a display device.

Next, the substrate 102 included in the counter substrate 181 is peeled from the insulating layer 129 together with the peeling layer 123 (see FIG. 9A). As a peeling method, mechanical force (e.g., a process with a human hand or a gripper, a process by rotation of a roller, or ultrasonic waves) may be used. For example, a cut is made in the peeling layer 123 with a sharp edged tool, by laser light irradiation, or the like and water is injected into the cut. A portion between the peeling layer 123 and the insulating layer 129 absorbs water through capillarity action, so that the substrate 102 can be peeled easily.

[Attachment of Substrate 121]

Figure 9B:
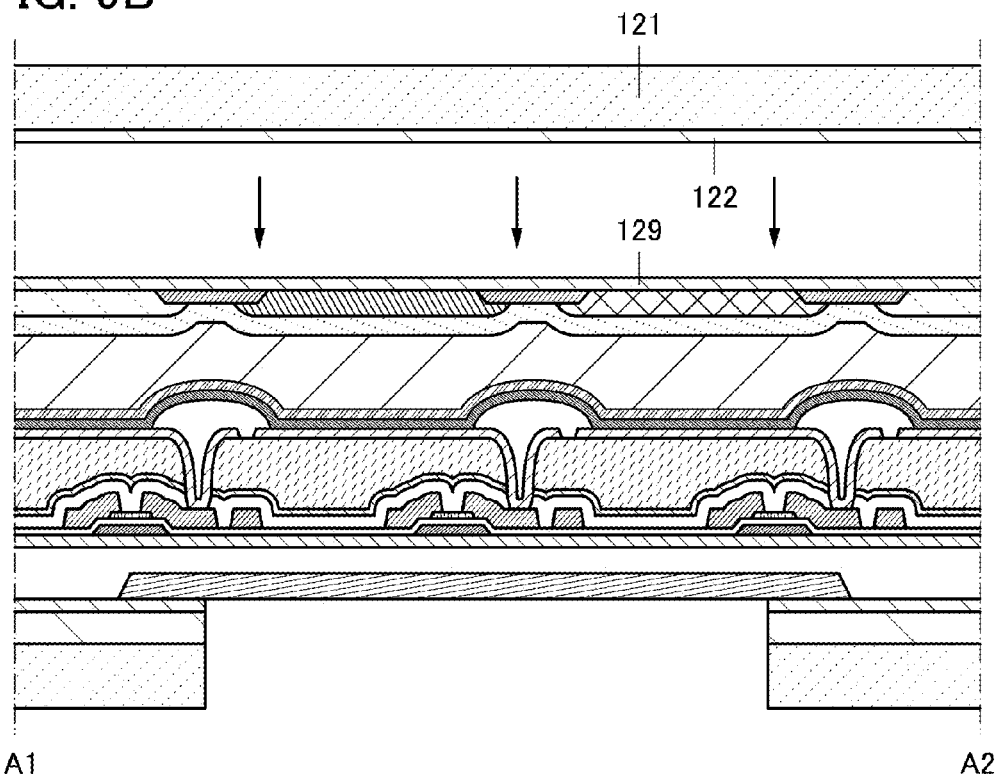
Figure 10A:
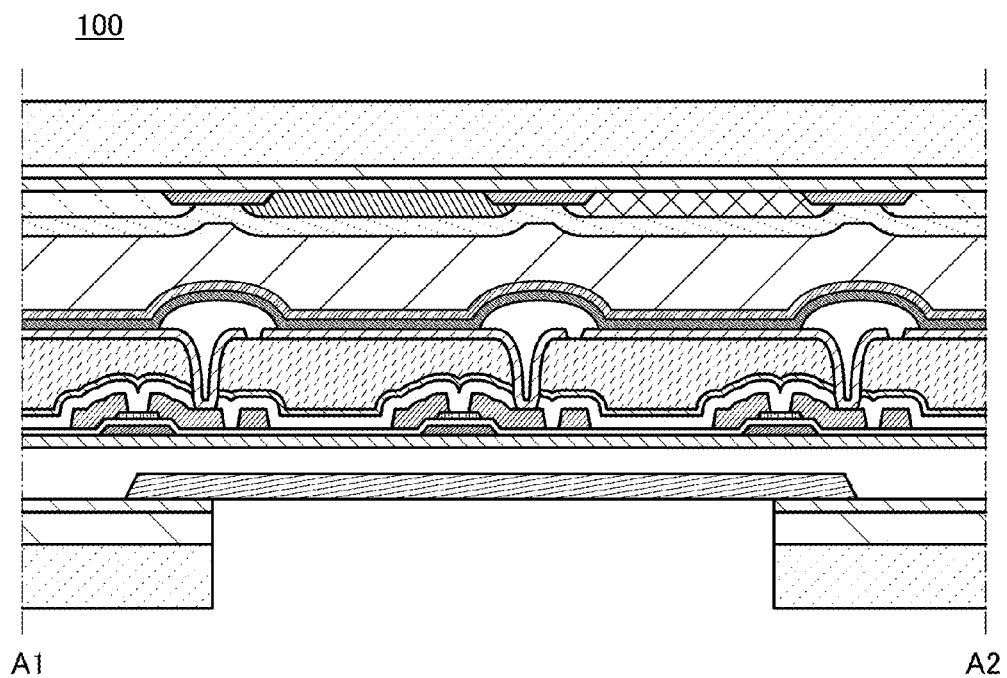
FIGS. 10A and 10B illustrate a manufacturing process of one mode of a display device.

Next, the substrate 121 is attached to the insulating layer 129 with the bonding layer 122 provided therebetween (see FIG. 9B). In the above-described manner, the display device 100 can be manufactured (see FIG. 10A).

Figure 10B:
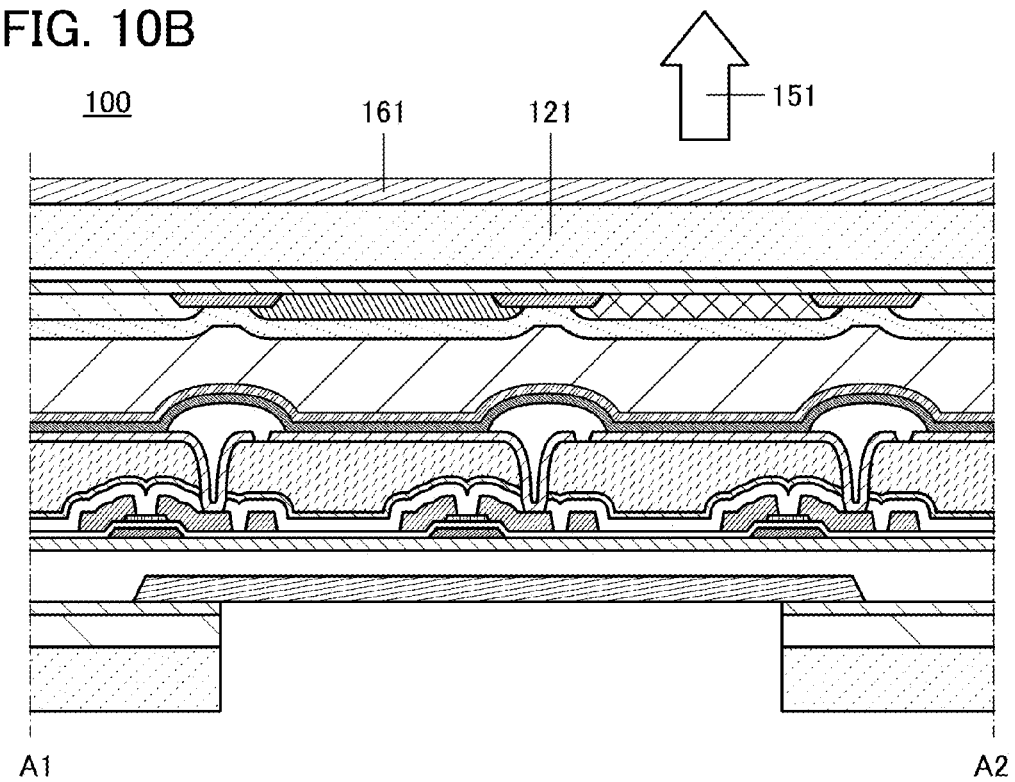

Alternatively, one or more of layers each formed using a material having a specific function, such as an anti-reflection layer, a light diffusion layer, a microlens array, a prism sheet, a retardation plate, or a polarizing plate, (hereinafter referred to as "functional layers") may be provided on the outside of the substrate 111 or the substrate 121 through which light 151 is emitted. As the anti-reflection layer, for example, a circularly polarizing plate or the like can be used. With the functional layer, a display device having a higher display quality can be achieved. Moreover, power consumption of the display device can be reduced. FIG. 10B is a cross-sectional view of the display device 100 having a top-emission structure including a functional layer 161. As the functional layer 161, a touch sensor may be provided.

Figure 11A:
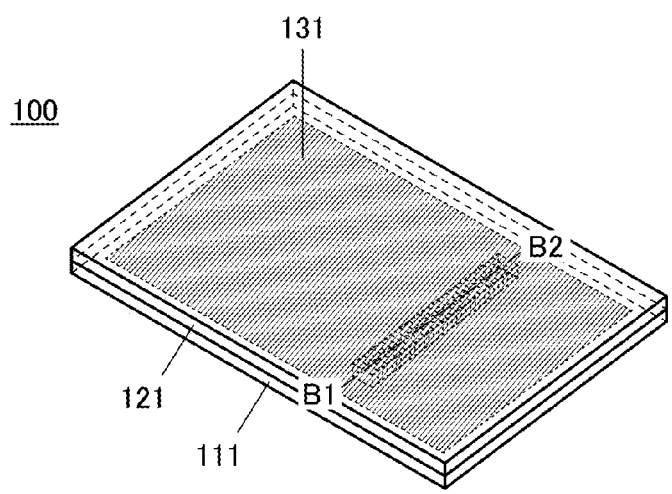
FIGS. 11A and 11B are a perspective view and a cross-sectional view illustrating one mode of a display device.
Figure 11B:
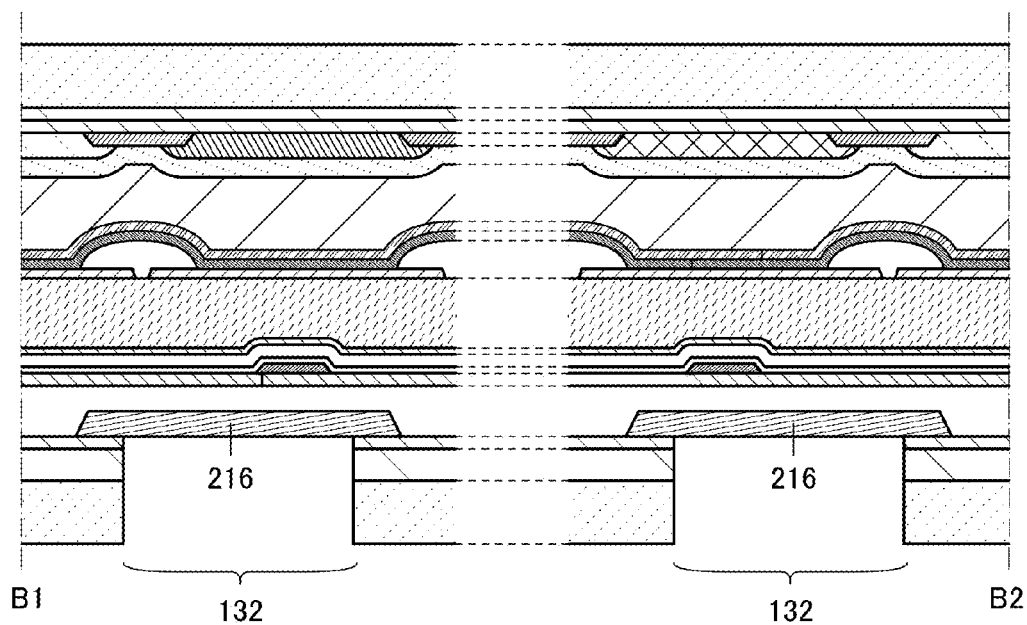

In the display device 100 of one embodiment of the present invention, a plurality of terminal electrode 216 may be provided in one opening 132 or the opening 132 may be provided for each terminal electrode 216. FIG. 11A is a perspective view of the display device 100 in which the opening 132 is provided for each terminal electrode 216, and FIG. 11B is a cross-sectional view taken along the dash-dot line B1-B2 in FIG. 11A.

For the substrate 111 or the substrate 121, a material having a specific function may be used. For example, a circularly polarizing plate may be used as the substrate 111 or the substrate 121. Alternatively, for example, the substrate 111 or the substrate 121 may be formed using a retardation plate, and a polarizing plate may be provided so as to overlap with the substrate. As another example, the substrate 111 or the substrate 121 may be formed using a prism sheet, and a circularly polarizing plate may be provided so as to overlap with the substrate. With the use of the material having a specific function for the substrate 111 or the substrate 121, improvement of display quality and reduction of the manufacturing cost can be achieved.

[Formation of External Electrode]

Next, in the opening 132, the external electrode 124 is electrically connected to the terminal electrode 216 through the anisotropic conductive connection layer 138 (see FIG. 1B). Consequently, electric power or a signal can be input to the display device 100. Note that an FPC can be used as the external electrode 124. A metal wire can also be used as the external electrode 124. Although the anisotropic conductive connection layer 138 may be used to connect the metal wire and the terminal electrode 216 to each other, the connection can be made by a wire bonding method without using the anisotropic conductive connection layer 138. Alternatively, the metal wire and the terminal electrode 216 can be connected to each other by a soldering method.

Since the terminal electrode 216 is provided on the back side of the display region 131, a reduced frame width and a shape that is not significantly different from the shape of the display region can be achieved even in the case where the display region is non-rectangular. Furthermore, an edge portion of the display device 100 does not need to be provided with the terminal electrode 216, and the external shape of the display device 100 can have a higher degree of design flexibility accordingly.

Figure 12A:
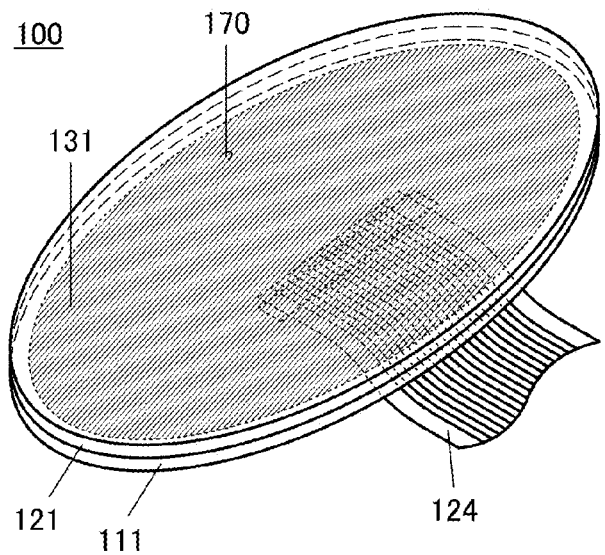
FIGS. 12A to 12C each illustrate an example of a pixel structure of one mode of a display device.
Figure 12B:
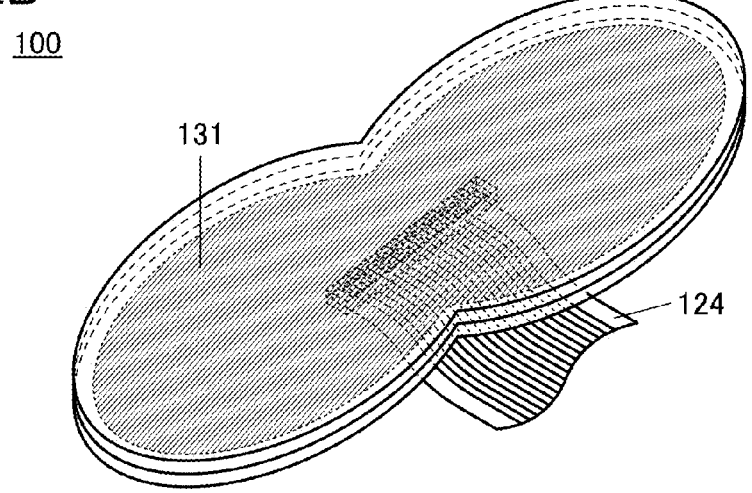
Figure 12C:
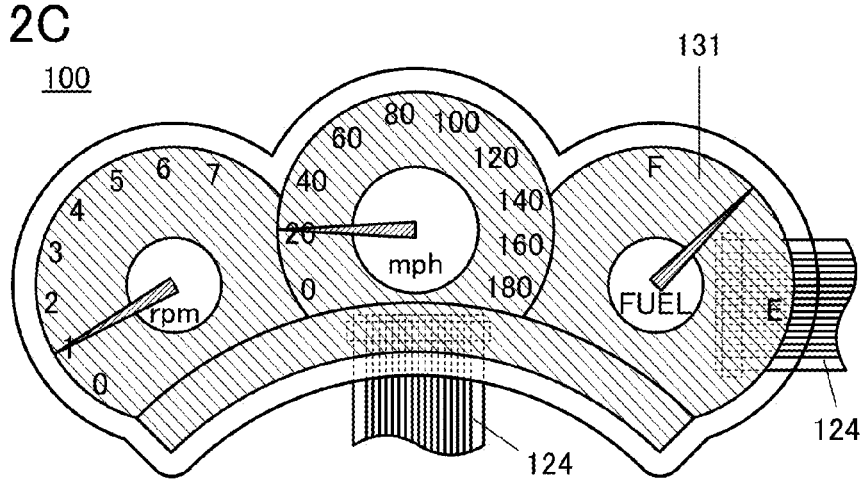

For example, the external shape of the display device 100 can be non-rectangular, as in FIG. 12A. The external shape of the display device 100 can be formed by combining two or more curves, as in FIG. 12B. The external shape of the display device 100 can be formed so as to fit the shape of an object into which the display device 100 is incorporated, as in FIG. 12C. Note that the external shape of the display device 100 illustrated in FIG. 12C fits a portion of an automobile which displays information such as speed. The display region 131 displays a speedometer, an engine tachometer, and a fuel meter. Two or more portions of the back side of the display region 131 may be provided with the external electrodes 124.

[Structure Examples of Pixels for Achieving Color Display]

Figure 13A:
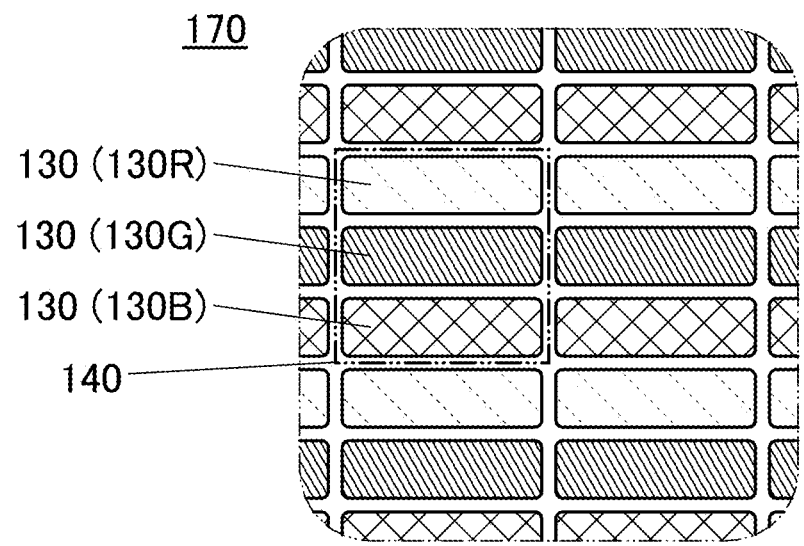
FIGS. 13A and 13B each illustrate an example of a pixel structure of one mode of a display device.
Figure 13B:
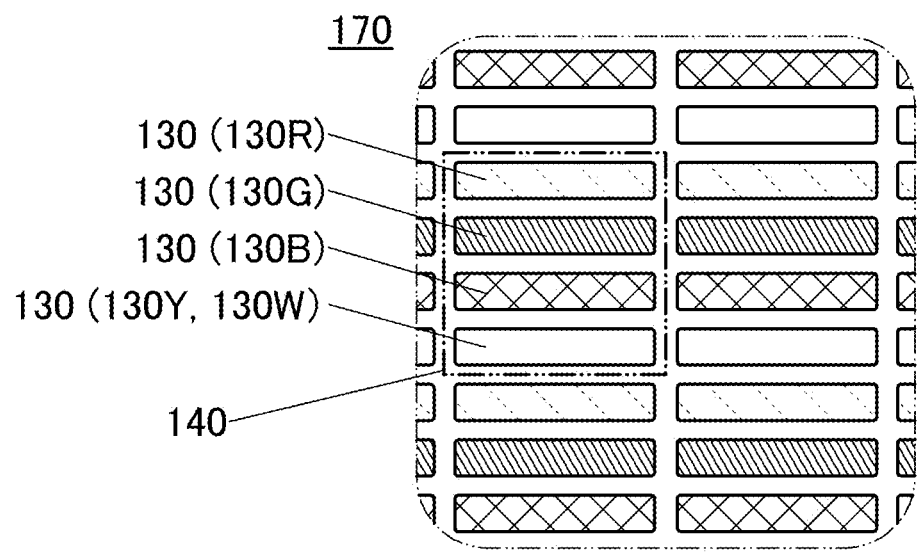

Here, examples of a pixel structures for achieving color display are described with reference to FIGS. 13A and 13B. FIGS. 13A and 13B and FIGS. 14A and 14B are enlarged plan views of a region 170 in the display region 131 of FIG. 13A. For example, as illustrated in FIG. 13A, three pixels 130 function as subpixels and can be collectively used as one pixel 140. The red, green, and blue coloring layers 266 are used so as to correspond to the three pixels 130, so that full color display can be achieve. In FIG. 13A, the pixel 130 emitting red light, the pixel 130 emitting green light, and the pixel 130 emitting blue light are illustrated as a pixel 130R, a pixel 130G, and a pixel 130B, respectively. The colors of the coloring layers 266 may be a color other than red, green, and blue; for example, the colors of the coloring layer 266 may be yellow, cyan, magenta, or the like.

As illustrated in FIG. 13B, four pixels 130 may function as subpixels and may be collectively used as one pixel 140. For example, the coloring layers 266 corresponding to the four pixels 130 may be red, green, blue, and yellow. In FIG. 13B, the pixel 130 emitting red light, the pixel 130 emitting green light, the pixel 130 emitting blue light, and the pixel 130 emitting yellow light are illustrated as a pixel 130R, a pixel 130G, a pixel 130B, and a pixel 130Y, respectively. By increasing the number of pixels 130 used as one pixel 140, the color reproducibility can be particularly improved. Consequently, the display quality of the display device can be improved.

Alternatively, the coloring layers 266 corresponding to the four pixels 130 may be red, green, blue, and white (see FIG. 13B). With the pixel 130 emitting white light (a pixel 130W), the luminance of the display region can be increased. Note that in the case where the pixel 130W emitting white light is provided, the coloring layer 266 corresponding to the pixel 130W may be omitted. Without the coloring layer 266 corresponding to the pixel 130W, a luminance reduction due to light transmission through the coloring layer 266 does not occur, and the luminance of the display region can be increased accordingly. Moreover, power consumption of the display device can be reduced. On the other hand, with the white coloring layer 266 corresponding to the pixel 130W, the color temperature of white light can be controlled, so that the display quality of the display device can be improved. Depending on the intended use of the display device, each pixel 130 may function as a subpixel and two pixels 130 may be collectively used as one pixel 140.

Figure 14A:
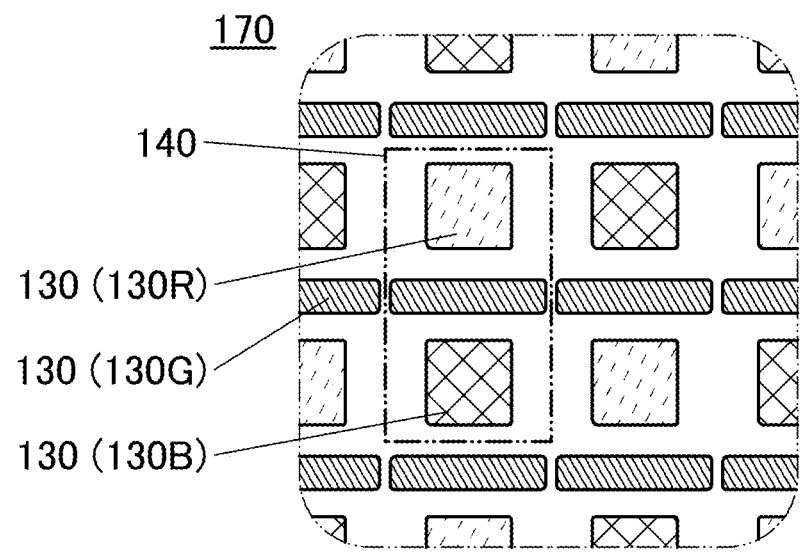
FIGS. 14A and 14B each illustrate an example of a pixel structure of one mode of a display device.
Figure 14B:
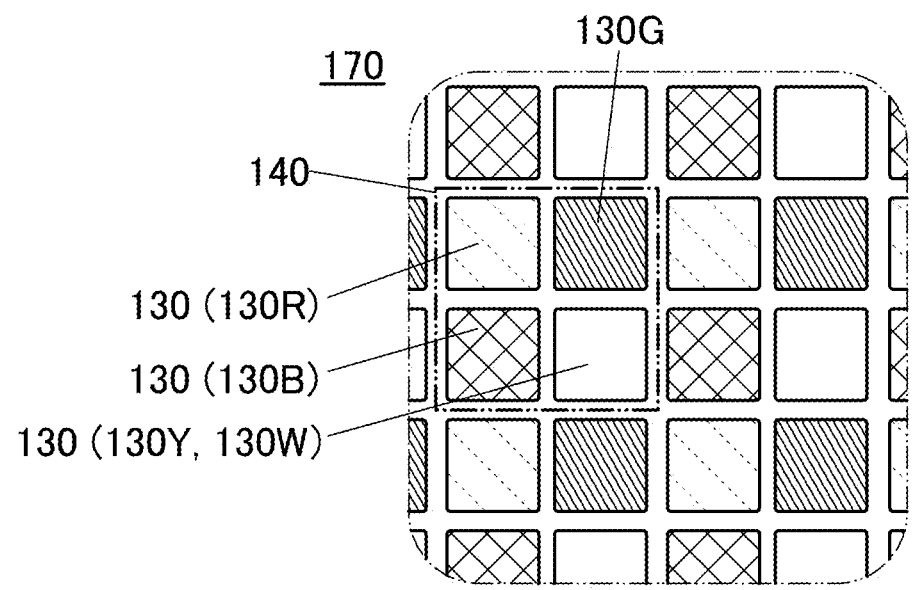

In the case where the four pixels 130 are collectively used as one pixel 140, the four pixels 130 may be arranged in a matrix, as in FIG. 14B. In addition, in the case where the four pixels 130 are collectively used as one pixel 140, a pixel that emits light of cyan, magenta, or the like may be used instead of the pixel 130Y or the pixel 130W. A plurality of pixels 130 that emit light of the same color may be provided in the pixel 140.

Note that the occupation areas or shapes of the pixels 130 included in the pixel 140 may be the same or different. In addition, arrangement is not limited to stripe arrangement or matrix arrangement. For example, delta arrangement, Bayer arrangement, pentile arrangement, or the like can be used. FIG. 14A illustrates an example of pentile arrangement.

For example, using the pixels 140 arranged in a matrix of 1920×1080, the display device 500 can display an image with "full high definition" (also referred to as "2K resolution", "2K1K", "2K", and the like). Using the pixels 140 arranged in a matrix of 3840×2160 (4096×2160 or the like), the display device can display an image with "ultra high definition" (also referred to as "4K resolution", "4K2K", "4K", "4K UHD", "QFHD", "4K ultra HD", and the like). Using the pixels 140 arranged in a matrix of 7680×4320 (8192×4320 or the like), the display device can display an image with "super high definition" (also referred to as "8K resolution", "8K4K", "8K", "8K UHD", "8K UHDTV", and the like). Using a larger number of pixels, the display device can display an image with 16K or 32K resolution.

This embodiment can be implemented in an appropriate combination with any of the structures described in the other embodiments.

Embodiment 2

Figure 15A:
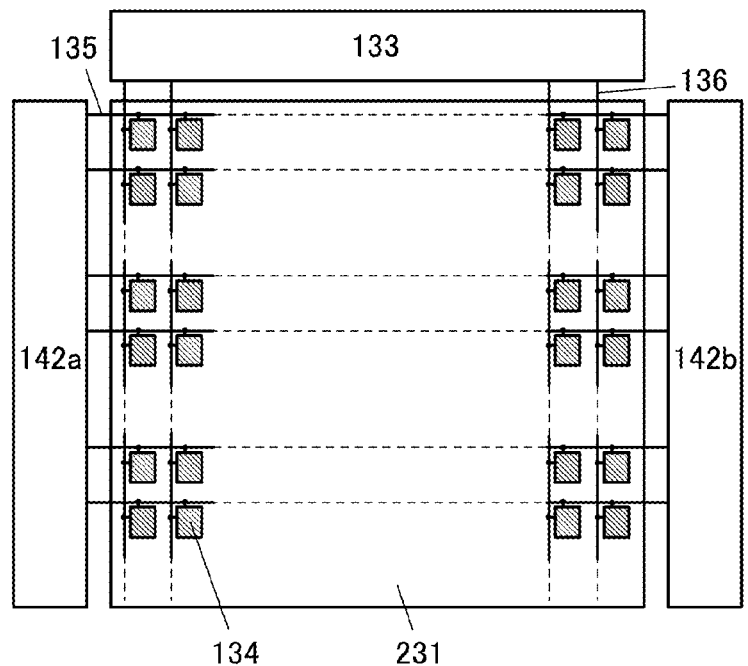
FIGS. 15A to 15C are a block diagram and circuit diagrams illustrating one mode of a display device.

In this embodiment, a specific structure example of the display device 100 is described with reference to FIGS. 15A to 15C. FIG. 15A is a block diagram of a configuration example of the display device 100.

FIG. 15A illustrates the display region 231 and the driver circuits 142a, 142b, and 133. The display region 231 in FIG. 15A corresponds to the display region 131 of the display device 100. The driver circuits 133, 142a, and 142b may be provided inside or outside the display device 100. Note that the driver circuits 142a, 142b, and 133 are collectively referred to as a driver circuit or a peripheral driver circuit in some cases.

The driver circuits 142a and 142b can function as, for example, scan line driver circuits. The driver circuit 133 can function as, for example, a signal line driver circuit. Note that one of the driver circuits 142a and 142b may be omitted. Alternatively, some sort of circuit facing the driver circuit 133 with the display region 231 provided therebetween may be provided.

The display device 100 illustrated as an example in FIG. 15A includes m wirings 135 which are arranged substantially parallel to each other and whose potentials are controlled by the driver circuit 142a and/or the driver circuit 142b, and n wirings 136 which are arranged substantially parallel to each other and whose potentials are controlled by the driver circuit 133. The display region 231 includes a plurality of pixel circuits 134 arranged in a matrix. One pixel circuit 134 is used for driving one subpixel (pixel 130).

Each of the wirings 135 is electrically connected to the n pixel circuits 134 in a given row among the pixel circuits 134 arranged in m rows and n columns in the display region 131. Each of the wirings 136 is electrically connected to the m pixel circuits 134 in a given column among the pixel circuits 134 arranged in m rows and n columns. Note that m and n are each an integer of 1 or more.

Figure 15B:
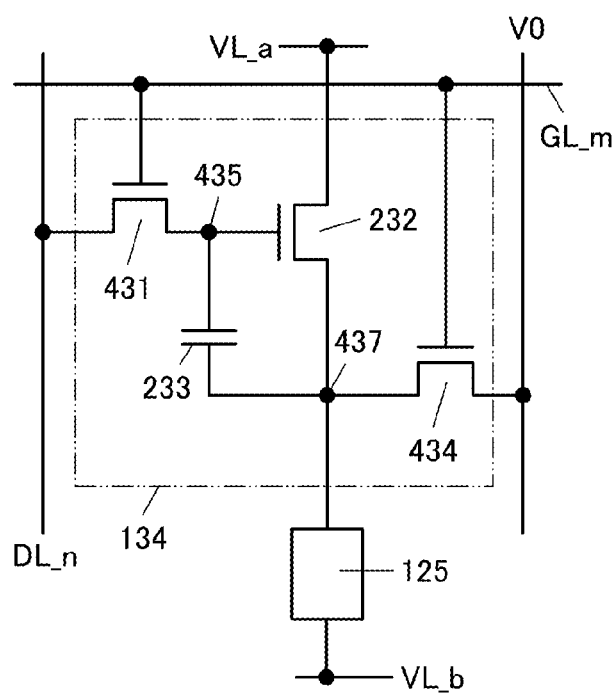
Figure 15C:
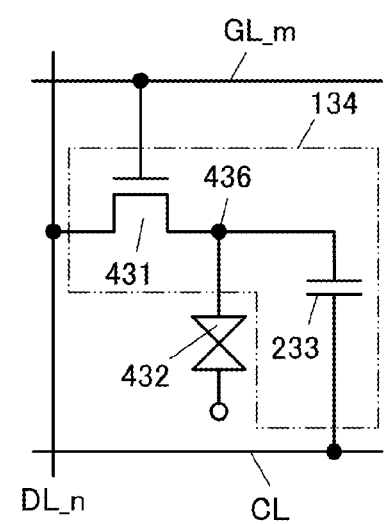

FIGS. 15B and 15C illustrate circuit configurations that can be used for the pixel circuits 134 in the display device in FIG. 15A.

[Example of Pixel Circuit for Light-Emitting Display Device]

The pixel circuit 134 illustrated in FIG. 15B includes a transistor 431, a capacitor 233, the transistor 232, and a transistor 434. The pixel circuit 134 is electrically connected to the light-emitting element 125.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m).

The transistor 431 has a function of controlling whether to write a data signal to a node 435.

One of a pair of electrodes of the capacitor 233 is electrically connected to the node 435, and the other of the pair of electrodes of the capacitor 233 is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to a potential supply line VL_a, and the other of the source electrode and the drain electrode of the transistor 232 is electrically connected to the node 437. A gate electrode of the transistor 232 is electrically connected to the node 435.

One of a source electrode and a drain electrode of the transistor 434 is electrically connected to a potential supply line V0, and the other of the source electrode and the drain electrode of the transistor 434 is electrically connected to the node 437. A gate electrode of the transistor 434 is electrically connected to the scan line GL_m.

One of an anode and a cathode of the light-emitting element 125 is electrically connected to a potential supply line VL_b, and the other of the anode and the cathode of the light-emitting element 125 is electrically connected to the node 437.

As the light-emitting element 125, an organic electroluminescent element (also referred to as an organic EL element) or the like can be used, for example. Note that the light-emitting element 125 is not limited thereto and may be an inorganic EL element containing, for example, an inorganic material.

As a power supply potential, a potential on the comparatively high potential side or a potential on the comparatively low potential side can be used, for example. A power supply potential on the high potential side is referred to as a high power supply potential (also referred to as VDD), and a power supply potential on the low potential side is referred to as a low power supply potential (also referred to as VSS). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

A high power supply potential VDD is supplied to one of the potential supply line VL_a and the potential supply line VL_b, and a low power supply potential VSS is supplied to the other, for example.

In the display device including the pixel circuit 134 in FIG. 15B, the pixel circuits 134 are sequentially selected row by row by the driver circuit 142a and/or the driver circuit 142b, so that the transistors 431 and 434 are turned on and a data signal is written to the nodes 435.

When the transistors 431 and 434 are turned off, the pixel circuits 134 in which the data has been written to the nodes 435 are brought into a holding state. The amount of current flowing between the source electrode and the drain electrode of the transistor 232 is controlled in accordance with the potential of the data written to the node 435. The light-emitting element 125 emits light with luminance corresponding to the amount of the flowing current. This operation is sequentially performed row by row; thus, an image can be displayed.

[Example of Pixel Circuit for Liquid Crystal Display Device]

The pixel circuit 134 in FIG. 15C includes the transistor 431 and the capacitor 233. The pixel circuit 134 is electrically connected to a liquid crystal element 432.

The potential of one of a pair of electrodes of the liquid crystal element 432 is set in accordance with the specifications of the pixel circuit 134 as appropriate. The alignment state of the liquid crystal element 432 depends on data written to a node 436. A common potential may be applied to one of the pair of electrodes of the liquid crystal element 432 included in each of the plurality of pixel circuits 134. The potential supplied to one of a pair of electrodes of the liquid crystal element 432 in the pixel circuit 134 in one row may be different from the potential supplied to one of a pair of electrodes of the liquid crystal element 432 in the pixel circuit 134 in another row.

Examples of a method of driving the display device including the liquid crystal element 432 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the method of driving the display device include an electrically controlled birefringence (ECB) mode, a polymer-dispersed liquid crystal (PDLC) mode, a polymer network liquid crystal (PNLC) mode, and a guest-host mode. Note that one embodiment of the present invention is not limited thereto, and various liquid crystal elements and driving methods can be used.

The liquid crystal element 432 may be formed using a liquid crystal composition including a liquid crystal exhibiting a blue phase and a chiral material. The liquid crystal exhibiting a blue phase has a short response time of 1 msec or less and has optical isotropy; thus, an alignment process is not necessary. A liquid crystal exhibiting a blue phase has small viewing angle dependence because the liquid crystal has optical isotropy.

In the pixel circuit 134 in the m-th row and the n-th column, one of the source electrode and the drain electrode of the transistor 431 is electrically connected to the signal line DL_n, and the other of the source electrode and the drain electrode of the transistor 431 is electrically connected to the node 436. The gate electrode of the transistor 431 is electrically connected to the scan line GL_m. The transistor 431 has a function of controlling whether to write a data signal to the node 436.

One of the pair of electrodes of the capacitor 233 is electrically connected to a wiring to which a specific potential is supplied (hereinafter referred to as a capacitor line CL), and the other of the pair of electrodes of the capacitor 233 is electrically connected to the node 436. The other of the pair of electrodes of the liquid crystal element 432 is electrically connected to the node 436. The potential of the capacitor line CL is set in accordance with the specifications of the pixel circuit 134 as appropriate. The capacitor 233 functions as a storage capacitor for storing data written to the node 436.

For example, in the display device including the pixel circuit 134 in FIG. 15C, the pixel circuits 134 are sequentially selected row by row by the driver circuit 142a and/or the driver circuit 142b, so that the transistors 431 are turned on and a data signal is written to the nodes 436.

When the transistors 431 are turned off, the pixel circuits 134 in which the data signal has been written to the nodes 436 are brought into a holding state. This operation is sequentially performed row by row; thus, an image can be displayed on the display region 231.

[Display Element]

The display device of one embodiment of the present invention can employ various modes and can include various display elements. Examples of the display element include a display medium whose contrast, luminance, reflectance, transmittance, or the like is changed by electrical or magnetic effect, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, or a display element using a carbon nanotube. Alternatively, quantum dots may be used as the display element.

Examples of display devices having EL elements include an EL display. Examples of a display device including an electron emitter include a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. For example, the display device may be a plasma display panel (PDP).

In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

This embodiment can be implemented in an appropriate combination with any of the structures described in the other embodiments.

Embodiment 3

In this embodiment, an example of a transistor which can be used instead of the transistor 232 described in the above embodiments is described with reference to drawings. A transistor disclosed in this specification and the like can be applied to the transistors 431, 434, and the like.

The display device 100 of one embodiment of the present invention can be fabricated by using a transistor with any of various structures, such as a bottom-gate transistor, a top-gate transistor, or the like. Therefore, a material for a semiconductor layer or the structure of a transistor can be easily changed depending on the existing production line.

[Bottom-Gate Transistor]

FIG. 16A1 is a cross-sectional view of a transistor 410 that is a channel-protective transistor, which is a type of bottom-gate transistor. In FIG. 16A1, the transistor 410 is formed over a substrate 271. The transistor 410 includes an electrode 246 over the substrate 271 with an insulating layer 272 provided therebetween. The transistor 410 includes a semiconductor layer 242 over the electrode 246 with an insulating layer 226 provided therebetween. The electrode 246 can function as a gate electrode. The insulating layer 226 can function as a gate insulating layer.

The transistor 410 includes an insulating layer 241 over a channel formation region in the semiconductor layer 242. The transistor 410 includes an electrode 244a and an electrode 244b which are partly in contact with the semiconductor layer 242 and over the insulating layer 226. The electrode 244a can function as one of a source electrode and a drain electrode. The electrode 244b can function as the other of the source electrode and the drain electrode. Part of the electrode 244a and part of the electrode 244b are formed over the insulating layer 241.

The insulating layer 241 can function as a channel protective layer. With the insulating layer 241 provided over the channel formation region, the semiconductor layer 242 can be prevented from being exposed at the time of forming the electrodes 244a and 244b. Thus, the channel formation region in the semiconductor layer 242 can be prevented from being etched at the time of forming the electrodes 244a and 244b. In accordance with one embodiment of the present invention, a transistor with favorable electrical characteristics can be provided.

The transistor 410 includes an insulating layer 228 over the electrode 244a, the electrode 244b, and the insulating layer 241 and further includes an insulating layer 229 over the insulating layer 228.

The insulating layer 272 can be formed using a material and a method similar to those of the insulating layers 222 and 205. Note that the insulating layer 272 may be formed of a stack of insulating layers. For example, the semiconductor layer 242 can be formed using a material and a method similar to those of the semiconductor layer 208. Note that the semiconductor layer 242 may be formed of a stack of semiconductor layers. For example, the electrode 246 can be formed using a material and a method similar to those of the electrode 206. Note that the electrode 246 may be formed of a stack of conductive layers. The insulating layer 226 can be formed using a material and a method that are similar to those of the insulating layer 207. Note that the insulating layer 226 may be formed of a stack of insulating layers. For example, the electrodes 244a and 244b can be formed using a material and a method similar to those of the electrode 214 or 215. Note that the electrodes 244a and 244b may be formed of a stack of conductive layers. The insulating layer 241 can be formed using a material and a method that are similar to those of the insulating layer 226. Note that the insulating layer 241 may be formed of a stack of insulating layers. The insulating layer 228 can be formed using a material and a method that are similar to those of the insulating layer 210. Note that the insulating layer 228 may be formed of a stack of insulating layers. The insulating layer 229 can be formed using a material and a method that are similar to those of the insulating layer 211. Note that the insulating layer 229 may be formed of a stack of insulating layers.

The electrode, the semiconductor layer, the insulating layer, and the like used in the transistor disclosed in this embodiment can be formed using a material and a method disclosed in any of the other embodiments.

In the case where an oxide semiconductor is used for the semiconductor layer 242, a material capable of removing oxygen from part of the semiconductor layer 242 to generate oxygen vacancies is preferably used for regions of the electrodes 244a and 244b that are in contact with at least the semiconductor layer 242. The carrier concentration in the regions of the semiconductor layer 242 where oxygen vacancies are generated is increased, so that the regions become n-type regions ($n^+$ layers). Accordingly, the regions can function as a source region and a drain region. When an oxide semiconductor is used for the semiconductor layer 242, examples of the material capable of removing oxygen from the semiconductor layer 242 to generate oxygen vacancies include tungsten and titanium.

Formation of the source region and the drain region in the semiconductor layer 242 makes it possible to reduce contact resistance between the semiconductor layer 242 and each of the electrodes 244a and 244b. Accordingly, the electric characteristics of the transistor, such as the field-effect mobility and the threshold voltage, can be favorable.

In the case where a semiconductor such as silicon is used for the semiconductor layer 242, a layer that functions as an n-type semiconductor or a p-type semiconductor is preferably provided between the semiconductor layer 242 and the electrode 244a and between the semiconductor layer 242 and the electrode 244b. The layer that functions as an n-type semiconductor or a p-type semiconductor can function as the source region or the drain region in the transistor.

The insulating layer 229 is preferably formed using a material that can prevent or reduce diffusion of impurities into the transistor from the outside. The formation of the insulating layer 229 may also be omitted.

When an oxide semiconductor is used for the semiconductor layer 242, heat treatment may be performed before and/or after the insulating layer 229 is formed. The heat treatment can fill oxygen vacancies in the semiconductor layer 242 by diffusing oxygen contained in the insulating layer 229 or other insulating layers into the semiconductor layer 242. Alternatively, the insulating layer 229 may be formed while the heat treatment is performed, so that oxygen vacancies in the semiconductor layer 242 can be filled.

Note that a CVD method can be generally classified into a plasma enhanced CVD (PECVD) method using plasma, a thermal CVD (TCVD) method using heat, and the like. A CVD method can further be classified into a metal CVD (MCVD) method, a metal organic CVD (MOCVD) method, and the like according to a source gas to be used.

Furthermore, an evaporation method can be generally classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using a PECVD method, a high-quality film can be formed at a relatively low temperature. By using a deposition method that does not use plasma for deposition, such as an MOCVD method or an evaporation method, a film with few defects can be formed because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In a facing-target sputtering method, plasma is confined between targets; thus, plasma damage to a substrate can be reduced. Furthermore, step coverage can be improved because the incident angle of a sputtered particle to a substrate can be made smaller depending on the inclination of a target.

A transistor 411 illustrated in FIG. 16A2 is different from the transistor 410 in that an electrode 223 that can function as a back gate electrode is provided over the insulating layer 229. The electrode 223 can be formed using a material and a method similar to those of the electrode 246.

In general, a back gate electrode is formed using a conductive layer and positioned so that a channel formation region of a semiconductor layer is positioned between a gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The electrode 246 and the electrode 223 can each function as a gate electrode. Thus, the insulating layers 226, 228, and 229 can each function as a gate insulating layer. The electrode 223 may also be provided between the insulating layers 228 and 229.

In the case where one of the electrode 246 and the electrode 223 is simply referred to as a "gate electrode", the other can be referred to as a "back gate electrode". For example, in the transistor 411, in the case where the electrode 223 is referred to as a "gate electrode", the electrode 246 is referred to as a "back gate electrode". In the case where the electrode 223 is used as a "gate electrode", the transistor 411 is a kind of top-gate transistor. Alternatively, one of the electrode 246 and the electrode 223 may be referred to as a "first gate electrode", and the other may be referred to as a "second gate electrode".

By providing the electrode 246 and the electrode 223 with the semiconductor layer 242 provided therebetween and setting the potentials of the electrode 246 and the electrode 223 to be the same, a region of the semiconductor layer 242 through which carriers flow is enlarged in the film thickness direction; thus, the number of transferred carriers is increased. As a result, the on-state current and field-effect mobility of the transistor 411 are increased.

Therefore, the transistor 411 has a comparatively high on-state current for its area. That is, the area of the transistor 411 can be small for a required on-state current. In accordance with one embodiment of the present invention, the area of a transistor can be reduced. Therefore, in accordance with one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrode 246 and the electrode 223 each have a function of blocking an electric field generated outside, electric charge of charged particles and the like generated on the insulating layer 272 side or above the electrode 223 do not influence the channel formation region in the semiconductor layer 242. Thus, degradation by a stress test (e.g., a negative gate bias temperature (−GBT) stress test in which negative electric charge is applied to a gate) can be reduced. Furthermore, a change in gate voltage (rising voltage) at which on-state current starts flowing depending on drain voltage can be reduced. Note that this effect is obtained when the electrodes 246 and 223 have the same potential or different potentials.

The BT stress test is one kind of acceleration test and can evaluate, in a short time, a change by long-term use (i.e., a change over time) in characteristics of a transistor. In particular, the amount of change in threshold voltage of a transistor before and after the BT stress test is an important indicator when examining the reliability of the transistor. As the change in the threshold voltage is smaller, the transistor has higher reliability.

By providing the electrodes 246 and 223 and setting the potentials of the electrodes 246 and 223 to be the same, the amount of change in threshold voltage is reduced. Accordingly, variations in electrical characteristics among a plurality of transistors are also reduced.

A transistor including a back gate electrode has a smaller change in threshold voltage before and after a positive GBT stress test, in which positive electric charge is applied to a gate, than a transistor including no back gate electrode.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

In accordance with one embodiment of the present invention, a transistor with high reliability can be provided. Moreover, a semiconductor device with high reliability can be provided.

FIG. 16B1 is a cross-sectional view of a channel-protective transistor 420 that is a type of bottom-gate transistor. The transistor 420 has substantially the same structure as the transistor 410 but is different from the transistor 410 in that the insulating layer 241 covers the semiconductor layer 242. The semiconductor layer 242 is electrically connected to the electrode 244a through an opening formed by selectively removing part of the insulating layer 241 which overlaps with the semiconductor layer 242. The semiconductor layer 242 is electrically connected to the electrode 244b through another opening formed by selectively removing part of the insulating layer 241 which overlaps with the semiconductor layer 242. A region of the insulating layer 241 which overlaps with the channel formation region can function as a channel protective layer.

A transistor 421 illustrated in FIG. 16B2 is different from the transistor 420 in that the electrode 223 that can function as a back gate electrode is provided over the insulating layer 229.

With the insulating layer 241, the semiconductor layer 242 can be prevented from being exposed at the time of forming the electrodes 244a and 244b. Thus, the semiconductor layer 242 can be prevented from being reduced in thickness at the time of forming the electrodes 244a and 244b.

The length between the electrode 244a and the electrode 246 and the length between the electrode 244b and the electrode 246 in the transistors 420 and 421 are larger than those in the transistors 410 and 411. Thus, the parasitic capacitance generated between the electrode 244a and the electrode 246 can be reduced. Moreover, the parasitic capacitance generated between the electrode 244b and the electrode 246 can be reduced. In accordance with one embodiment of the present invention, a transistor with favorable electrical characteristics can be provided.

A transistor 425 illustrated in FIG. 16C1 is a channel-etched transistor that is a type of bottom-gate transistor. In the transistor 425, the electrodes 244a and 244b are formed without providing the insulating layer 241. Thus, part of the semiconductor layer 242 that is exposed at the time forming the electrodes 244a and 244b is etched in some cases. However, since the insulating layer 241 is not provided, the productivity of the transistor can be increased.

A transistor 420 illustrated in FIG. 16C2 is different from the transistor 425 in that the electrode 223 which can function as a back gate electrode is provided over the insulating layer 229.

[Top-Gate Transistor]

FIG. 17A1 is a cross-sectional view of a transistor 430 that is a type of top-gate transistor. The transistor 430 includes the semiconductor layer 242 over the insulating layer 272, the electrodes 244a and 244b that are over the semiconductor layer 242 and the insulating layer 272 and in contact with part of the semiconductor layer 242, the insulating layer 226 over the semiconductor layer 242 and the electrodes 244a and 244b, and the electrode 246 over the insulating layer 226.

Since the electrode 246 overlaps with neither the electrode 244a nor the electrode 244b in the transistor 430, the parasitic capacitance generated between the electrodes 246 and 244a and the parasitic capacitance generated between the electrodes 246 and 244b can be reduced. After the formation of the electrode 246, an impurity 255 is introduced into the semiconductor layer 242 using the electrode 246 as a mask, so that an impurity region can be formed in the semiconductor layer 242 in a self-aligned manner (see FIG. 17A3). In accordance with one embodiment of the present invention, a transistor with favorable electrical characteristics can be provided.

The introduction of the impurity 255 can be performed with an ion implantation apparatus, an ion doping apparatus, or a plasma treatment apparatus.

As the impurity 255, for example, at least one kind of element of Group 13 elements and Group 15 elements can be used. In the case where an oxide semiconductor is used for the semiconductor layer 242, it is possible to use at least one kind of element of a rare gas, hydrogen, and nitrogen as the impurity 255.

A transistor 431 illustrated in FIG. 17A2 is different from the transistor 430 in that the electrode 223 and the insulating layer 227 are included. The transistor 431 includes the electrode 223 formed over the insulating layer 272 and the insulating layer 227 formed over the electrode 223. The electrode 223 can function as a back gate electrode. Thus, the insulating layer 227 can function as a gate insulating layer. The insulating layer 227 can be formed using a material and a method similar to those of the insulating layer 226.

Like the transistor 411, the transistor 431 has a high on-state current for its area. That is, the area of the transistor 431 can be small for a required on-state current. In accordance with one embodiment of the present invention, the area of a transistor can be reduced. Therefore, in accordance with one embodiment of the present invention, a semiconductor device having a high degree of integration can be provided.

A transistor 440 illustrated in FIG. 17B1 is a type of top-gate transistor. The transistor 440 is different from the transistor 430 in that the semiconductor layer 242 is formed after the formation of the electrodes 244a and 244b. A transistor 441 illustrated in FIG. 17B2 is different from the transistor 440 in that the electrode 223 and the insulating layer 227 are included. In the transistors 440 and 441, part of the semiconductor layer 242 is formed over the electrode 244a and another part of the semiconductor layer 242 is formed over the electrode 244b.

Like the transistor 411, the transistor 441 has a high on-state current for its area. That is, the area of the transistor 441 can be small for a required on-state current. In accordance with one embodiment of the present invention, the area of a transistor can be reduced. Therefore, in accordance with one embodiment of the present invention, a semiconductor device having a high degree of integration can be provided.

A transistor 442 illustrated in FIG. 18A1 is a type of top-gate transistor. The transistor 442 is different from the transistor 430 or 440 in that the electrodes 244a and 244b are formed after the formation of the insulating layer 229. The electrodes 244a and 244b are electrically connected to the semiconductor layer 242 through openings formed in the insulating layers 228 and 229.

Part of the insulating layer 226 that does not overlap with the electrode 246 is removed, and the impurity 255 is introduced into the semiconductor layer 242 using the electrode 246 and the insulating layer 226 that is left as a mask, so that an impurity region can be formed in the semiconductor layer 242 in a self-aligned manner (see FIG. 18A3). The transistor 442 includes a region where the insulating layer 226 extends beyond an end portion of the electrode 246. The semiconductor layer 242 in a region into which the impurity 255 is introduced through the insulating layer 226 has a lower impurity concentration than the semiconductor layer 242 in a region into which the impurity 255 is introduced without through the insulating layer 226. Thus, a lightly doped drain (LDD) region is formed in a region adjacent to a region of the semiconductor layer 242 which overlaps with the electrode 246.

A transistor 443 illustrated in FIG. 18A2 is different from the transistor 442 in that the electrode 223 is included. The transistor 443 includes the electrode 223 that is formed over the substrate 271 and overlaps with the semiconductor layer 242 with the insulating layer 272 provided therebetween. The electrode 223 can function as a back gate electrode.

As in a transistor 444 illustrated in FIG. 18B1 and a transistor 445 illustrated in FIG. 18B2, the insulating layer 226 in a region that does not overlap with the electrode 246 may be completely removed. Alternatively, as in a transistor 446 illustrated in FIG. 18C1 and a transistor 447 illustrated in FIG. 18C2, the insulating layer 226 may be left.

In the transistors 442 to 447, after the formation of the electrode 246, the impurity 255 is introduced into the semiconductor layer 242 using the electrode 246 as a mask, so that an impurity region can be formed in the semiconductor layer 242 in a self-aligned manner. In accordance with one embodiment of the present invention, a transistor with favorable electrical characteristics can be provided. Furthermore, in accordance with one embodiment of the present invention, a semiconductor device having a high degree of integration can be provided.

[S-Channel Transistor]

Figure 19A:
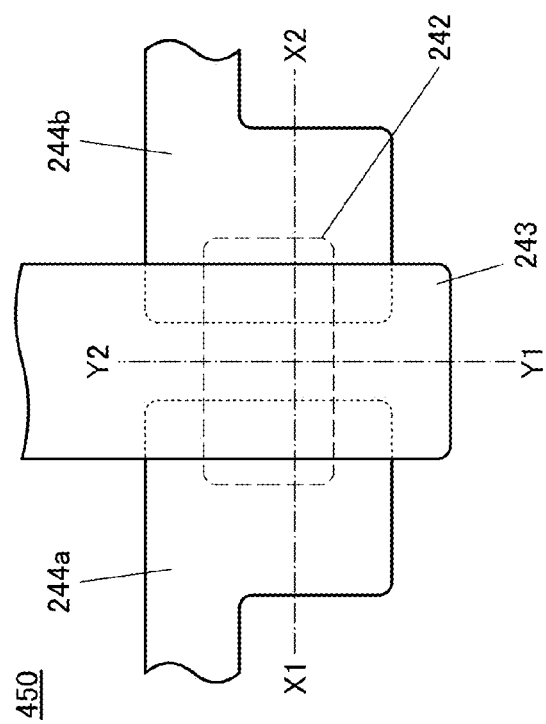
FIGS. 19A to 19C are a plan view and cross-sectional views illustrating one mode of a transistor.
Figure 19B:
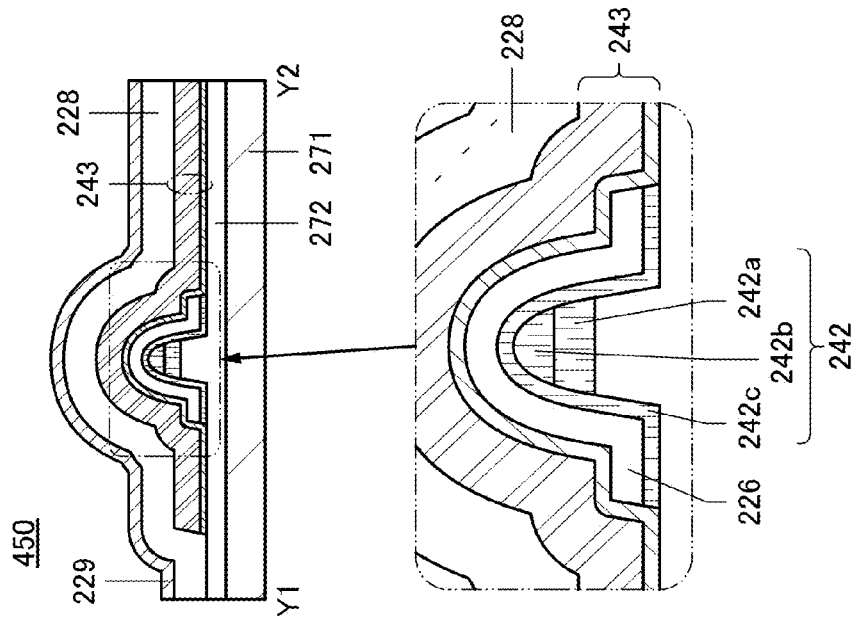
Figure 19C:
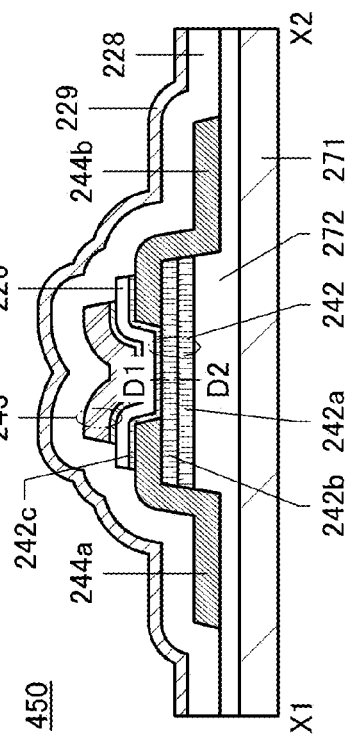

FIGS. 19A to 19C illustrate an example of the structure of a transistor using an oxide semiconductor for the semiconductor layer 242. In a transistor 450 illustrated in FIGS. 19A to 19C, a semiconductor layer 242b is formed over a semiconductor layer 242a, and a semiconductor layer 242c covers a top surface and a side surface of the semiconductor layer 242b and a side surface of the semiconductor layer 242a. FIG. 19A is a top view of the transistor 450. FIG. 19B is a cross-sectional view (in the channel length direction) taken along the dashed-dotted line X1-X2 in FIG. 19A. FIG. 19C is a cross-sectional view (in the channel width direction) taken along the dashed-dotted line Y1-Y2 in FIG. 19A.

The transistor 450 includes the electrode 243 functioning as a gate electrode. The electrode 243 can be formed using a material and a method similar to those of the electrode 246. The electrode 243 is formed of two conductive layers in this embodiment.

Each of the semiconductor layer 242a, the semiconductor layer 242b, and the semiconductor layer 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M and Zn). The element M is one or more kinds of elements selected from Al, Ti, Ga, Y, Zr, La, Ce, Nd, and Hf and has a higher strength of bonding with oxygen than that of In.

The semiconductor layer 242a and the semiconductor layer 242c are preferably formed using a material containing one or more kinds of metal elements contained in the semiconductor layer 242b. With the use of such a material, interface states are less likely to be generated at the interface between the semiconductor layer 242a and the semiconductor layer 242b and at the interface between the semiconductor layer 242c and the semiconductor layer 242b. Accordingly, carriers are not likely to be scattered or captured at the interfaces, which results in an improvement in field-effect mobility of the transistor. Furthermore, variation in threshold voltage of the transistor can be reduced. Thus, a semiconductor device having favorable electrical characteristics can be obtained.

Each of the thicknesses of the semiconductor layers 242a and 242c is greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, more preferably greater than or equal to 3 nm and less than or equal to 50 nm.

In the case where the semiconductor layer 242b includes an In-M-Zn oxide and the semiconductor layers 242a and 242c each also include an In-M-Zn oxide, the semiconductor layers 242a and 242c each have the atomic ratio where In:M:Zn=$x_1$:$y_1$:$z_1$, and the semiconductor layer 242b has an atomic ratio where In:M:Zn=$x_2$:$y_2$:$z_2$, for example. In that case, the compositions of the semiconductor layers 242a, 242c, and 242b can be determined so that $y_1/x_1$ is larger than $y_2/x_2$. It is preferable that the compositions of the semiconductor layers 242a, 242c, and 242b be determined so that $y_1/x_1$ is 1.5 times or more as large as $y_2/x_2$. It is more preferable that the compositions of the semiconductor layers 242a, 242c, and 242b be determined so that $y_1/x_1$ is twice or more as large as $y_2/x_2$. It is more preferable that the compositions of the semiconductor layers 242a, 242c, and 242b be determined so that $y_1/x_1$ is three times or more as large as $y_2/x_2$. It is preferable that $y_1$ be greater than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$. When the semiconductor layer 242a and the semiconductor layer 242c have the above compositions, the semiconductor layer 242a and the semiconductor layer 242c can each be a layer in which oxygen vacancies are less likely to be generated than in the semiconductor layer 242b.

In the case where the semiconductor layer 242a and the semiconductor layer 242c each include an In-M-Zn oxide, the percentages of In and the element M, not taking Zn and O into consideration, are preferably as follows: the percentage of In is lower than 50 atomic % and the percentage of the element M is higher than or equal to 50 atomic %. The percentages of In and the element M are more preferably as follows: the percentage of In is lower than 25 atomic % and the percentage of the element M is higher than or equal to 75 atomic %. In the case where the semiconductor layer 242b includes an In-M-Zn oxide, the percentages of In and the element M not taking Zn and O into consideration, are preferably as follows: the percentage of In is higher than or equal to 25 atomic % and the percentage of the element M is lower than 75 atomic %. The percentages of In and the element M are more preferably as follows: the percentage of In is higher than or equal to 34 atomic % and the percentage of the element M is lower than 66 atomic %.

For example, an In—Ga—Zn oxide that is formed using a target having an atomic ratio of In:Ga:Zn=1:3:2, 1:3:4, 1:3:6, 1:6:4, or 1:9:6, an In—Ga oxide that is formed using a target having an atomic ratio of In:Ga=1:9, or gallium oxide can be used for each of the semiconductor layers 242a and 242c containing In or Ga. Furthermore, an In—Ga—Zn oxide that is formed using a target having an atomic ratio of In:Ga:Zn=3:1:2, 1:1:1, 5:5:6, or 4:2:4.1 can be used for the semiconductor layer 242b. Note that the atomic ratio of each of the semiconductor layers 242a, 242b, and 242c may vary within a range of ±20% of any of the above-described atomic ratios as an error.

To give stable electrical characteristics to the transistor including the semiconductor layer 242b, it is preferable that impurities and oxygen vacancies in the semiconductor layer 242b be reduced to obtain a highly purified oxide semiconductor layer and accordingly the semiconductor layer 242b can be regarded as an intrinsic or substantially intrinsic oxide semiconductor layer. Furthermore, it is preferable that at least the channel formation region of the semiconductor layer 242b be regarded as an intrinsic or substantially intrinsic oxide semiconductor layer.

Note that the substantially intrinsic oxide semiconductor layer refers to an oxide semiconductor layer in which the carrier density is higher than or equal to $1\times10^{-9}$/cm$^3$ and lower than $8\times10^{11}$/cm$^3$, preferably lower than $1\times10^{11}$/cm$^3$, more preferably lower than $1\times10^{10}$/cm$^3$.

FIGS. 20A to 20C illustrate an example of the structure of a transistor using an oxide semiconductor for the semiconductor layer 242. In a transistor 422 illustrated in FIGS. 20A to 20C, the semiconductor layer 242b is formed over the semiconductor layer 242a. The transistor 422 is a kind of bottom-gate transistor including a back gate electrode. FIG. 20A is a top view of the transistor 422. FIG. 20B is a cross-sectional view (in the channel length direction) taken along the dashed-dotted line X1-X2 in FIG. 20A. FIG. 20C is a cross-sectional view (in the channel width direction) taken along the dashed-dotted line Y1-Y2 in FIG. 20A.

The electrode 223 provided over the insulating layer 229 is electrically connected to the electrode 246 through an opening 247a and an opening 247b provided in the insulating layers 226, 228, and 229. Thus, the same potential is supplied to the electrodes 223 and 246. Furthermore, either or both of the openings 247a and 247b may be omitted. In the case where both the openings 247a and 247b are omitted, different potentials can be supplied to the electrodes 223 and 246.

[Energy Band Structure of Oxide Semiconductor]

Figure 24A:
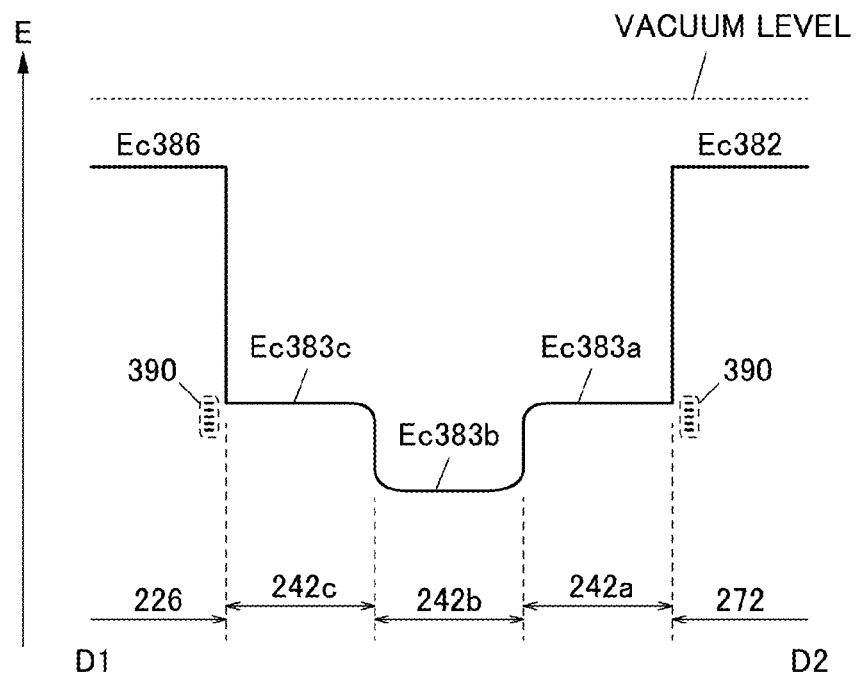
FIGS. 24A and 24B show energy band structures.
Figure 24B:
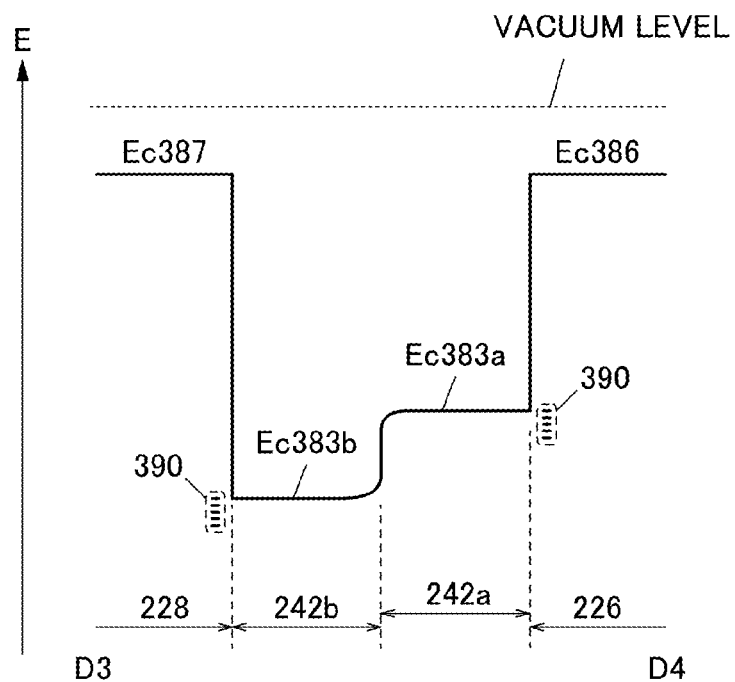

The function and effect of the semiconductor layer 242 that is a stacked layer including the semiconductor layers 242a, 242b, and 242c are described with an energy band structure diagram shown in FIGS. 24A and 24B. FIG. 24A is the energy band structure diagram showing a portion along the dashed-dotted line D1-D2 in FIG. 19B. FIG. 24A illustrates the energy band structure of a channel formation region of the transistor 450.

In FIG. 24A, Ec382, Ec383a, Ec383b, Ec383c, and Ec386 indicate the energy of the conduction band minimum of the insulating layer 272, the semiconductor layer 242a, the semiconductor layer 242b, the semiconductor layer 242c, and the insulating layer 226, respectively.

Here, a difference in energy between the vacuum level and the conduction band minimum (the difference is also referred to as "electron affinity") corresponds to a value obtained by subtracting an energy gap from a difference in energy between the vacuum level and the valence band maximum (the difference is also referred to as an ionization potential). Note that the energy gap can be measured with a spectroscopic ellipsometer (e.g., UT-300 by HORIBA JOBIN YVON S.A.S.). The energy difference between the vacuum level and the valence band maximum can be measured with an ultraviolet photoelectron spectroscopy (UPS) device (e.g., VersaProbe by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 272 and the insulating layer 226 are insulators, Ec382 and Ec386 are closer to the vacuum level (have a smaller electron affinity) than Ec383a, Ec383b, and Ec383c.

Ec383a is closer to the vacuum level than Ec383b. Specifically, Ec383a is preferably closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Ec383c is closer to the vacuum level than Ec383b. Specifically, Ec383c is preferably closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of the interface between the semiconductor layer 242a and the semiconductor layer 242b and the vicinity of the interface between the semiconductor layer 242b and the semiconductor layer 242c, mixed regions are formed; thus, the energy of the conduction band minimum continuously changes. In other words, no state or few states exist at these interfaces.

Accordingly, electrons transfer mainly through the semiconductor layer 242b in the stacked-layer structure having the above energy band structure. Therefore, even when states exist at the interface between the semiconductor layer 242a and the insulating layer 272 or at the interface between the semiconductor layer 242c and the insulating layer 226, the states hardly influence the transfer of the electrons. In addition, the states do not exist or hardly exist at the interface between the semiconductor layer 242a and the semiconductor layer 242b and at the interface between the semiconductor layer 242c and the semiconductor layer 242b; thus, transfer of electrons is not prohibited in the regions. Consequently, a high field-effect mobility can be obtained in the transistor having the stacked-layer structure of the above oxide semiconductors.

Note that although trap states 390 due to impurities or defects might be formed in the vicinity of the interface between the semiconductor layer 242a and the insulating layer 272 and in the vicinity of the interface between the semiconductor layer 242c and the insulating layer 226 as shown in FIG. 24A, the semiconductor layer 242b can be apart from the trap states owing to the existence of the semiconductor layer 242a and the semiconductor layer 242c.

In particular, in the transistor described in this embodiment, an upper surface and a side surface of the semiconductor layer 242b are in contact with the semiconductor layer 242c, and a lower surface of the semiconductor layer 242b is in contact with the semiconductor layer 242a. In this manner, the semiconductor layer 242b is covered by the semiconductor layers 242a and 242c, whereby the influence of the trap states can further be reduced.

Note that in the case where the energy difference between Ec383a and Ec383b or between Ec383c and E383b is small, electrons in the semiconductor layer 242b might reach the trap states by passing over the energy difference. The electrons are captured by the trap states, which generates negative fixed electric charge at the interface with the insulating layer, causing the threshold voltage of the transistor to be shifted in the positive direction.

Therefore, each of the energy differences between Ec383a and Ec383b and between Ec383c and Ec383b is set to be greater than or equal to 0.1 eV, preferably greater than or equal to 0.15 eV, in which case a variation in the threshold voltage of the transistor can be reduced and the transistor can have favorable electrical characteristics.

Each of the band gaps of the semiconductor layer 242a and the semiconductor layer 242c is preferably wider than that of the semiconductor layer 242b.

FIG. 24B is the energy band structure diagram showing a portion along the dashed-dotted line D3-D4 in FIG. 20B. FIG. 24B shows the energy band structure of a channel formation region of the transistor 422.

In FIG. 24B, Ec387 represents the energy of the conduction band minimum of the insulating layer 228. The semiconductor layer 242 is formed using two layers, the semiconductor layers 242a and 242b; thus, the transistor can be manufactured with improved productivity. Since the semiconductor layer 242c is not provided, the transistor including the two semiconductor layers is easily affected by the trap states 390 but can have a higher field-effect mobility than a transistor including one semiconductor layer as the semiconductor layer 242.

In accordance with one embodiment of the present invention, a transistor with a small variation in electrical characteristics can be provided. Accordingly, a semiconductor device with a small variation in electrical characteristics can be provided. In accordance with one embodiment of the present invention, a transistor with high reliability can be provided. Accordingly, a semiconductor device with high reliability can be provided.

An oxide semiconductor has an energy gap as wide as 3.0 eV or more and a high visible-light transmissivity. In a transistor obtained by processing an oxide semiconductor under appropriate conditions, the off-state current at ambient temperature (e.g., 25° C.) can be lower than or equal to 100 zA ($1\times10^{-19}$ A), lower than or equal to 10 zA ($1\times10^{-20}$ A), and further lower than or equal to 1 zA ($1\times10^{-21}$ A). Therefore, a semiconductor device with low power consumption can be achieved.

In accordance with one embodiment of the present invention, a transistor with low power consumption can be provided. Accordingly, a display element or a semiconductor device such as a display device with low power consumption can be provided. Moreover, a display element or a semiconductor device such as a display device with high reliability can be provided.

The transistor 450 illustrated in FIGS. 19A to 19C is described again. When the semiconductor layer 242b is provided over the projection of the insulating layer 272, the side surface of the semiconductor layer 242b can also be covered with the electrode 243. Thus, the transistor 450 has a structure in which the semiconductor layer 242b can be electrically surrounded by an electric field of the electrode 243. Such a structure of a transistor in which a semiconductor layer in which a channel is formed is electrically surrounded by an electric field of a conductive film is called a surrounded channel (s-channel) structure. A transistor with an s-channel structure is referred to as an s-channel transistor.

In an s-channel structure, a channel can be formed in the whole (bulk) of the semiconductor layer 242b. In an s-channel structure, the drain current of the transistor can be increased, so that a larger amount of on-state current can be obtained. Furthermore, the entire channel formation region of the semiconductor layer 242b can be depleted by an electric field of the electrode 243. Accordingly, the off-state current of the transistor with an s-channel structure can further be reduced.

When the projection of the insulating layer 272 is increased in height and the channel width is shortened, the effects of an s-channel structure to increase the on-state current and reduce the off-state current can be enhanced. Part of the semiconductor layer 242a exposed at the time of forming the semiconductor layer 242b may be removed. In that case, the side surfaces of the semiconductor layer 242a and the semiconductor layer 242b may be aligned with each other.

Figure 21C:
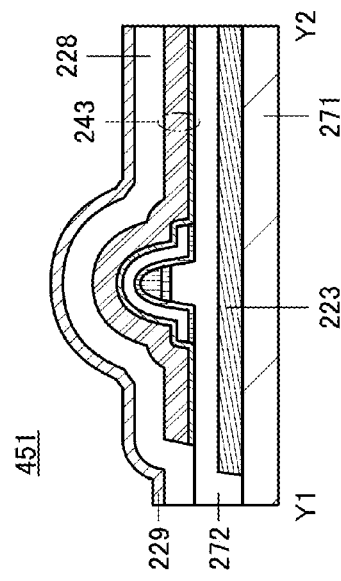
FIGS. 21A to 21C are a plan view and cross-sectional views illustrating one mode of a transistor.
Figure 21A:
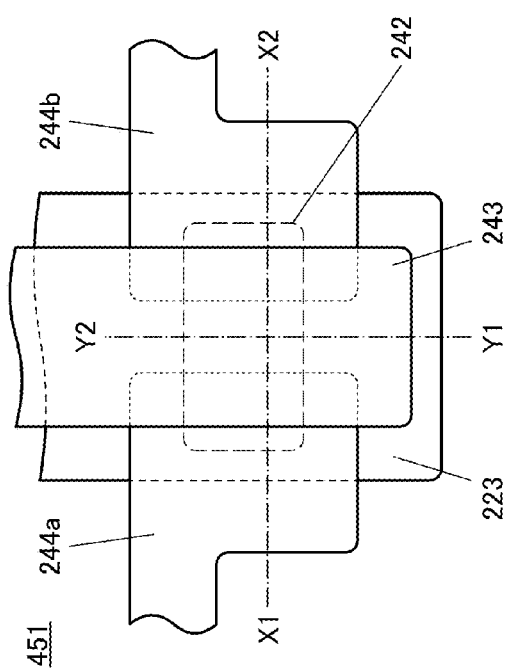
Figure 21B:
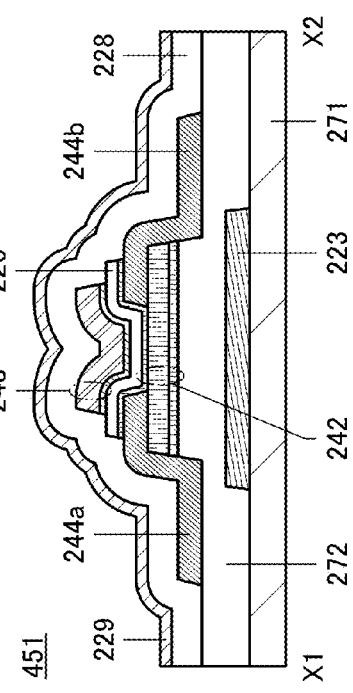

As in a transistor 451 illustrated in FIGS. 21A to 21C, the electrode 223 may be provided below the semiconductor layer 242 with an insulating layer provided therebetween. FIG. 21A is a top view of the transistor 251. FIG. 21B is a cross-sectional view taken along the dashed-dotted line X1-X2 in FIG. 21A. FIG. 21C is a cross-sectional view taken along the dashed-dotted line Y1-Y2 in FIG. 21A.

As in a transistor 452 illustrated in FIGS. 22A to 22C, an insulating layer 275 may be provided over the electrode 243, and a layer 225 may be provided over the insulating layer 275. FIG. 22A is a top view of the transistor 452. FIG. 22B is a cross-sectional view taken along the dashed-dotted line X1-X2 in FIG. 22A. FIG. 22C is a cross-sectional view taken along the dashed-dotted line Y1-Y2 in FIG. 22A.

Although the layer 225 is provided over the insulating layer 275 in FIGS. 22A to 22C, the layer 225 may be provided over the insulating layer 228 or 229. The layer 225 formed using a material with a light-blocking property can prevent a variation in characteristics, a decrease in reliability, or the like of the transistor caused by light irradiation. When the layer 225 is formed at least larger than the semiconductor layer 242b such that the semiconductor layer 242b is covered with the layer 225, the above effects can be improved. The layer 225 can be formed using an organic material, an inorganic material, or a metal material. In the case where the layer 225 is formed using a conductive material, voltage can be supplied to the layer 225 or the layer 225 may be brought into an electrically floating state.

FIGS. 23A to 23C illustrate an example of a transistor with an s-channel structure. A transistor 448 illustrated in FIGS. 23A to 23C has almost the same structure as the transistor 447. In the transistor 448, the semiconductor layer 242 is formed over a projection of the insulating layer 272. The transistor 448 is a type of top-gate transistor including a back gate electrode. FIG. 23A is a top view of the transistor 448. FIG. 23B is a cross-sectional view taken along the dashed-dotted line X1-X2 in FIG. 23A. FIG. 23C is a cross-sectional view taken along the dashed-dotted line Y1-Y2 in FIG. 23A.

The electrode 244a provided over the insulating layer 229 is electrically connected to the semiconductor layer 242 through an opening 247c formed in the insulating layers 226, 228, and 229. The electrode 244b provided over the insulating layer 229 is electrically connected to the semiconductor layer 242 through an opening 247d formed in the insulating layers 226, 228, and 229.

The electrode 243 provided over the insulating layer 226 is electrically connected to the electrode 223 through an opening 247a and an opening 247b formed in the insulating layers 226 and 272. Accordingly, the same potential is supplied to the electrodes 246 and 223. Furthermore, either or both of the openings 247a and 247b may be omitted. In the case where both the openings 247a and 247b are omitted, different potentials can be supplied to the electrodes 223 and 246.

Note that the semiconductor layer in the transistor with an s-channel structure is not limited to include an oxide semiconductor.

This embodiment can be implemented in an appropriate combination with any of the structures described in the other embodiments.

Embodiment 4

In this embodiment, structure examples of a light-emitting element that can be used as the light-emitting element 125 will be described. Note that an EL layer 320 described in this embodiment corresponds to the EL layer 117 described in the other embodiments.

<Structure of Light-Emitting Element>

Figure 25A:
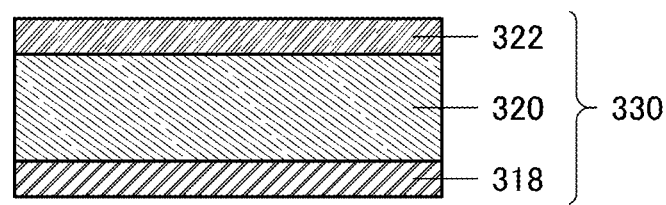
FIGS. 25A and 25B each illustrate a structure example of a light-emitting element.

In a light-emitting element 330 illustrated in FIG. 25A, the EL layer 320 is sandwiched between a pair of electrodes (electrodes 318 and 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, and an electron-injection layer can be used in appropriate combination.

The light-emitting element 330 illustrated in FIG. 25A emits light when current flows by applying a potential difference between the electrode 318 and the electrode 322 and holes and electrons are recombined in the EL layer 320. In other words, a light-emitting region is formed in the EL layer 320.

In one embodiment of the present invention, light emitted from the light-emitting element 330 is extracted to the outside from the electrode 318 side or the electrode 322 side. Thus, one of the electrodes 318 and 322 is formed using a light-transmitting substance.

Figure 25B:
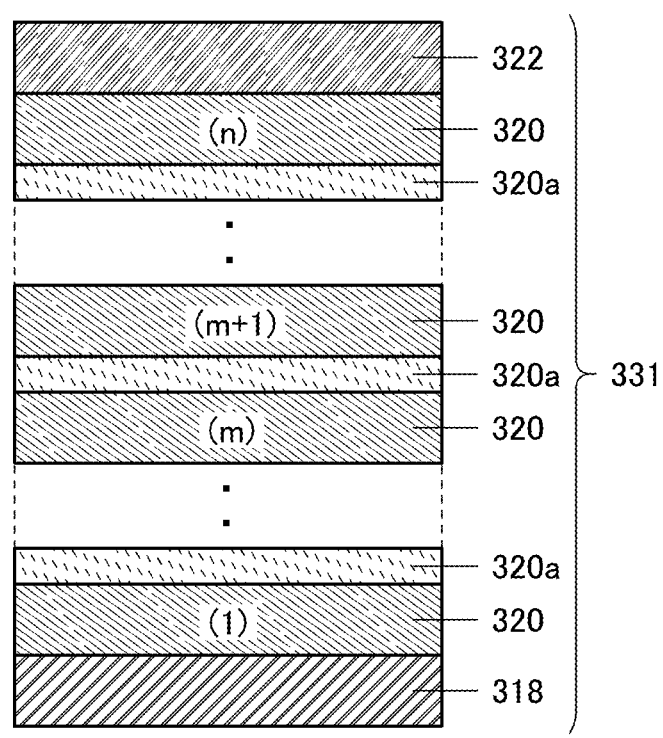

Note that a plurality of EL layers 320 may be stacked between the electrode 318 and the electrode 322 as in a light-emitting element 331 illustrated in FIG. 25B. In the case where n (n is a natural number of 2 or more) layers are stacked, an charge generation layer 320a is preferably provided between an m-th EL layer 320 and an (m+1)-th EL layer 320.

The charge generation layer 320a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, and tungsten oxide. As the organic compound, a variety of compounds can be used; for example, low molecular compounds such as an aromatic amine compound, a carbazole derivative, and aromatic hydrocarbon and oligomers, dendrimers, and polymers of these low molecular compounds. As the organic compound, it is preferable to use the organic compound which has a hole-transport property and has a hole mobility of $10^{-6}$ cm$^2$/Vs or higher. However, substances other than the substances given above may also be used as long as the substances have hole-transport properties higher than electron-transport properties. These materials used for the charge generation layer 320a have excellent carrier-injection properties and carrier-transport properties; thus, the light-emitting element 330 can be driven with low current and with low voltage.

Note that the charge generation layer 320a may be formed by a combination of a composite material of an organic compound and a metal oxide with another material. For example, the charge generation layer 320a may be formed by a combination of a layer containing the composite material of an organic compound and a metal oxide with a layer containing one compound selected from electron-donating substances and a compound having a high electron-transport property. Furthermore, the charge generation layer 320a may be formed by a combination of a layer containing the composite material of an organic compound and a metal oxide with a transparent conductive film.

The light-emitting element 331 having such a structure is unlikely to suffer the problem of energy transfer, quenching, or the like and has an expanded choice of materials, and thus can easily have both high emission efficiency and a long lifetime. Moreover, it is easy to obtain phosphorescence from one light-emitting layer and fluorescence from the other light-emitting layer.

The charge generation layer 320a has a function of injecting holes to one of the EL layers 320 that is in contact with the charge generation layer 320a and a function of injecting electrons to the other EL layer 320 that is in contact with the charge generation layer 320a, when voltage is applied to the electrodes 318 and 322.

The light-emitting element 331 illustrated in FIG. 25B can provide a variety of emission colors by changing the type of the light-emitting substance used for the EL layers 320. In addition, a plurality of light-emitting substances having different emission colors may be used as the light-emitting substances, so that light emission having a broad spectrum or white light emission can be obtained.

In the case of obtaining white light emission using the light-emitting element 331 illustrated in FIG. 25B, as for the combination of a plurality of EL layers, a structure for emitting white light including red light, green light, and blue light may be used; for example, the structure may include a light-emitting layer containing a blue fluorescent substance as a light-emitting substance and a light-emitting layer containing red and green phosphorescent substances as light-emitting substances. Alternatively, a structure including a light-emitting layer emitting red light, a light-emitting layer emitting green light, and a light-emitting layer emitting blue light may be employed. Further alternatively, with a structure including light-emitting layers emitting light of complementary colors, white light emission can be obtained. In a stacked-layer element including two light-emitting layers in which light emitted from one of the light-emitting layers and light emitted from the other light-emitting layer have complementary colors to each other, the combinations of colors are as follows: blue and yellow, blue-green and red, and the like.

Note that in the structure of the above-described stacked-layer element, by providing the charge generation layer between the stacked light-emitting layers, the element can have a long lifetime in a high-luminance region while keeping the current density low. In addition, the voltage drop due to the resistance of the electrode material can be reduced, whereby uniform light emission in a large area is possible.

This embodiment can be implemented in an appropriate combination with any of the structures described in the other embodiments.

Embodiment 5

A structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

[CAAC-OS]

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 26A:
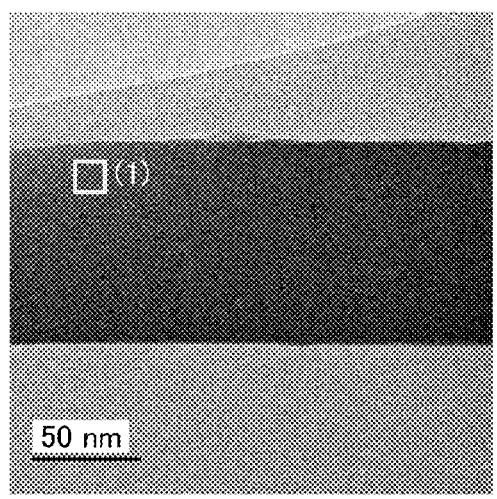
FIGS. 26A to 26D are Cs-corrected high-resolution TEM images of a cross section of a CAAC-OS and a cross-sectional schematic view of the CAAC-OS.

A CAAC-OS observed with TEM will be described below. FIG. 26A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 26B:
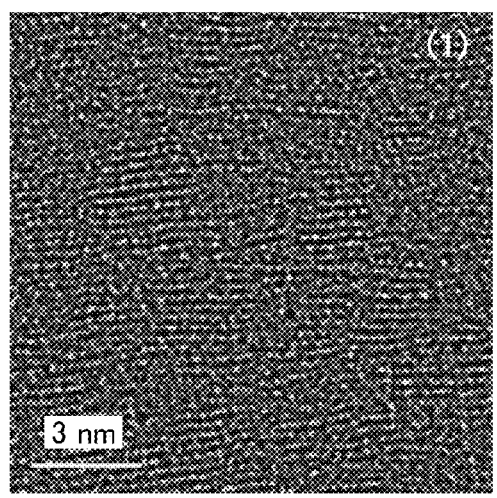

FIG. 26B is an enlarged Cs-corrected high-resolution TEM image of a region (1) in FIG. 26A. FIG. 26B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS film, and is arranged parallel to the formation surface or the top surface of the CAAC-OS film.

Figure 26C:
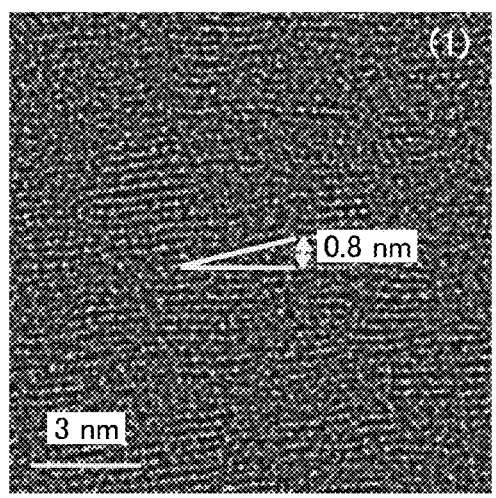

As shown in FIG. 26B, the CAAC-OS has a characteristic atomic arrangement. The characteristic atomic arrangement is denoted by an auxiliary line in FIG. 26C. FIGS. 26B and 26C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 26D:
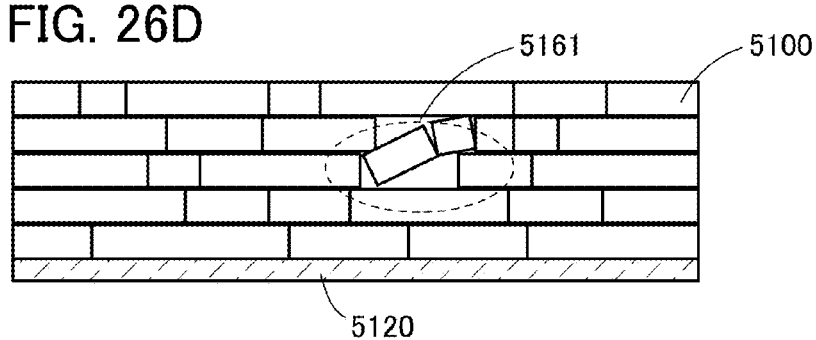

Here, according to the Cs-corrected high-resolution TEM images, the schematic arrangement of pellets 5100 of a CAAC-OS over a substrate 5120 is illustrated by such a structure in which bricks or blocks are stacked (see FIG. 26D). The part in which the pellets are tilted as observed in FIG. 26C corresponds to a region 5161 shown in FIG. 26D.

FIG. 27A shows a Cs-corrected high-resolution TEM image of a plane of the CAAC-OS observed from a direction substantially perpendicular to the sample surface. FIGS. 27B, 27C, and 27D are enlarged Cs-corrected high-resolution TEM images of regions (1), (2), and (3) in FIG. 27A, respectively. FIGS. 27B, 27C, and 27D indicate that metal atoms are arranged in a triangular, quadrangular, or hexagonal configuration in a pellet. However, there is no regularity of arrangement of metal atoms between different pellets.

Figure 28A:
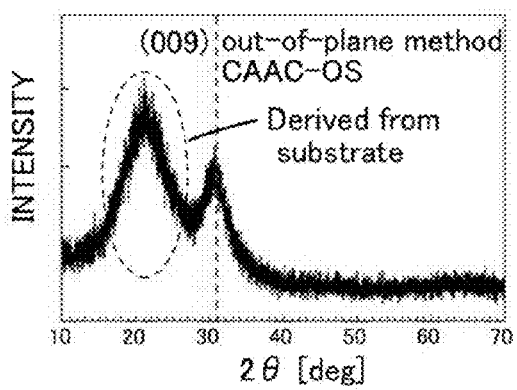
FIGS. 28A to 28C show structural analysis of a CAAC-OS and a single crystal oxide semiconductor by XRD.

Next, a CAAC-OS analyzed by X-ray diffraction (XRD) will be described. For example, when the structure of a CAAC-OS including an InGaZnO$_4$ crystal is analyzed by an out-of-plane method, a peak appears at a diffraction angle (2θ) of around 31° as shown in FIG. 28A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 28B:
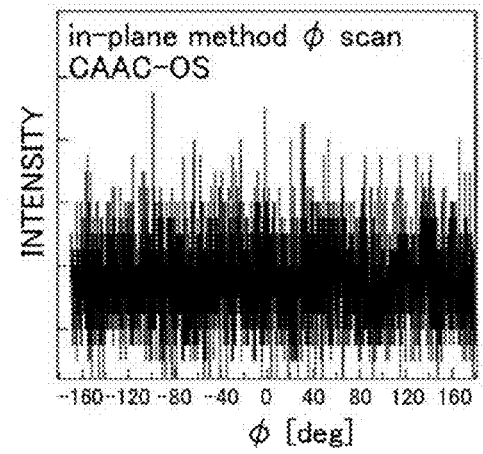
Figure 28C:
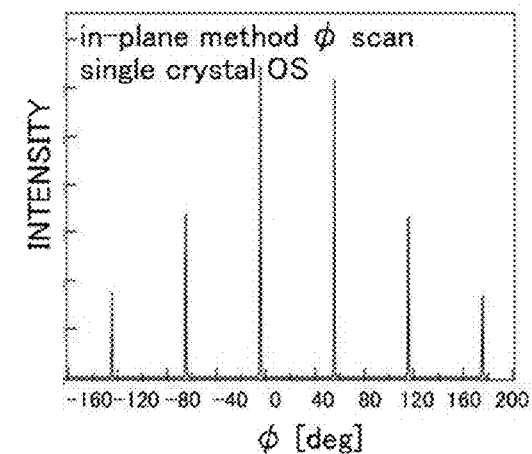

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 28B, a peak is not clearly observed. In contrast, in the case of a single crystal oxide semiconductor of InGaZnO$_4$, when φ scan is performed with 2θ fixed at around 56°, as shown in FIG. 28C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction will be described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 29A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 29B shows a diffraction pattern obtained in such a manner that an electron beam with a probe diameter of 300 nm is incident on the same sample in a direction perpendicular to the sample surface. As shown in FIG. 29B, a ring-like diffraction pattern is observed. Thus, the electron diffraction also indicates that the a-axes and b-axes of the pellets included in the CAAC-OS do not have regular alignment. The first ring in FIG. 29B is considered to be derived from the (010) plane, the (100) plane, and the like of the InGaZnO$_4$ crystal. The second ring in FIG. 29B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with a low carrier density (specifically, lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

[nc-OS]

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

[a-Like OS]

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 30:
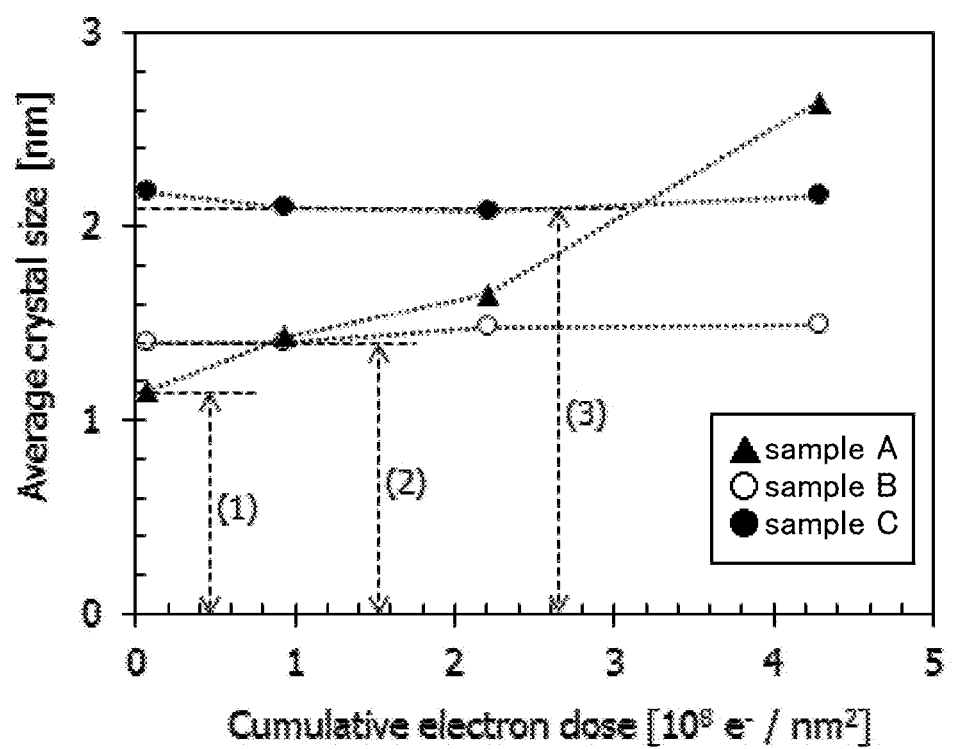
FIG. 30 shows a change in crystal part of an In—Ga—Zn oxide induced by electron irradiation.

FIG. 30 shows change in the average size of crystal parts (at 22 points to 45 points) in each sample. Note that the crystal part size corresponds to the length of a lattice fringe. FIG. 30 indicates that the crystal part size in the a-like OS increases with an increase in the cumulative electron dose. Specifically, as shown by (1) in FIG. 30, a crystal part of approximately 1.2 nm (also referred to as an initial nucleus) at the start of TEM observation grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 30, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Embodiment 6

Figure 31:
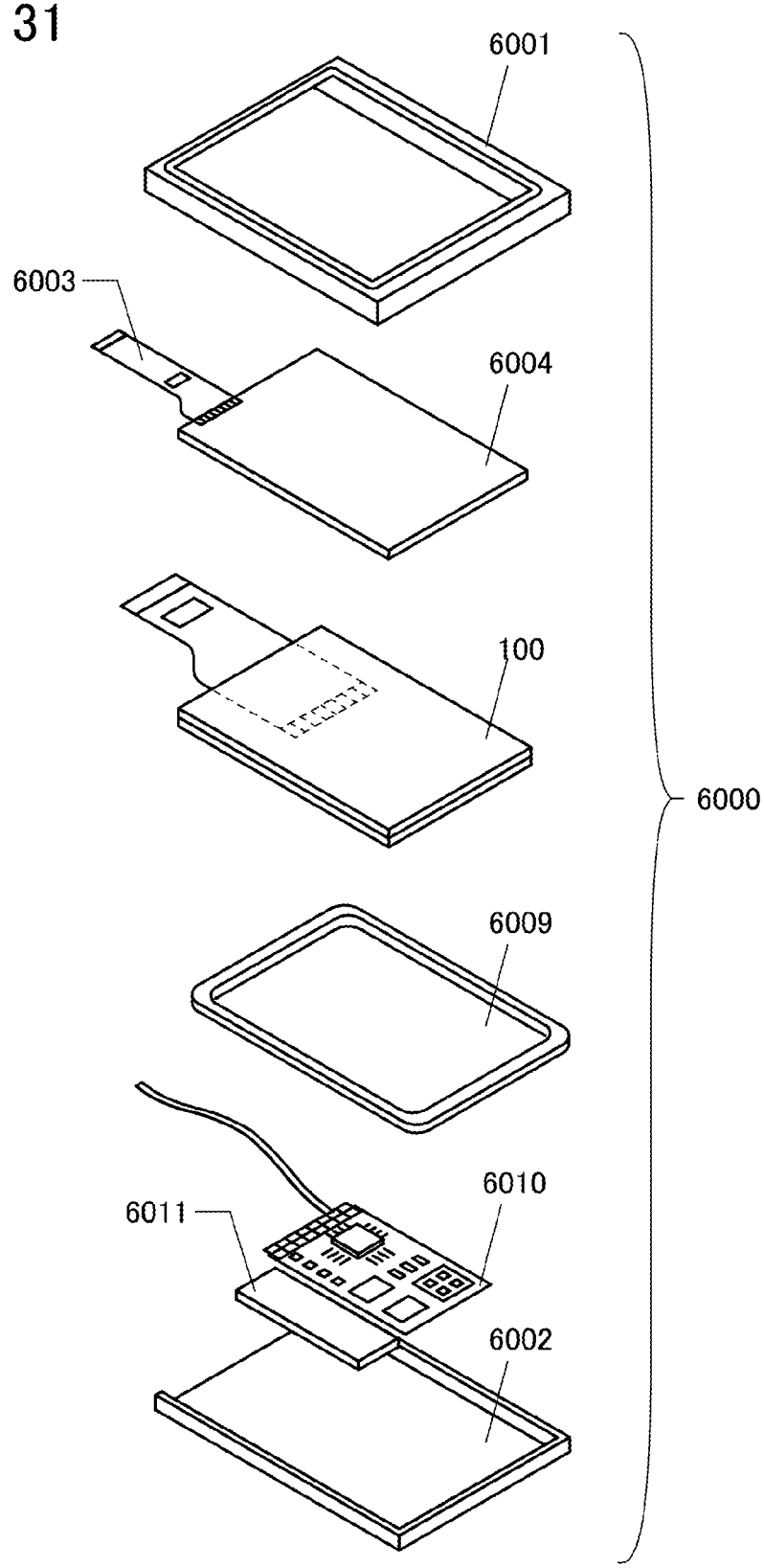
FIG. 31 shows an example of a display module.

In this embodiment, a display module will be described as an example of a semiconductor device including the display device 100. In a display module 6000 in FIG. 31, a touch sensor 6004 connected to an FPC 6003, the display device 100, a frame 6009, a printed circuit board 6010, and a battery 6011 are provided between an upper cover 6001 and a lower cover 6002. Note that the battery 6011, the touch sensor 6004, and the like are not provided in some cases.

The shapes and sizes of the upper cover 6001 and the lower cover 6002 can be changed as appropriate in accordance with the sizes of the touch sensor 6004, the display device 100, and the like.

The touch sensor 6004 can be a resistive touch panel or a capacitive touch panel and may be formed to overlap with the display device 100. The display device 100 can have a touch panel function. For example, an electrode for a touch sensor may be provided in each pixel of the liquid crystal panel 110 of the display device 100 so that a capacitive touch sensor function is added. Alternatively, a photosensor may be provided in each pixel of the liquid crystal panel 110 so that an optical touch sensor function is added.

The frame 6009 protects the display device 100 and also functions as an electromagnetic shield for blocking electromagnetic waves generated from the printed board 6010 side. The frame 6009 may function as a radiator plate.

The printed board 6010 has a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source.

The display module 6000 can be additionally provided with a functional member such as a polarizing plate, a retardation plate, or a prism sheet.

This embodiment can be combined as appropriate with any of the other embodiments and an example in this specification.

Embodiment 7

In this embodiment, examples of an display device that uses a semiconductor device of one embodiment of the present invention will be described.

Specific examples of an electronic device including the display device of one embodiment of the present invention are as follows: display devices such as televisions and monitors, lighting devices, desktop personal computers, laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, and medical equipment such as dialyzers. Furthermore, industrial equipment such as guide lights, traffic lights, belt conveyors, elevators, escalators, industrial robots, power storage systems, and power storage devices for leveling the amount of power supply and smart grid can be given. In addition, moving objects and the like driven by fuel engines and electric motors using power from power storage units, and the like may also be included in the range of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

The electronic devices of one embodiment of the present invention can include the display devices.

Figure 32A:
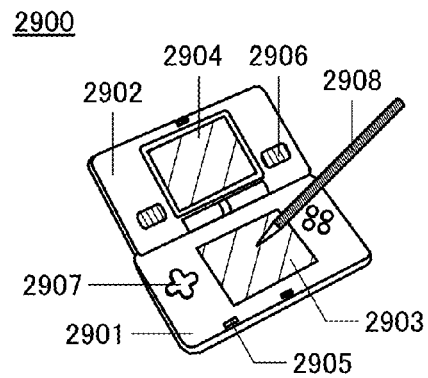
FIGS. 32A to 32G shows electronic devices.

A portable game machine 2900 illustrated in FIG. 32A includes a housing 2901, a housing 2902, a display portion 2903, a display portion 2904, a microphone 2905, a speaker 2906, an operation key 2907, and the like. Although the portable game machine in FIG. 32A has the two display portions 2903 and 2904, the number of display portions included in a portable game machine is not limited to this. The display portion 2903 is provided with a touch screen as an input device, which can be handled with a stylus 2908 or the like.

Figure 32B:
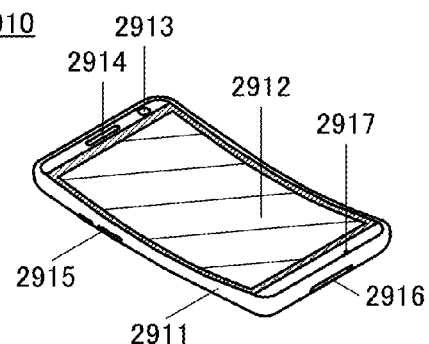

An information terminal 2910 illustrated in FIG. 32B includes a housing 2911, a display portion 2912, a microphone 2917, a speaker portion 2914, a camera 2913, an external connection portion 2916, an operation button 2915, and the like. A display panel that uses a flexible substrate and a touch screen are provided in the display portion 2912. The information terminal 2910 can be used as, for example, a smartphone, a mobile phone, a tablet information terminal, a tablet personal computer, or an e-book reader.

Figure 32C:
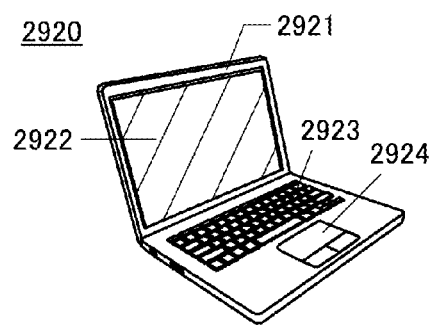

A notebook personal computer 2920 illustrated in FIG. 32C includes a housing 2921, a display portion 2922, a keyboard 2923, a pointing device 2924, and the like.

Figure 32D:
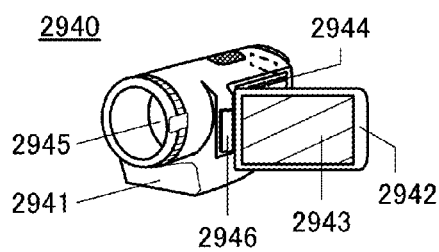

FIG. 32D illustrates a video camera 2940, which includes a housing 2941, a housing 2942, a display portion 2943, operation keys 2944, a lens 2945, a joint 2946, and the like. The operation keys 2944 and the lens 2945 are provided in the housing 2941, and the display portion 2943 is provided in the housing 2942. The housings 2941 and 2942 are connected to each other with the joint 2946, and the angle between the housings 2941 and 2942 can be changed with the joint 2946. The direction of an image on the display portion 2943 may be changed and display and non-display of an image may be switched depending on the angle between the housings 2941 and 2942.

Figure 32E:
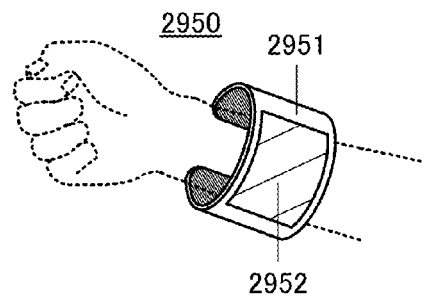

FIG. 32E illustrates an example of a bangle-type information terminal. An information terminal 2950 includes a housing 2951, a display portion 2952, and the like. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 32F:
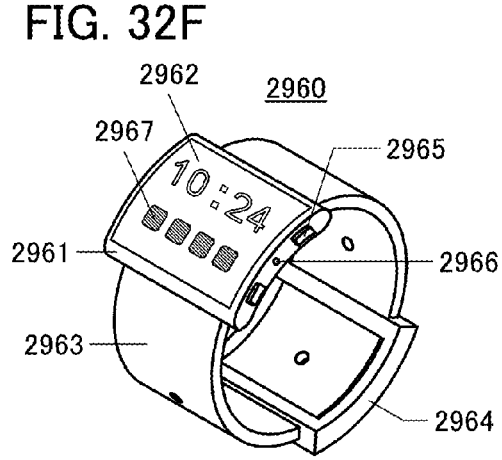

FIG. 32F illustrates an example of a watch-type information terminal. An information terminal 2960 includes a housing 2961, a display portion 2962, a band 2963, a buckle 2964, an operation button 2965, an input/output terminal 2966, and the like. The information terminal 2960 is capable of executing a variety of applications such as mobile phone calls, e-mailing, viewing and editing texts, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, by touching an icon 2967 displayed on the display portion 2962, an application can be started. With the operation button 2965, a variety of functions such as time setting, power ON/OFF, ON/OFF of wireless communication, setting and cancellation of silent mode, and setting and cancellation of power saving mode can be performed. For example, the functions of the operation button 2965 can be set by setting the operating system incorporated in the information terminal 2960.

The information terminal 2960 can perform near field communication that is a communication method based on an existing communication standard. In that case, for example, mutual communication between the portable information terminal 2200 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 32G:
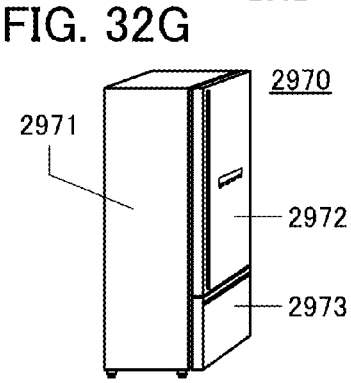

FIG. 32G illustrates an electric refrigerator-freezer as an example of a home electronic device. An electric refrigerator-freezer 2970 includes a housing 2971, a refrigerator door 2972, a freezer door 2973, and the like.

Figure 33A:
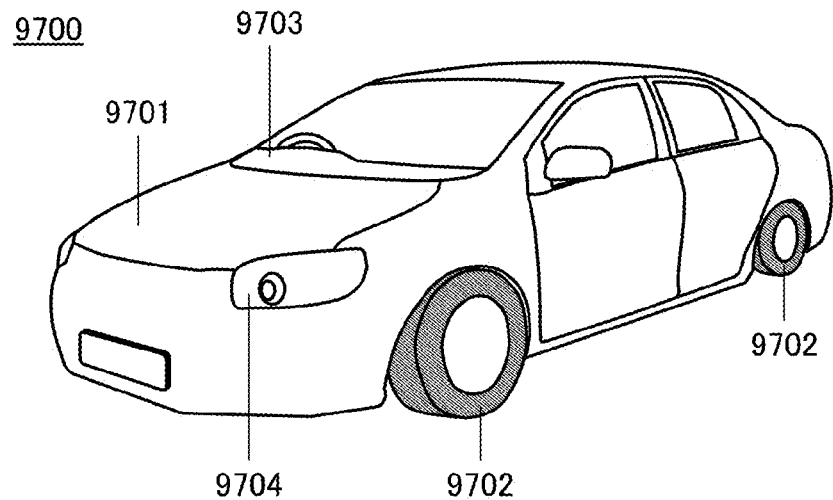
FIGS. 33A and 33B show an electronic device.
Figure 33B:
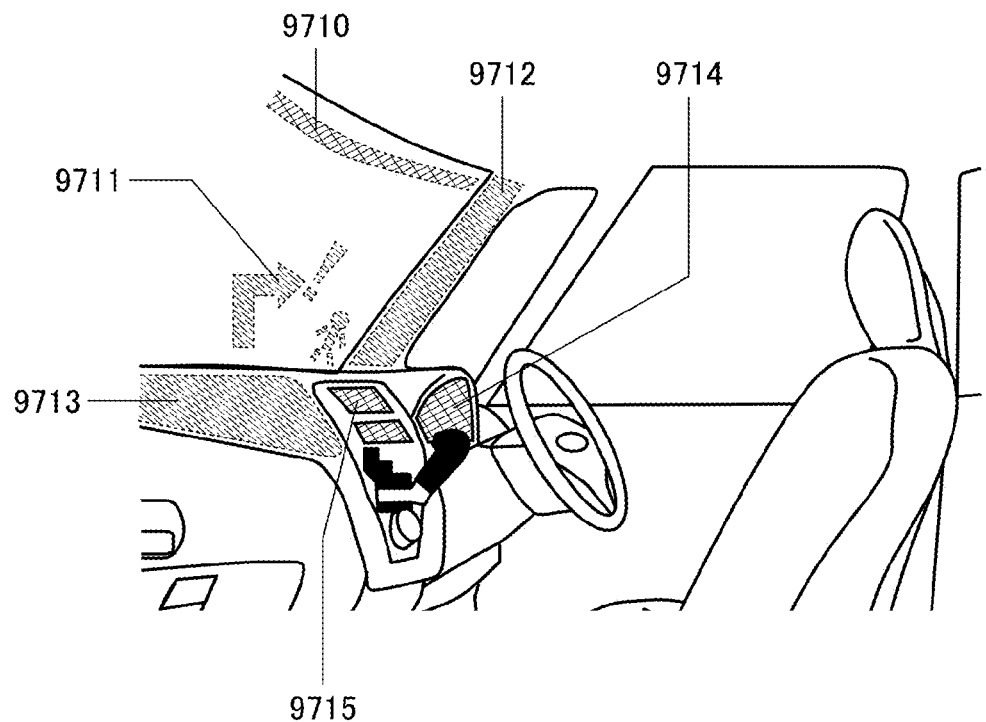

FIG. 33A is an external view of an automobile 9700. FIG. 33B illustrates a driver's seat of the automobile 9700. The automobile 9700 includes a car body 9701, wheels 9702, a dashboard 9703, lights 9704, and the like. The display device of one embodiment of the present invention can be used in a display portion or the like of the automobile 9700. For example, the display device of one embodiment of the present invention can be used in display portions 9710 to 9715 illustrated in FIG. 33B.

The display portion 9710 and the display portion 9711 are display devices provided in an automobile windshield. The display device of one embodiment of the present invention can be a see-through display device, through which the opposite side can be seen, by using a light-transmitting conductive material for its electrodes. Such a see-through display device does not hinder driver's vision during driving the automobile 9700. Therefore, the display device of one embodiment of the present invention can be provided in the windshield of the automobile 9700. Note that in the case where a transistor or the like for driving the display device is provided in the display device, a transistor having light-transmitting properties, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 34:
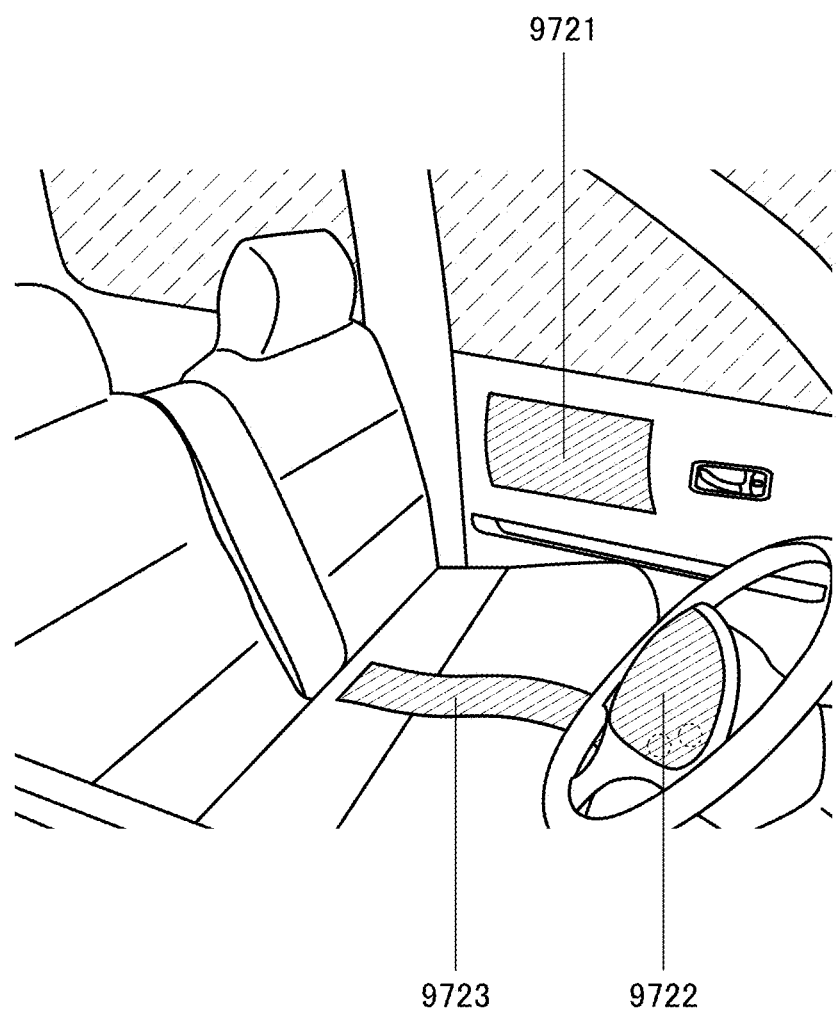
FIG. 34 shows an electronic device.

FIG. 34 illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714 in FIG. 33B, the display portion 9715 in FIG. 33B, and the display portion 9722 in FIG. 34 can display a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

This embodiment can be implemented in an appropriate combination with any of the structures described in the other embodiments.

Embodiment 8

In this embodiment, examples of an electronic device that includes the display device according to one embodiment of the present invention are described with reference to drawings.

[Structure Example]

Figure 35A:
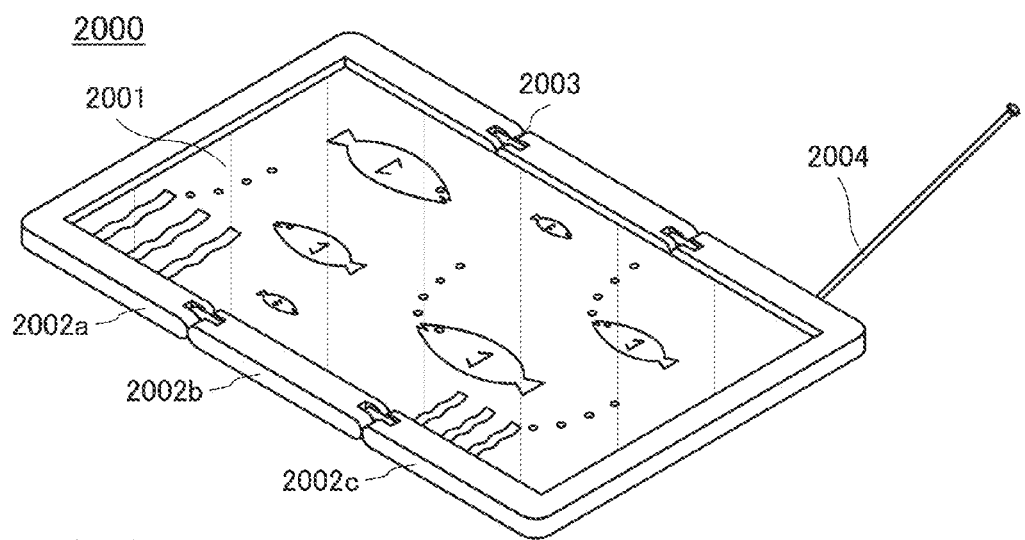
FIGS. 35A and 35B show an electronic device.
Figure 35B:
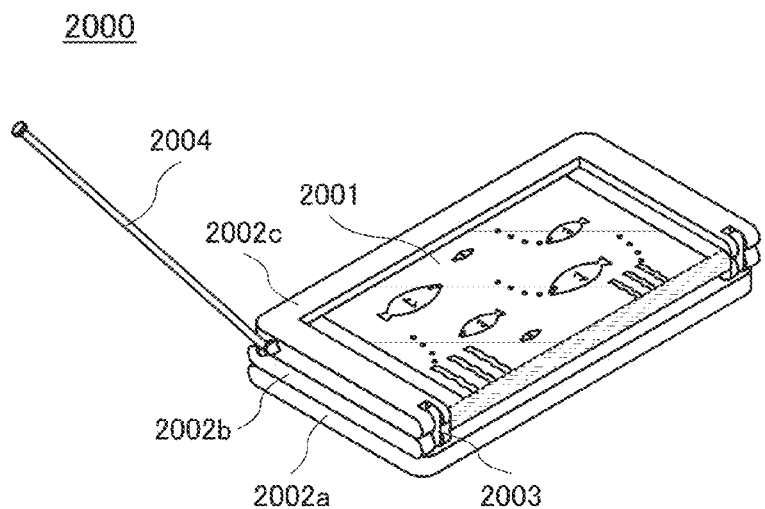

FIGS. 35A and 35B are schematic perspective views of an electronic device 2000. The electronic device 2000 includes a touch panel 2001, three housings 2002a, 2002b, and 2002c, a hinge 2003, and an antenna 2004. The touch panel 2001 in this embodiment is a display device including a touch sensor. The touch panel 2001 includes a module having a touch sensor and overlapping with a display surface side of the display device.

The housings 2002a and 2002b are connected by the hinge 2003. The housings 2002b and 2002c are also connected by the hinge 2003. The two housings connected by the hinge 2003 can relatively rotate around a rotation axis of the hinge 2003.

At least part of the touch panel 2001 is flexible. The touch panel 2001 can be bent or changed in shape. For example, the touch panel 2001 can be folded so that the display surface lies on the inward side (referred to as is folded inward) and so that the display surface lies on the outward side (referred to as is folded outward).

The touch panel 2001 can be bent and therefore the electronic device 2000 is foldable. FIG. 35A shows the touch panel 2001 which is expanded. FIG. 35B shows the touch panel 2001 folded in three. The electronic device 2000 has high portability with the touch panel 2001 folded. The electronic device 2000 has high browsability with the touch panel 2001 opened owing to a seamless large display region.

The electronic device 2000 can receive airwaves by the antenna 2004 to output (display) moving images on the touch panel 2001 of the electronic device 2000.

FIGS. 35A and 35B each show a state where a moving image is displayed on the touch panel 2001. As shown, the touch panel 2001 when folded is preferably configured to scale down the moving image and to display it rotated 90°. Such a touch panel 2001 can display a moving image with aspect ratio kept almost unchanged between the expanded state and the folded state.

The touch panel 2001 is capable of detecting approach or contact of an object, such as a finger or a stylus, and of obtaining the positional data of the object. In the state shown in FIG. 35B, icons or the like relating to applications is displayed in a hatched area where the touch panel 2001 is curved outward, so that a different application can be opened and operated as the moving image is displayed.

Examples of the information include notification from a social networking service (SNS), notification of receiving an e-mail or an incoming call, the subject, the sender, a message, the date, the time, information on playing music or voice, the volume, the temperature, remaining battery, the transmission status, the reception strength of an antenna, and the status of downloading a file or the like. Other than icons or the like relating to applications, icons relating to functions, operation buttons, and a slider can be displayed on the area. For example, there is an icon relating to a function of adjusting the volume, a fast-forward function, and a fast-backward function during the playback of voice or music. As another example, an icon relating to a function of answering the call or placing the call on hold or a function of awaking the operation invalid state (the lock state) of the electronic device 2000 may be displayed.

Note that the number of housings included in the electronic device 2000 may be one, two, four, or more without limitation to three as in the above-described structure example. The touch panel 2001 of the electronic device 2000 can lie over two or more housings.

[Example of Inner Structure]

Figure 36A:
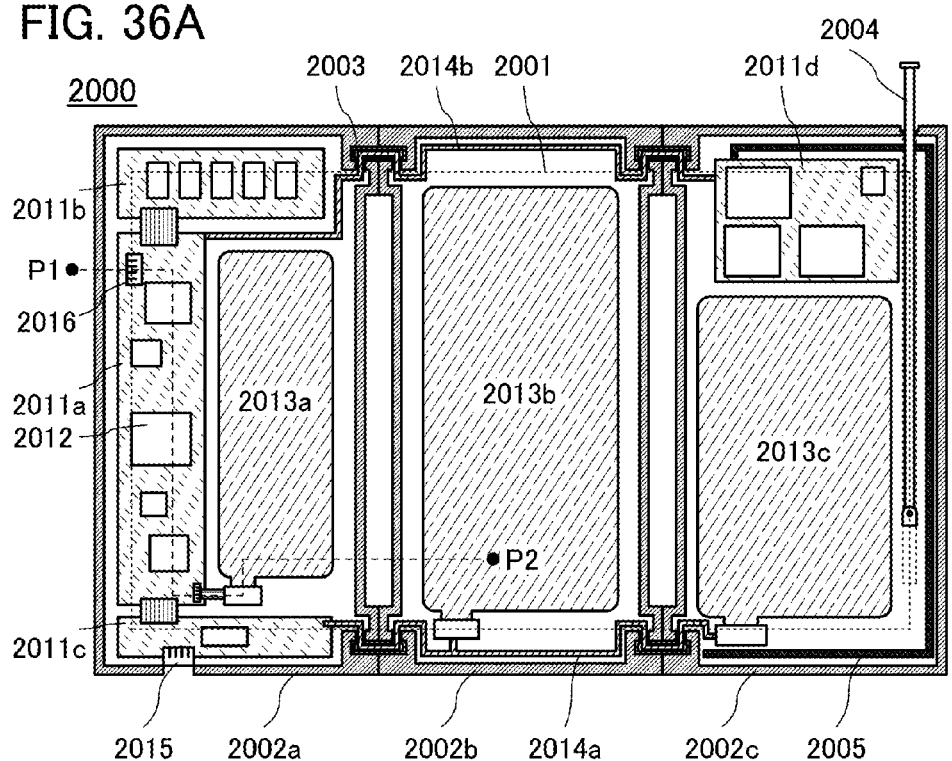
FIGS. 36A to 36C show an electronic device.

FIG. 36A is a schematic view illustrating an example of the inner structure of the electronic device 2000.

The electronic device 2000 includes a printed circuit board 2011a, a printed circuit board 2011b, a printed circuit board 2011c, a battery module 2013a, and the like which are in the housing 2002a. The electronic device 2000 includes a battery module 2013b and the like in the housing 2002b. The electronic device 2000 includes a printed circuit board 2011d, a battery module 2013c, an antenna 2004, an antenna 2005, and the like which are in the housing 2002c.

An IC 2012 is mounted on each printed circuit board. In addition, a connector 2016 connected to modules may be provided on each printed circuit board. Two printed circuit boards are electrically connected by a wiring or the like. In the structure shown in FIG. 36A, the printed circuit board 2011a includes the connector 2016 electrically connected to the touch panel 2001.

In the structure, for example, the printed circuit board 2011a corresponds to a main substrate on which ICs, such as a central processing unit (CPU), a graphics processing unit (GPU), and a dynamic random access memory (DRAM), are mounted. An IC for a memory device, such as a flash memory, is mounted on the printed circuit board 2011b. An IC for an external interface and an IC for battery management, such as a battery management unit (BMU), are mounted on the printed circuit board 2011c. An IC for wireless communication, broadcast reception, or the like is mounted on the printed circuit board 2011d.

The battery module 2013b and the battery module 2013c are electrically connected to the BMU and the like mounted on the printed circuit board 2011c in the housing 2002a by the wiring 2014a, which enables integration management of power statuses of the battery module 2013a, the battery module 2013b, and the battery module 2013c which lie in different housings.

As described above, the antenna 2004 receives airwaves, while the antenna 2005 is used for wireless communication, for example. Like the example, two or more kinds of antennas are preferably mounted on any of the housings in the electronic device 2000.

The antenna 2004 is preferably stored in the housing 2002c when not in use. To use the antenna 2004, it is drawn and pulled out from the housing 2002c. Further preferably, the antenna 2004 is tiltable in various angles.

The antenna 2005 is preferably provided inside the housing 2002c. FIG. 36A shows an example in which the antenna 2005 is provided inside the housing 2002c along the margin of the housing 2002c, in which case the coverage of the antenna 2005 can be expanded to increase the sensitivity. Alternatively, a conductive material may be used for part of the housing 2002c or part of two or more of the housings 2002a, 2002b, and 2002c, and the part can be used as part of the antenna 2005.

In addition, the printed circuit board 2011d, the antenna 2004, and the antenna 2005 are preferably provided inside the housing 2002c as shown in FIG. 36A, in which case a wiring between an IC and the antenna 2004 or 2005 can be shortened, so that the influence of noise can be suppressed.

The printed circuit board 2011d is electrically connected to the printed circuit board 2011a which lies in the housing 2002a through the wiring 2014b.

The wirings 2014a and 2014b are extended between two adjacent housings through the inside of the hinge 2003. Note that a method for electrically connecting two housings is not limited thereto. A terminal may be provided between the hinge 2003 and the housing or between two housings so that their electrical connection can be maintained regardless their relative position. An electric power or a signal may be transmitted between housings by wireless communication.

An external connection terminal 2015 is provided in the housing 2002a in the example. The external connection terminal 2015 can include a variety of terminals, such as an universal serial bus (USB), a local area network (LAN) connection terminal, a power reception terminal, a sound output terminal, a sound input terminal, an image output terminal, and a moving image input terminal. One terminal may have two or more functions. For example, both data transmission and power reception can be performed by one terminal.

Figure 36B:
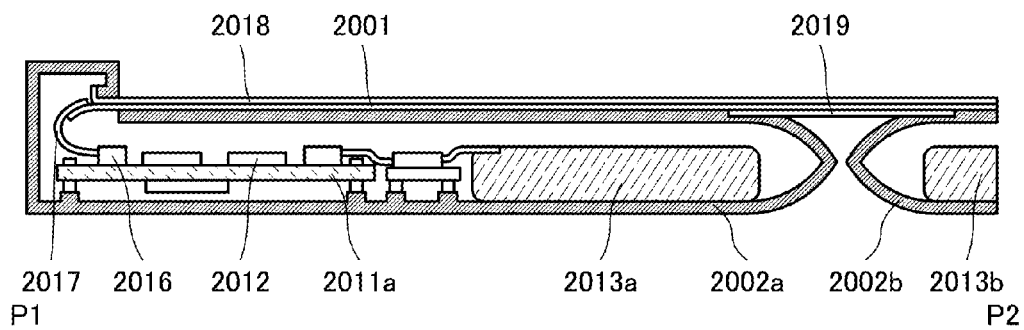

FIG. 36B is a schematic cross-sectional view taken along the section line P1-P2 in FIG. 36A.

The touch panel 2001 lies over the housings 2002a and 2002b. A display surface of the touch panel 2001 is covered by a protection member 2018. Moreover, a protection member 2019 lies between the two housings on the side of the touch panel 2001 which is opposite to the display surface.

The protection members 2018 and 2019 are preferably flexible so that they follow the bending of the touch panel 2001. The protection member 2018 on the display surface side preferably transmits visible light. In the case of using the surface of the protection member 2018 as a touch surface, a hard coat layer for protecting the surface from a flaw and the like (e.g., an inorganic insulating material such as silicon nitride or aluminum oxide), a layer capable of dispersing pressing force (e.g., an aramid resin layer), or the like may be provided.

The touch panel 2001 is electrically connected to a connector 2016 included in the printed circuit board 2011a through the FPC 2017. The FPC 2017 is partly curved as shown in FIG. 36B, so that the connector 2016 can be lied in a position overlapping with part of the touch panel 2001. This leads to the reduction in width of the bezel of the electronic device 2000 (i.e., the non-display region surrounding the display region on the display surface side).

In addition, the ICs 2012 are mounted on both sides of the printed circuit board 2011a in FIG. 36B, which leads to the reduction in area of the printed circuit board 2011a and in size of the electronic device 2000. The reduction in area of the printed circuit board 2011a is preferable because the capacitance of the battery module 2013a can thus be increased, leading to a long-time use of the electronic device 2000.

Figure 36C:
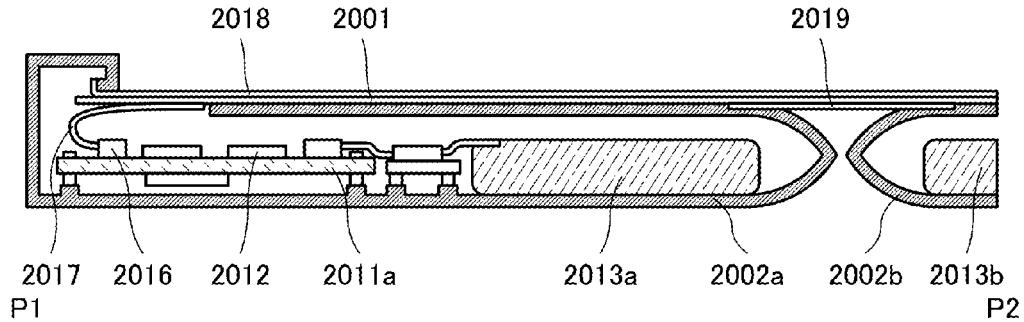

As shown in FIG. 36C, the FPC 2017 may be connected to the other side of the display portion of the touch panel 2001, which leads to a further reduction in bezel width of the electronic device 2000.

Figure 37:
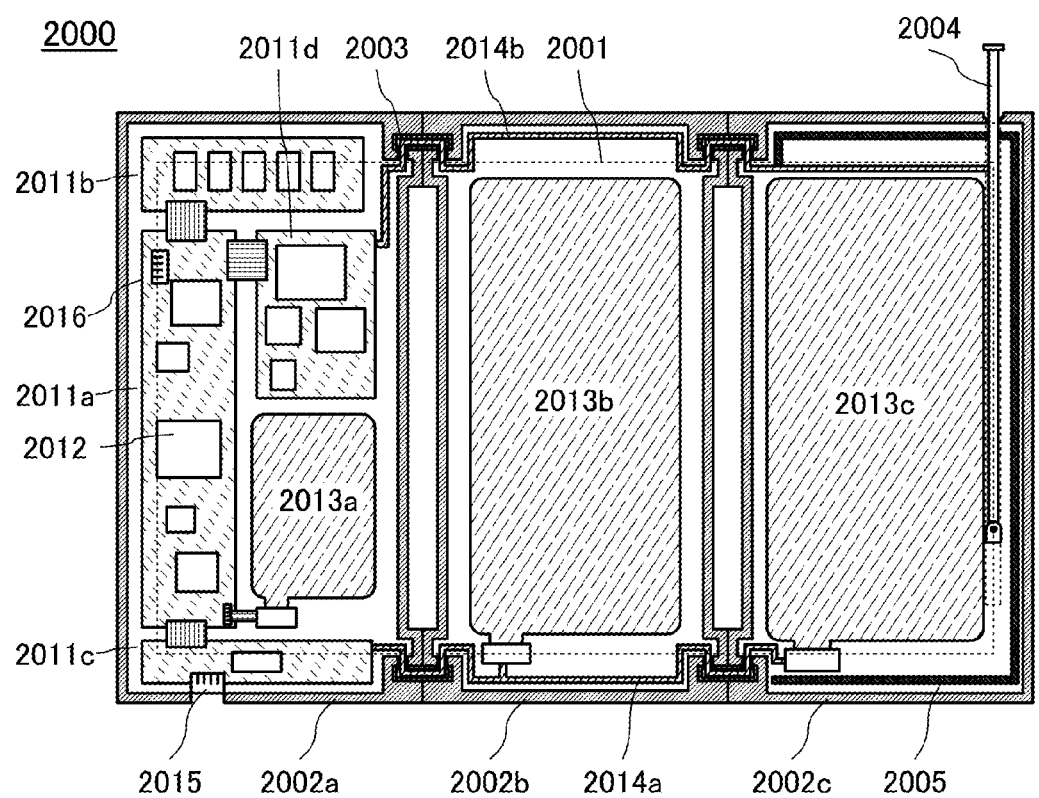
FIG. 37 shows an electronic device.

FIG. 37 shows an example where the printed circuit board 2011d is provided in the housing 2002a, in which case the housing 2002a includes all the printed circuit boards and can thus integrate their functions. In addition, the capacitance of battery modules in other housings can be increased. Note that in that case, the antenna 2004 and the antenna 2005 are electrically connected to the printed circuit board 2011d in the housing 2002a through the wiring 2014b.

It is preferable that one housing include the antenna 2004 and the antenna 2005 and another housing include many ICs such as a CPU as shown in FIGS. 36A to 36C and FIG. 37. Such a structure can suppress transmission of noise that comes from the antenna 2004 or the antenna 2005 to the wirings and ICs of the printed circuit board.

Although the housing 2002 does not include a printed circuit board in the structure examples described above, it can include a printed circuit board. In addition, the number and structure of printed circuit boards are not limited thereto and depend on the design of a printed circuit board.

Although battery modules and antennas are mounted on the housing 2002b and the housing 2002c in the above examples, they may be gathered into the housing 2002a. In that case, the housing 2002b and the housing 2002c each serve as a support for supporting the touch panel 2001.

[Structure Example of Hardware]

Figure 38:
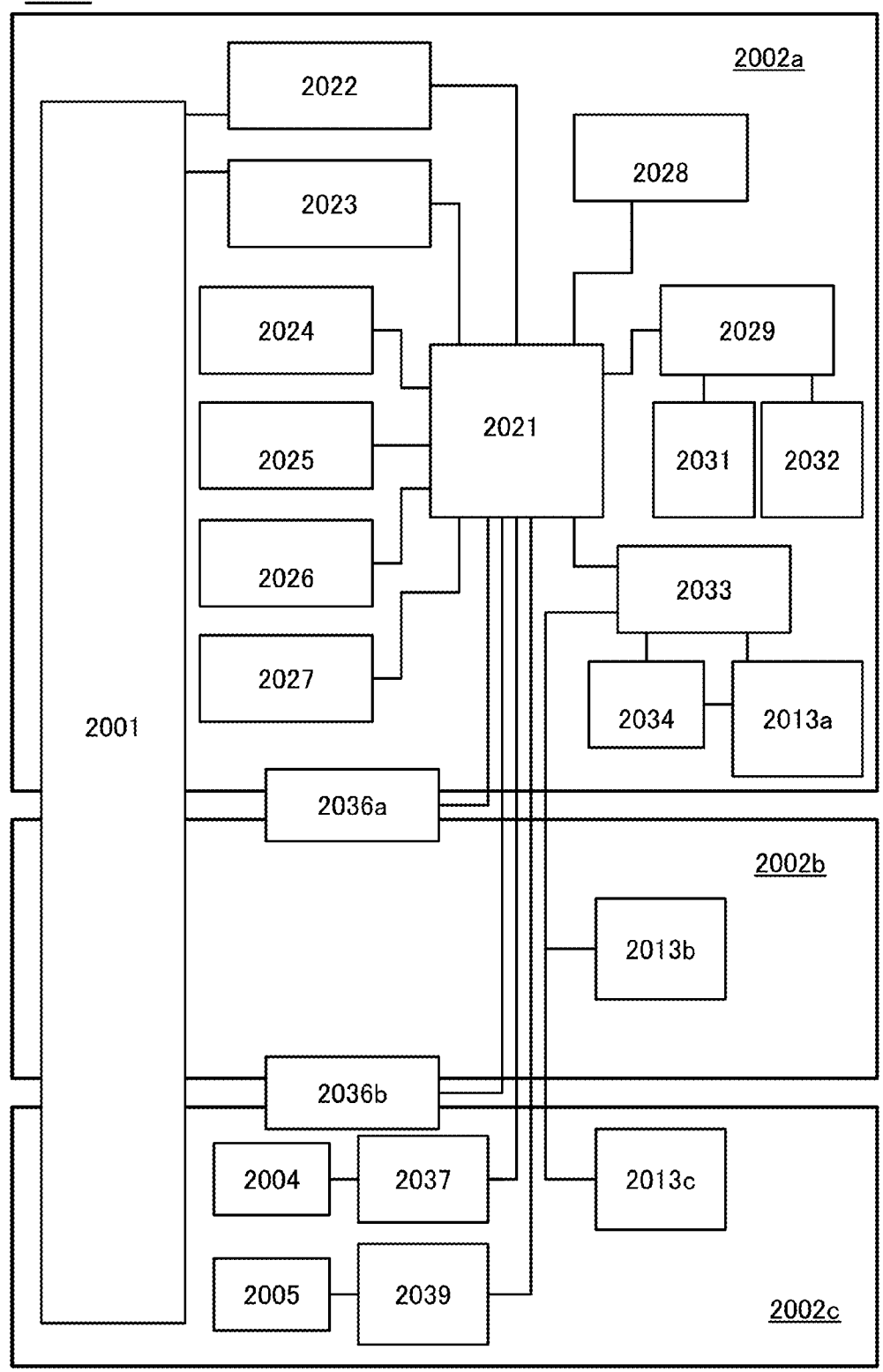
FIG. 38 is a block diagram of an electronic device.

FIG. 38 is a block diagram showing a structure example of the electronic device 2000.

Although the block diagram attached to this specification shows components classified by their functions in independent blocks, it is difficult to classify actual components according to their functions completely and it is possible for one component to have a plurality of functions.

The electronic device 2000 includes the housing 2002a, the housing 2002b, the housing 2002c, and the touch panel 2001. The touch panel 2001 lies across the housing 2002a, the housing 2002b, and the housing 2002c.

The housing 2002a includes an arithmetic operation unit (e.g., CPU) 2021, a touch sensor controller 2022, a display controller 2023, a sensor 2024, a posture measurement portion 2025, a camera module 2026, an external interface 2027, a memory device 2028, a sound controller 2029, a sound input portion 2031, a sound output portion 2032, a power management portion 2033, a power receiving portion 2034, the battery module 2013a, and the like. The housing 2002b includes the battery module 2013b and the like. The housing 2002c includes the antenna 2004, the antenna 2005, a tuner 2037, a wireless communication portion 2039, the battery module 2013c, and the like.

A shape measurement portion 2036a lies between the housing 2002a and the housing 2002b. A shape measurement portion 2036b lies between the housing 2002b and the housing 2002c. The shape measurement portion 2036a may be incorporated in the housing 2002a or the housing 2002b. The shape measurement portion 2036b may be incorporated in the housing 2002b or the housing 2002c.

The display device of one embodiment of the present invention can be used for the touch panel 2001, for example.

Note that the configuration of the electronic device 2000 shown in FIG. 38 is one example, and thus the electronic device 2000 does not necessarily include all the components. The electronic device 2000 includes the required components in FIG. 38 and may include a component other than the components in FIG. 38.

The arithmetic operation unit 2021 can serve as a CPU and control the components, such as the touch sensor controller 2022, the display controller 2023, the sensor 2024, the pose measurement portion 2025, the camera module 2026, the external interface 2027, the memory device 2028, the sound controller 2029, and the power management portion 2033.

Signals are transmitted between the arithmetic operation unit 2021 and the components via a system bus. The arithmetic operation unit 2021 is configured to process signals input from the components which are connected through the system bus and to generate signals to be output to the components, so that the components connected to the system bus can be controlled comprehensively.

Note that the arithmetic operation unit 2021, an IC included in other components, and the like can include a transistor in which an oxide semiconductor is used for its channel formation region and off-state current is extremely low. With the use of the transistor having extremely low off-state current as a switch for holding electric charge (data) which flows into a capacitor serving as a memory element, a long data retention period can be ensured. The characteristic is utilized for a register or a cache memory of the arithmetic operation unit 2021, normally off computing is achieved where the arithmetic operation unit 2021 operates only when needed and data on the previous processing is stored in the memory element in the rest of time, so that power consumption of the electronic device 2000 can be reduced.

As an example of the arithmetic operation unit 2021 other than a CPU, a microprocessor, such as a digital signal processor (DSP) or a graphics processing unit (GPU), can be used alone or in combination. Such a microprocessor may be obtained with a programmable logic device (PLD) such as a field programmable gate array (FPGA) or a field programmable analog array (FPAA). The arithmetic operation unit 2021 interprets and executes instructions from programs to process various kinds of data and control programs. The program which can be executed by the processor may be stored in a memory region of the processor or the memory device 2028.

The arithmetic operation unit 2021 may include a main memory. The main memory can include a volatile memory, such as a random access memory (RAM), and a nonvolatile memory, such as a read only memory (ROM).

For example, a dynamic random access memory (DRAM) is used for the RAM included in the main memory, in which case a memory space as a workspace for the arithmetic operation unit 2021 is virtually allocated and used. An operating system, an application program, a program module, program data, and the like which are stored in the memory device 2028 are loaded into the RAM and executed. The data, program, and program module which are loaded into the RAM are directly accessed and operated by the arithmetic operation unit 2021. Moreover, characteristic data for calculating the position of the electronic device 2000 and the relative positional relationship between the housings from the data input from the pose measurement portion 2025, the shape measurement portion 2036*a*, and the shape measurement portion 2036*b* may be read out from the memory device 2028 as a lookup table and stored in the main memory.

In the ROM, a basic input/output system (BIOS), firmware, and the like for which rewriting is not needed can be stored. As the ROM, a mask ROM, a one-time programmable read only memory (OTPROM), or an erasable programmable read only memory (EPROM) can be used. As an EPROM, an ultra-violet erasable programmable read only memory (UV-EPROM) which can erase stored data by irradiation with ultraviolet rays, an electrically erasable programmable read only memory (EEPROM), a flash memory, and the like can be given.

Examples of the memory device 2028 are a memory media drive such as a hard disc drive (HDD), or a solid state drive (SSD); a memory device including a non-volatile memory element, such as a flash memory, a magnetoresistive random access memory (MRAM), a phase change RAM (PRAM), a resistive RAM (ReRAM), or a ferroelectric RAM (FeRAM); a memory device including a volatile memory element such as a dynamic RAM (DRAM) or a static RAM (SRAM).

As the memory device 2028, a memory device which can be connected to and disconnected from the external interface 2027 with a connector, such as an HDD or an SSD; or a memory media, such as a flash memory, a Blu-ray disc, or a DVD can be used. Note that the memory device 2028 is not necessarily incorporated in the electronic device 2000, and a memory device outside the electronic device 2000 may be used as the memory device 2028. In this case, the memory device may be connected through the external interface 2027, or data transmission and reception may be wirelessly performed using the wireless communication portion 2039.

The touch panel 2001 has a function of displaying images and a function of detecting approach or contact of an object, such as a finger or a stylus, and obtaining its positional data.

As described above, a module including a touch sensor overlaps with the display surface side of the display device in the touch panel 2001. At least part of the module including a touch sensor is preferably flexible to follow the bending of the display device. The module including a touch sensor may be bonded to the display device with an adhesive or the like. A polarizing plate or a cushion material (e.g., separator) may be provided between the module and the display device. The thickness of the module including a touch sensor is preferably smaller than or equal to that of the display device.

Alternatively, a touch panel in which a display device is integrated with a touch sensor, such as an on-cell touch panel or an in-cell touch panel, may be used as the touch panel 2001. In the case of using the on-sell or in-sell touch panel, the thickness of the display device can be small even when the display device also serves as a touch panel.

A variety of sensors that can sense approach or contact of an object such as a finger can be used as the touch sensor of the touch panel 2001. Examples of the type of the sensor include a capacitive type, a resistive type, a surface acoustic wave type, an infrared type, and an optical type. Without limitation thereto, an optical sensor using a photoelectric conversion element, a pressure-sensitive sensor using a pressure-sensitive element, or the like may be used.

For example, a capacitive touch sensor that can be used in one embodiment of the present invention includes a pair of conductive layers. A capacitor is formed in the pair of conductive layers. The capacitance of the pair of conductive layers changes when an object touches or gets close to the pair of conductive layers. Utilizing this effect, detection can be conducted.

Examples of the capacitive touch sensor are a surface capacitive touch sensor and a projected capacitive touch sensor. Examples of the projected capacitive touch sensor are a self capacitive touch sensor and a mutual capacitive touch sensor, which differ mainly in the driving method. The use of the mutual capacitive touch sensor is preferable because simultaneous detection of multiple points can be performed easily.

Instead of the touch panel 2001, a display device which does not serve as a touch sensor may be used. Even in that case, the browsability of display can be improved when the display device is expanded.

For example, a flexible substrate is used as a substrate supporting a display element, a circuit for driving the display element, a circuit included in a touch sensor, and the like, so that the touch panel 2001 with flexibility can be obtained.

A typical example of a material of a flexible substrate is an organic resin. Other examples are glass, metal, alloy, a semiconductor, and the like that are thin enough to have flexibility, and a composite material or a stacked material containing two or more of the organic resin, glass, metal, alloy, semiconductor, and the like.

For example, a display element which can be used for the touch panel 2001, a display device which is a device having a display element, a light-emitting element, and a light-emitting device which is a device having a light-emitting element can use various types and can include various elements.

For example, in this specification and the like, an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since such an element has few numbers of manufacturing steps, manufacturing cost can be reduced or yield can be improved. Alternatively, since the size of the element is small, the aperture ratio can be improved, so that power consumption can be reduced or higher luminance can be achieved.

The number of manufacturing steps of a passive matrix display device is small because no active element (a non-linear element) is used. Since such a display device has a few numbers of manufacturing steps, manufacturing cost can be reduced or yield can be improved. Since an active element (a non-linear element) is not used, the aperture ratio can be improved, so that power consumption can be reduced or higher luminance can be achieved, for example.

The touch panel 2001 is connected to the display controller 2023 and the touch sensor controller 2022. The display controller 2023 and the touch sensor controller 2022 are connected to the arithmetic operation unit 2021 via system buses.

The display controller 2023 controls the touch panel 2001 according to drawing instructions input from the arithmetic operation unit 2021 via a system bus so that a predetermined image is displayed on the display surface of the touch panel 2001.

The touch sensor controller 2022 controls a touch sensor of the touch panel 2001 according to requests from the arithmetic operation unit 2021 via a system bus. In addition, the touch sensor controller 2022 outputs a signal received by the touch sensor to the arithmetic operation unit 2021 via the system bus. Note that the function of calculating a touch position data from a signal received by the touch sensor may be given to the touch sensor controller 2022 or the arithmetic operation unit 2021.

The sensor 2024 includes a sensor unit and a sensor controller. The sensor controller supplies electric power from the battery module 2013*a* or the like to the sensor unit. Moreover, the sensor controller converts the input from the sensor unit into a control signal and outputs it to the arithmetic operation unit 2021 via a system bus. The sensor controller may handle errors made by the sensor unit or may calibrate the sensor unit. Note that the sensor controller may include a plurality of controllers for controlling the sensor unit.

Besides, the sensor 2024 may include any of a variety of sensors which measure force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, and infrared rays.

The posture measurement portion 2025 measures a tilt, a posture, and the like of the electronic device 2000. For example, an acceleration sensor, an angular velocity sensor, a vibration sensor, a pressure sensor, a gyroscope sensor, or the like can be used for the posture measurement portion 2025. Alternatively, these sensors may be combined.

The camera module 2026 is connected to the arithmetic operation unit 2021 via a system bus. The camera module 2026 can take a still image or a moving image in synchronization with pushing a housing switch or touching the touch panel 2001. The camera module 2026 may include a light source for taking images. For example, a lamp such as a xenon lamp, a light-emitting element such as an LED or an organic EL element, or the like can be used.

The external interface 2027 includes one or more of a button or switch (also referred to as housing switch) provided with a housing or an external port to which an input component can be connected, for example. The external interface 2027 is connected to the arithmetic operation unit 2021 via a system bus. Examples of the housing switch include a switch which links with powering on/off, a button for adjusting volume, and a camera button.

The external port of the external interface 2027 can be connected to external devices such as a computer and a printer through a cable. An universal serial bus (USB) terminal is a typical example. As the external port, a local area network (LAN) connection terminal, a digital broadcasting reception terminal, an AC adaptor connection terminal, or the like may be provided. A transceiver for optical communication, without limitation to wire communication, using infrared rays, visible light, ultraviolet rays, or the like, may be provided. For example, the above-described external connection terminal 2015 is one embodiment of the external port of the external interface 2027.

The sound input portion 2031 includes a microphone, a sound input connector, or the like. The sound output portion 2032 includes a speaker, a sound output connector, or the like. The sound input portion 2031 and the sound output portion 2032 are each connected to the sound controller 2029. Furthermore, the sound input portion 2031 and the sound output portion 2032 are each connected to the arithmetic operation unit 2021 via a system bus. Sound data input to the sound input portion 2031 is converted into a digital signal in the sound controller 2029 and then processed in the sound controller 2029 and the arithmetic operation unit 2021. The sound controller 2029 creates an audible analog sound signal by users according to instructions from the arithmetic operation unit 2021 and outputs the analog sound signal to the sound output portion 2032. To the sound output connector of the sound output portion 2032, a sound output device such as headphones or a headset can be connected and a sound generated in the sound controller 2029 is output to the device.

The power management portion 2033 can manage charge states of the battery module 2013*a*, the battery module 2013*b*, the battery module 2013*c*, and the like. In addition, the power management portion 2033 supplies power from the battery modules to the components. The power reception portion 2034 receives power supplied from the outside and charges the battery modules. The power management portion 2033 can control the operation of the power reception portion 2034 depending on the charge states of the battery modules.

The battery module 2013*b* and the battery module 2013*c* which lie in different housings may supply power which the power reception portion 2034 receives through the power management portion 2033. Power may be supplied to the battery module 2013*b* or the battery module 2013*c* from the power reception portion 2034 through a power supply line which is not shown. The power reception portion 2034 and the power management portion 2033 may be provided in the housing 2002*b* or the housing 2002*c*.

Each of the battery modules includes one or more primary batteries or secondary batteries, for example. In addition to such a battery, a protection circuit for preventing overcharge and overdischarge of the battery may be provided in each of the battery modules. In the case of indoor use, an alternate-current (AC) power source may be used as an external power source. In particular, in the case of using the electronic device 2000 separately from the external power source, it is favorable that the power source have a large charge/discharge capacity which enables the electronic device 2000 to be used for a long time. Each battery module may be charged using a battery charger separated from the electronic device 2000. At this time, charging may be performed through wires using an AC adaptor; alternatively, charging may be performed by a wireless power feeding method such as an electric field coupling method, an electromagnetic induction method, or an electromagnetic resonance (electromagnetic resonant coupling) method. Examples of a secondary battery which can be used for each battery module include a lithium ion secondary battery and a lithium ion polymer secondary battery.

The power management portion 2033 may include a battery management unit (BMU), for example. The BMU collects data on cell voltage or cell temperatures of the battery, monitors overcharge and overdischarge, controls a cell balancer, handles a deterioration state of the battery, calculates the remaining battery power (state of charge: SOC), and controls detection of a failure, for example.

The power management portion 2033 controls power transmission from the battery modules to the components through the system bus or a power supply line. The power management portion 2033 can include a power converter or an inverter with a plurality of channels, a protection circuit, and the like.

The battery module 2013a, the battery module 2013b, and the battery module 2013c preferably overlap with the touch panel 2001. When at least one of the housing 2002a, the housing 2002b, and the housing 2002c is flexible and can be bent, at least one of the battery module 2013a, the battery module 2013b, and the battery module 2013c is preferably flexible as well. As a secondary battery which can be included in the battery module 2013a, the battery module 2013b, and the battery module 2013c, for example, a lithium ion secondary battery and a lithium ion polymer secondary battery can be given. It is preferable that a laminate package be used as a jacket of the battery so that the battery has flexibility.

Note that the film used for the laminate package is a single-layer film selected from a metal film (e.g., an aluminum film, a stainless steel film, and a nickel steel film), a plastic film made of an organic material, a hybrid material film including an organic material (e.g., an organic resin or fiber) and an inorganic material (e.g., ceramic), and a carbon-containing inorganic film (e.g., a carbon film or a graphite film); or a stacked-layer film including two or more of the above films. A metal film is easy to emboss and have efficient heat dissipation because forming depressions and projections by embossing increases the surface area of the film exposed to outside air.

Particularly when a laminate package including a metal film having depressions and projections by embossing is used, a strain caused by stress applied to the laminate package can be relieved, leading to efficient decrease of defects, such as a break of the laminate package due to bending of a secondary battery.

The power management portion 2033 preferably has a function of reducing power consumption. For example, after detection of no input to the electronic device 2000 for a given period, the power management portion 2033 lowers clock frequency or stops input of clocks of the arithmetic operation unit 2021, stops operation of the arithmetic operation unit 2021 itself, or stops operation of the auxiliary memory, thereby controlling power supply to the components and reducing power consumption. Such a function is performed with the power management portion 2033 alone or interlocking with the arithmetic operation unit 2021.

The shape measurement portion 2036a detects the relative positional relationship between the housing 2002a and the housing 2002b and outputs the data to the arithmetic operation unit 2021 via a system bus. Similarly, the shape measurement portion 2036b detects the relative positional relationship between the housing 2002b and the housing 2002c and outputs the data to the arithmetic operation unit 2021 via a system bus.

As the shape measurement portion 2036a, a sensor similar to that in the posture measurement portion 2025 can be used. When data on the posture of the housing 2002b is input from the posture measurement portion 2036a to the arithmetic operation unit 2021 via the system bus, the arithmetic operation unit 2021 can calculate the relative positional relationship between the housing 2002a and the housing 2002b from the data on the posture of each of the housing 2002a and the housing 2002b measured by the posture measurement portion 2025. The shape measurement portion 2036b can have a similar structure. Thus, the arithmetic operation unit 2021 can calculate the relative positional relationship between the three housings 2002a, 2002b, and 2002c from the data on the posture of each of the housings.

The shape measurement portions 2036a and 2036b may be configured to measure a rotation angle of the hinge 2003 so that the relative position of two housings connected by the hinge 2003 is measured. A rotation angle with respect to a rotation axis of each hinge can be measured mechanically, optically, or electromagnetically.

Alternatively, a sensor may be configured to measure the curve of a flexible member connecting two adjacent housings, in which case the touch panel 2001, the protection member 2018, the protection member 2019, or the like can be used as the flexible member. When such a sensor is used, the flexible member includes a plurality of acceleration sensors or the like so that the arithmetic operation unit 2021 can calculate each shape from change in acceleration rate at each position. A sensor including a piezoelectric element may be included in the flexible member so that bending can be measured. Alternatively, a sensor whose physical characteristics, such as resistivity, thermal conductivity, and transmissivity, change with a curving may be incorporated in the flexible member so that the shape is calculated from change of the physical characteristics.

The shape measurement portion 2036a and the shape measurement portion 2036b may be configured to determine whether two housing open or close. For example, an optical measurement can be performed utilizing a phenomenon that external light is blocked by closing two adjacent housings, one of which includes a light-receiving element. Alternatively, an optical measurement may be performed utilizing light that enters a light-receiving element provided on one surface of one of two adjacent housings from a light source provided on one surface of the other housing when the two housings are closed. It is preferable to use infrared light as light from the light source because users cannot recognize it.

Note that the structures of the shape measurement portion 2036a and the shape measurement portion 2036b are not limited thereto. A variety of sensors to which mechanical, electromagnetical, thermal, acoustic, or chemical means is applied can be used as long as the relative positional relationship between two or three adjacent housings can be measured.

The tuner 2037 generates an image signal from the broadcast wave received by the antenna 2004. The image signal is output to the touch panel 2001.

Figure 40:
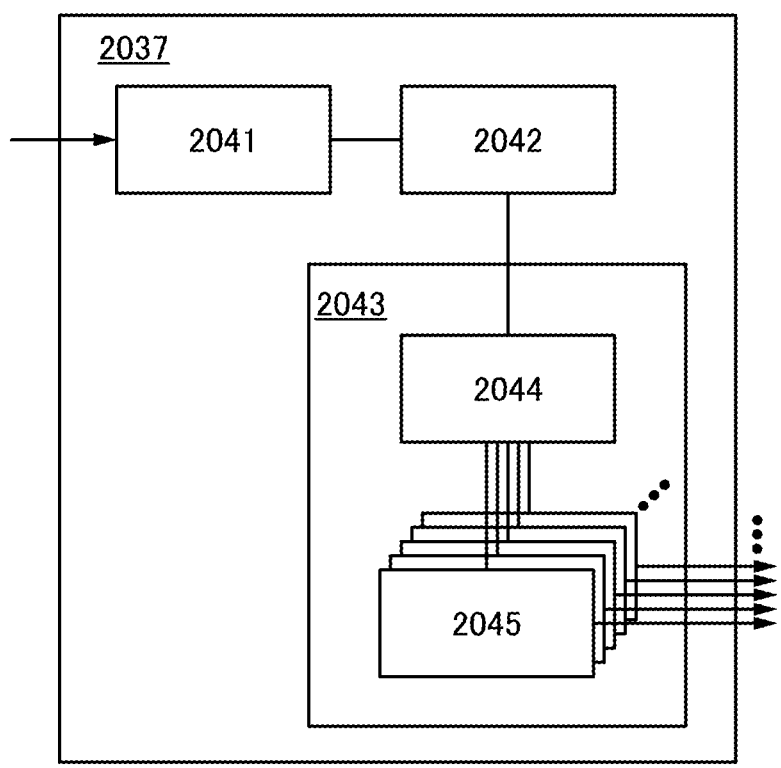
FIG. 40 is a block diagram of a tuner.

FIG. 40 shows a structure example of the tuner 2037.

The tuner 2037 includes, for example, a demodulation circuit 2041, an AD converter circuit (analog digital converter circuit) 2042, a decoder circuit 2043, and the like. The demodulation circuit 2041 demodulates a signal received by the antenna 2004. The AD converter circuit 2042 converts the demodulated analog signal into a digital signal. The decoder circuit 2043 decodes image data contained in the digital signal and generates a signal to be transmitted to the display controller 2023.

In the structure example of FIG. 40, the decoder circuit 2043 includes a dividing circuit 2044 and a plurality of processors 2045. The dividing circuit 2044 divides the input image data spatiotemporally and outputs it to the processors 2045. The plurality of processors 2045 decode the input image data and generate signals to be transmitted to the display controller 2023. Since the decoder circuit 2043 includes the plurality of processors 2045 which perform parallel data processing, image data containing enormous amounts of information can be decoded.

The decoder circuit 2043 may include a circuit for classifying a signal used for an image and contained in the input signal from other signals (e.g., text data, broadcast program data, and certification data).

The antenna 2004 in FIG. 38 and the like can receive airwaves, such as a ground wave and a satellite wave. The antenna 2004 can receive broadcasting, such as analog broadcasting, digital broadcasting, image-sound-only broadcasting, and sound-only broadcasting. For example, the antenna 2004 can receive airwaves transmitted in a certain frequency band, such as a UHF band (about 300 MHz to 30 GHz) or a VHF band (30 Hz to 300 Hz).

When a plurality of pieces of data received in a plurality of frequency bands is used, the transfer rate can be increased and more information can thus be obtained. Accordingly, the touch panel 2001 can display an image at high resolution with higher quality than full high-definitions, such as 4K, 8K, 16K, or more.

Alternatively, the tuner 2037 may be configured to generate a signal using the broadcasting data transmitted with data transmission technology through a computer network. The signal is transmitted to the display controller 2023. In the case where the tuner 2037 receives a digital signal, the tuner 2037 does not necessarily include a demodulating circuit and an AD converter circuit. Further alternatively, the tuner 2037 may be configured to receive data by the antenna 2005 and transmit the data to a decoder circuit of the tuner 2037 through the wireless communication portion 2039.

In the case of displaying an image with a resolution higher than the full HD, a processor preferably includes a decode circuit capable of decoding compressed data at extremely high rate. The decode circuit preferably includes a plurality of processors capable of parallel processing of four or more, preferably eight or more, more preferably 16 or more.

The wireless communication portion 2039 can communicate via the antenna 2005. For example, the wireless communication portion 2039 controls a control signal for connecting the electronic device 2000 to a computer network according to instructions from the arithmetic operation unit 2021 and transmits the signal to the computer network. In this manner, the electronic device 2000 can be connected to a computer network and communicate. Examples of the computer network include the Internet (which is an infrastructure of the World Wide Web (WWW)), an intranet, an extranet, a personal area network (PAN), a local area network (LAN), a campus area network (CAN), a metropolitan area network (MAN), a wide area network (WAN), or a global area network (GAN). When a plurality of communication methods are used, the electronic device 2000 may have a plurality of antennas 2005 depending on the communication method.

For example, a high frequency circuit (an RF circuit) is included in the wireless communication portion 2039 for receiving and transmitting an RF signal. The high frequency circuit converts an electromagnetic signal into an electric signal in a frequency band in accordance with respective national laws and transmits the electromagnetic signal wirelessly to another communication device. Several tens of kilohertz to several tens of gigahertz are a practical frequency band which is generally used. The high frequency circuit connected to the antenna 2005 includes a high frequency circuit portion compatible with a plurality of frequency bands; the high frequency circuit portion can include an amplifier, a mixer, a filter, a DSP, an RF transceiver, or the like. The following communication protocol or communication technology for wireless communication can be used: a communications standard such as Long Term Evolution (LTE), Global System for Mobile Communication (GSM) (registered trademark), Enhanced Data Rates for GSM Evolution (EDGE), Code Division Multiple Access 2000 (CDMA2000), or Wideband Code Division Multiple Access (W-CDMA), or a communications standard developed by IEEE such as Wireless Fidelity (Wi-Fi) (registered trademark), Bluetooth (registered trademark), or ZigBee (registered trademark).

In the case of using the electronic device 2000 as a telephone, the wireless communication portion 2039 controls a connection signal according to instructions from the arithmetic operation unit 2021 and transmits the signal to a telephone line. The connection signal is a signal for connecting the electronic device 2000 to the telephone line.

Figure 39:
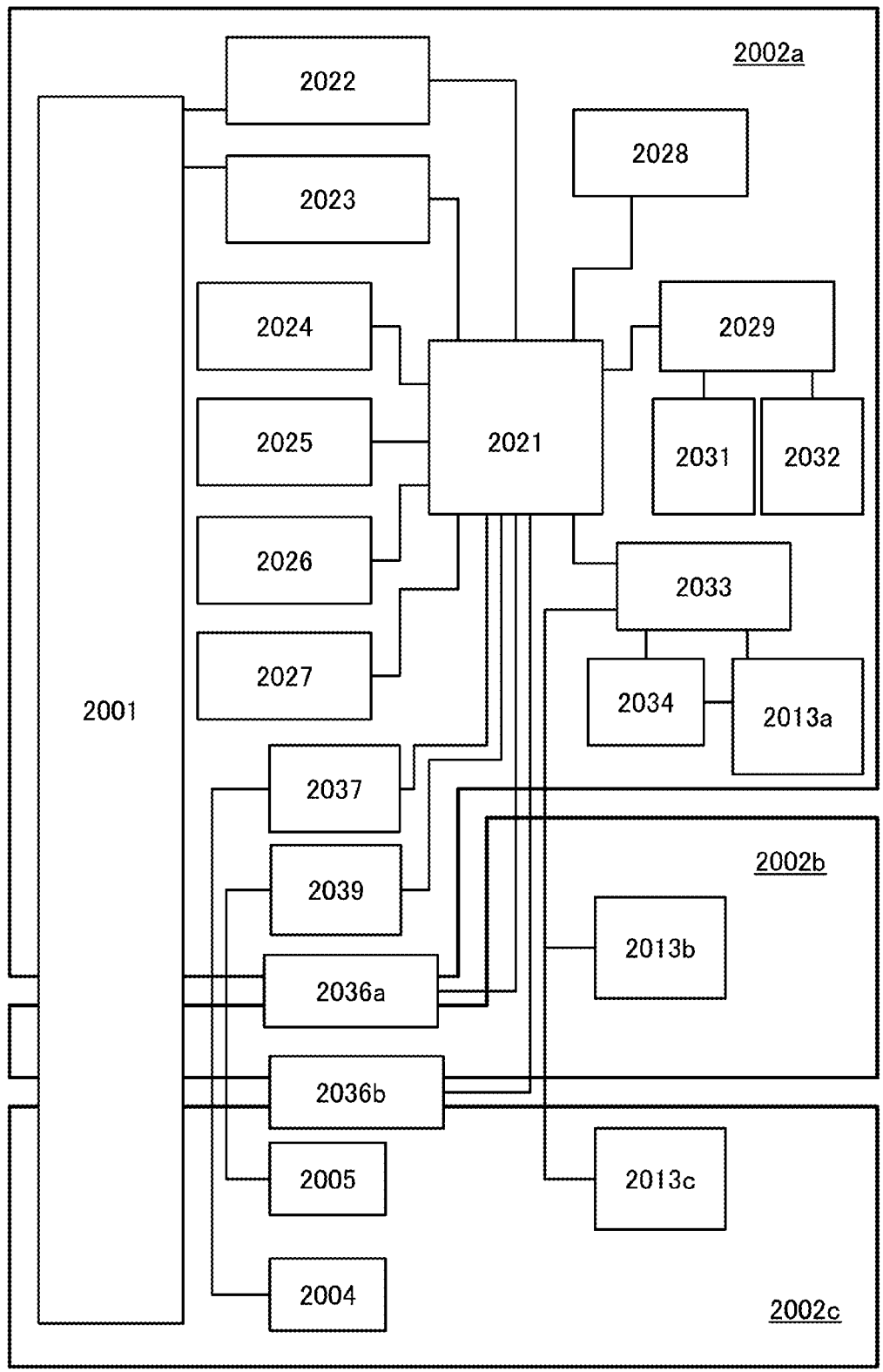
FIG. 39 is a block diagram of an electronic device.

FIG. 39 shows an example where the tuner 2037 and the wireless communication portion 2039 are included in the housing 2002a.

Note that the structure shown here is one example, and some or all of the components of the housing 2002a may be included in the housing 2002b and the housing 2002c. Other components not shown here may be included in the housings 2002a, 2002b, and 2002c.

The above is the description of the hardware structure examples of the electronic device 2000.

This embodiment can be combined with any of the other embodiments disclosed in this specification as appropriate.

This application is based on Japanese Patent Application serial No. 2015-078016 filed with Japan Patent Office on Apr. 6, 2015, the entire contents of which are hereby incorporated by reference.

What is claimed is:
1. A display device including a display region comprising:
a first substrate having an opening;
a terminal electrode over the opening of the first substrate;
a transistor over the terminal electrode;
a light emitting element electrically connected to the transistor; and
a second substrate over the light emitting element,
wherein the light-emitting element is configured to emit light through the second substrate,
wherein the terminal electrode is electrically connected to an external electrode through an anisotropic conductive layer provided in the opening, and wherein the light emitting element overlaps with the opening.

2. The display device according to claim 1, wherein the first substrate and the second substrate are flexible.

3. The display device according to claim 1, wherein the display device is flexible.

4. An electronic device comprising:
the display device according to claim 1; and
a touch sensor functionally connected to the display device.

5. The electronic device according to claim 4, wherein the electronic device is foldable.

6. A display device including a display region comprising:
a first substrate having an opening;
a terminal electrode on the opening of the first substrate;
a transistor over the terminal electrode;
a light-emitting element over the transistor, the light-emitting element electrically connected to the transistor; and
a second substrate over the light-emitting element,
wherein the light-emitting element is configured to emit light through the second substrate,
wherein the terminal electrode is electrically connected to an external electrode through an anisotropic conductive layer provided in the opening, and
wherein the light emitting element overlaps with the terminal electrode.

7. The display device according to claim 6, wherein the first substrate and the second substrate are flexible.

8. The display device according to claim 6, wherein the display device is flexible.

9. An electronic device comprising:
the display device according to claim 6; and
a touch sensor functionally connected to the display device.

10. The electronic device according to claim 9, wherein the electronic device is foldable.

11. A display device including a display region comprising:
a first substrate having an opening;
a terminal electrode on the opening and a first surface of the first substrate;
a transistor over the terminal electrode;
a light-emitting element over the transistor, the light-emitting element electrically connected to the transistor;
a second substrate over the light-emitting element; and
an anisotropic conductive layer provided in the opening and in contact with a second surface facing the first surface of the first substrate,
wherein the light-emitting element is configured to emit light through the second substrate,
wherein the terminal electrode is electrically connected to an external electrode through the anisotropic conductive layer, and
wherein the light emitting element overlaps with the external electrode.

12. The display device according to claim 11, wherein the first substrate and the second substrate are flexible.

13. The display device according to claim 11, wherein the display device is flexible.

14. An electronic device comprising:
the display device according to claim 11; and
a touch sensor functionally connected to the display device.

15. The electronic device according to claim 14, wherein the electronic device is foldable.

16. The display device according to claim 1, wherein a channel formation region of the transistor comprises an oxide semiconductor.

17. The display device according to claim 6, wherein a channel formation region of the transistor comprises an oxide semiconductor.

18. The display device according to claim 11, wherein a channel formation region of the transistor comprises an oxide semiconductor.

19. The display device according to claim 1, wherein the opening of the first substrate is filled with the anisotropic conductive layer.

20. The display device according to claim 6, wherein the opening of the first substrate is filled with the anisotropic conductive layer.

21. The display device according to claim 11, wherein the opening of the first substrate is filled with the anisotropic conductive layer.

* * * * *